(12) United States Patent
Ide et al.

(10) Patent No.: US 8,498,831 B2
(45) Date of Patent: Jul. 30, 2013

(54) SEMICONDUCTOR DEVICE, SEMICONDUCTOR DEVICE TESTING METHOD, AND DATA PROCESSING SYSTEM

(75) Inventors: Akira Ide, Tokyo (JP); Hideyuki Yoko, Tokyo (JP); Kayoko Shibata, Tokyo (JP); Kenichi Tanamachi, Tokyo (JP); Takanori Eguchi, Tokyo (JP); Yasuyuki Shigezane, Tokyo (JP); Naoki Ogawa, Tokyo (JP); Kazuo Hidaka, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 368 days.

(21) Appl. No.: 12/923,831

(22) Filed: Oct. 8, 2010

(65) Prior Publication Data
US 2011/0093224 A1    Apr. 21, 2011

(30) Foreign Application Priority Data

Oct. 9, 2009  (JP) .............................. 2009-235481
Sep. 6, 2010  (JP) .............................. 2010-198492
Oct. 7, 2010  (JP) .............................. 2010-227865

(51) Int. Cl.
*G06F 19/00*   (2006.01)

(52) U.S. Cl.
USPC ............................................. 702/64

(58) Field of Classification Search
USPC .............. 702/64, 66, 117, 118, 182–185
See application file for complete search history.

(56) References Cited

U.S. PATENT DOCUMENTS 5,870,617 A * 2/1999 Walsh et al. .................. 713/324
2009/0153177 A1  6/2009 Shibata

FOREIGN PATENT DOCUMENTS

JP   2009-139273 A   6/2009

* cited by examiner

*Primary Examiner* — Edward Raymond
(74) *Attorney, Agent, or Firm* — McGinn IP Law Group, PLLC

(57) ABSTRACT

To include one or a plurality of internal signal lines that electrically connects an interface chip to a core chip. The interface chip includes a first circuit that outputs a current to an internal wiring and the core chip includes a second circuit that outputs a current to the first internal signal line. The interface chip includes a determination circuit that has a first input terminal connected to the internal wiring through which the current outputted by the first circuit flows and a second input terminal connected to an end of the first internal signal line in the interface chip, and outputs a voltage according to a potential difference between a voltage of the first input terminal and a voltage of the second input terminal.

45 Claims, 25 Drawing Sheets

SEMICONDUCTOR DEVICE, SEMICONDUCTOR DEVICE TESTING METHOD, AND DATA PROCESSING SYSTEM

BACKGROUND OF THE INVENTION

1. Field of the Invention

The present invention relates to a semiconductor device, a semiconductor device testing method, and a data processing system, and more particularly relates to a semiconductor device constituted by a plurality of core chips and an interface chip that controls the core chips, a semiconductor device testing method, and a data processing system.

2. Description of the Related Art

A memory capacity that is required in a semiconductor memory device such as a DRAM (Dynamic Random Access Memory) are increasing every year. To satisfy this requirement, in recent years, a memory device that is called a multi-chip package where plural memory chips are laminated is suggested. However, since the memory chip used in the multi-chip package is a common memory chip capable of operating even though the memory chip is a single chip, a so-called front end unit that performs a function of an interface with an external device (memory controller, for example) is included in each memory chip. For this reason, the occupied area assignable for a memory core in each of the memory chips is limited to an area obtained by subtracting an occupied area for the front end unit from the whole chip area. Therefore, it is difficult to greatly increase a memory capacity for each chip.

In addition, a circuit that constitutes the front end unit is manufactured at the same time as a back end unit including a memory core, regardless of the circuit being a circuit of a logic system. Therefore there have been a further problem that it is difficult to speed up the front end unit.

As a method to resolve the above problem, a method that integrates the front end unit and the back end unit separately in discrete chips and laminates these chips, thereby constituting one semiconductor memory device, is suggested. According to this method, with respect to core chips in which the back end unit is integrated, it becomes possible to increase a memory capacity for each chip because an occupied area assignable for the memory core increases. Meanwhile, with respect to an interface chip that is integrated with the front end unit and is common to the plural core chips, it becomes possible to form its circuit with a high-speed transistor because the interface chip can be manufactured using a process different from that of the memory core. In addition, since the plural core chips can be allocated to one interface chip, it becomes possible to provide a semiconductor memory device that has a large memory capacity and a high operation speed as a whole.

In a semiconductor device using an interface chip, adjacent chips are electrically connected to each other by a large number of through silicon vias passing through substrates of core chips. Most of the through silicon vias are short-circuited to through silicon vias in other layers provided at same positions as seen in a planar view from a laminated direction. A current path for connecting the interface chip to each core chip is formed by a group of electrically short-circuited through silicon vias.

Japanese Patent Application Laid-open No. 2009-139273 discloses a testing technique for confirming a connection state of an internal terminal connecting a through silicon via to an internal circuit, although this is an example of a multi-chip package. According to the laminated configuration of this technique, internal terminals at the same position of a plurality of isomorphic memory core chips 2 are connected to each other via through silicon vias 4 with internal terminal junctions 3. These internal terminals are connected to an external terminal 5 by a wiring on an interposer chip 1 (not shown). The interposer chip 1 includes a unit that connects a wiring pattern to the external terminal 5 (for example, a through silicon via and a bonding pad (not shown)). This unit has a function to convert a position of the internal terminal with a position of the external terminal 5. That is, the external terminal 5 of the semiconductor device is electrically directly connected to any of the internal terminals that serve as a terminal to be measured in the semiconductor device. According to this testing technique, in the wiring configuration, a conduction check diode is provided in the midway of an internal wiring connecting the internal terminal to the internal circuit for each internal terminal, and its cathode side is connected to the internal wiring. A conduction test dedicated terminal is provided at an external terminal of a corresponding multi-chip package (a semiconductor device) for each memory chip and an anode of each conduction check diode within a same memory chip is commonly connected to the conduction test dedicated terminal. When the connection state of a certain internal terminal is tested, a voltage of $-1$ V is applied to a current path including the corresponding through silicon via through the external terminal and a voltage of 0 V is applied to the corresponding conduction test dedicated terminal. As a result, a forward current of the conduction check diode flows through the current path when the internal terminal is properly connected and the current does not flow when the internal terminal is disconnected. Therefore, by measuring the current appearing in the external terminal using a tester outside the semiconductor device, whether the internal terminal within the semiconductor device is properly connected can be determined.

In a semiconductor device using an interface chip, a parasitic resistance value of a current path including through silicon vias may become excessively large. When the parasitic resistance value is excessively large, characteristics of the semiconductor device are deteriorated. Accordingly, it is desirable to measure the parasitic resistance value of the current path with high precision.

Paragraph [0010] of Japanese Patent Application Laid-open No. 2009-139273 describes a resistance value. As is understood from this description, the technique of this conventional technique is merely a technique of determining "whether the internal terminal including the through silicon via is disconnected (=whether the resistance value is infinite)" by the test circuit. The technique of Japanese Patent Application Laid-open No. 2009-139273 cannot be applied to a semiconductor device using an interface chip that an external terminal of the semiconductor device is not electrically directly connected to a terminal to be measured within the semiconductor device. This is because in the semiconductor device using an interface chip, a current path including a through silicon via to be measured is an internal signal line that is not connected to outside of the semiconductor device and lines that are not connected to the external terminal are also included. When the interface chip has a signal processing function, a signal of an internal wiring to be measured is subject to signal processing by a logic circuit in the interface chip and an output signal of that logic circuit is outputted as an external terminal. Meanwhile, an externally inputted signal is subjected to the signal processing in the interface chip and outputted to the internal wiring to be measured. Accordingly, application of $-1$ V of voltage through the external terminal and measurement of the current appearing in the external terminal as disclosed in Japanese Patent Application Laid-open No. 2009-139273 cannot be performed.

In a semiconductor device using an interface chip that an external terminal of the semiconductor device is not electrically directly connected to a terminal to be measured in the semiconductor device, it has been desired to determine the magnitude of parasitic resistance value of an internal signal line including through silicon vias from outside of the semiconductor device.

SUMMARY

In one embodiment, there is provided a semiconductor device comprising: an interface chip and a core chip; and a first internal signal line that includes a through silicon via provided in the core chip and electrically connects the interface chip to the core chip, wherein the interface chip includes a first circuit that outputs a current to an internal wiring, the core chip includes a second circuit that outputs a current to the first internal signal line, and the interface chip further includes a determination circuit that has a first input terminal connected to the internal wiring through which a current outputted by the first circuit flows and a second input terminal connected to an end of the first internal signal line in the interface chip and outputs a voltage according to a potential difference between a voltage of the first input terminal and a voltage of the second input terminal.

In another embodiment, there is provided a method of testing a semiconductor device, the semiconductor device comprising: an interface chip and a plurality of core chips; a plurality of internal signal lines each of which includes a through silicon via provided in each of the core chips and electrically connects the interface chip to the corresponding core chip; a first circuit that outputs a current to an internal wiring; a second circuit that outputs a current to the internal signal line; and a determination circuit that has a first input terminal connected to the internal wiring through which a current outputted by the first circuit flows and a second input terminal connected to an end of the first internal signal line in the interface chip, and determines the first and second input terminals as inputs, wherein the method outputs a current by activating the first circuit, selects a core chip among the core chips by a core chip selection signal, selects an internal signal line among the internal signal lines by an internal signal-line selection signal, and causes the determination circuit to output a voltage according to a voltage difference between the first input terminal and the second input terminal.

In still another embodiment, there is provided a data processing system comprising: a semiconductor device; and a controller connected to the semiconductor device, wherein the semiconductor device comprising: an interface chip and a core chip; and a first internal signal line that includes a through silicon via provided in the core chip and electrically connects the interface chip to the core chip, the interface chip includes a first circuit that outputs a current, the core chip includes a second circuit that outputs a current to the first internal signal line, the interface chip further includes a determination circuit that has a first input terminal connected to a wiring through which a current outputted by the first circuit flows and a second input terminal connected to an end of the first internal signal line in the interface chip, and outputs a voltage according to a potential difference between a voltage of the first input terminal and a voltage of the second input terminal, the controller issues a command relating to a read command to the interface chip, the interface chip receives the command from the controller and issues the read command to the core chips, any of the core chips receives the read command and outputs read data corresponding to the read command to the interface chip, and the interface chip receives the read data from any of the core chips and outputs the read data to the controller.

According to the present invention, even in a semiconductor device using an interface chip that an external terminal of the semiconductor device is not electrically directly connected to a terminal to be measured in the semiconductor device, a voltage outputted by a determination circuit arranged within the semiconductor device is externally referenced, and thus the magnitude of parasitic resistance value of an internal signal line in the semiconductor device can be determined. In addition, by flowing a current and checking the voltage of the internal signal line, the parasitic resistance value can be calculated with high precision.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

A representative example of a technical concept for solving the problem of the present invention is described below. It is needless to mention that the contents that the present application is to claim for patent are not limited to the following technical concept, but to the description of the appended claims. That is, according to the technical concept of the present invention, a reference resistance that has a resistance value according to a target value of a parasitic resistance value of a to-be-tested internal signal line and a first circuit that generates a current and outputs the resultant current to one end of the reference resistance are provided within an interface chip and a second circuit that generates a second current and outputs the resultant current to the to-be-tested internal signal line is provided within a core chip. Further, a determination circuit that includes a first input terminal connected to the other end of the reference resistance and a second input terminal connected to an end of the internal signal line in the interface chip, and outputs a voltage according to a difference between the voltage of the first input terminal and the voltage of the second input terminal is provided within the interface chip. By referencing the voltage outputted by the determination circuit, the magnitude of parasitic resistance value of the internal signal line can be determined.

The present invention is based on the technical concept of providing a current generation circuit that generates a current and outputs the resultant current to the end of the to-be-tested internal signal line in the core chip and a determination circuit that has a first input terminal connected to the end of the internal signal line in the core chip and a second input terminal connected to the end of the internal signal line in the interface chip, and outputs a voltage according to a difference between the voltage of the first input terminal and the voltage of the second input terminal within a semiconductor device. By referencing the voltage outputted by the determination circuit, the parasitic resistance value can be calculated with high precision.

Preferred embodiments of the present invention will be explained below in detail with reference to the accompanying drawings.

Figure 1:
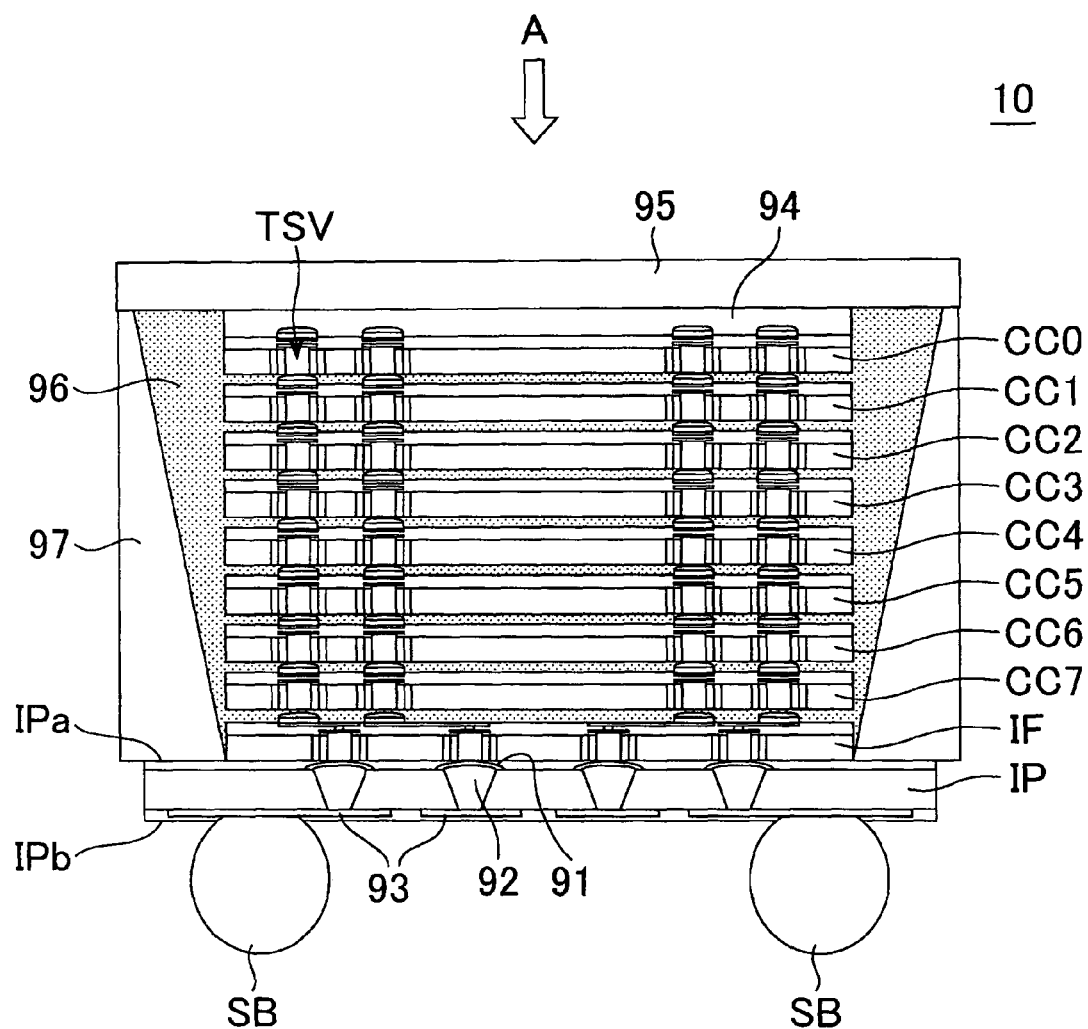
FIG. 1 is a schematic cross-sectional view provided to explain the structure of a semiconductor memory device 10 according to the preferred embodiment of the present invention.

FIG. 1 is a schematic cross-sectional view provided to explain the structure of a semiconductor memory device 10 according to the preferred embodiment of the present invention.

As shown in FIG. 1, the semiconductor memory device 10 according to this embodiment has the structure where 8 core chips CC0 to CC7 that have the same function and structure and are manufactured using the same manufacture mask, an interface chip IF that is manufactured using a manufacture mask different from that of the core chips and an interposer IP are laminated. The core chips CC0 to CC7 and the interface chip IF are semiconductor chips using a silicon substrate and are electrically connected to adjacent chips in a vertical direction through plural through silicon vias TSV penetrating the silicon substrate. Meanwhile, the interposer IP is a circuit board that is made of a resin, and plural external terminals (solder balls) SB are formed in a back surface IPb of the interposer IP.

Each of the core chips CC0 to CC7 is a semiconductor chip which consists of circuit blocks other than a so-called front end unit (front end function) performing a function of an interface with an external device through an external terminal among circuit blocks included in a 1 Gb DDR3 (Double Data Rate 3)-type SDRAM (Synchronous Dynamic Random Access Memory). The SDRAM is a well-known and common memory chip that includes both of the front end unit and a so-called back end unit having a plural memory cells and accessing to the memory cells. The SDRAM operates even as a single chip and is capable to communicate directly with a memory controller. That is, each of the core chips CC0 to CC7 is a semiconductor chip where only the circuit blocks belonging to the back end unit are integrated in principle. As the circuit blocks that are included in the front end unit, a parallel-serial converting circuit (data latch circuit) that performs parallel/serial conversion on input/output data between a memory cell array and a data input/output terminal and a DLL (Delay Locked Loop) circuit that controls input/output timing of data are exemplified, which will be described in detail below. The interface chip IF is a semiconductor chip in which only the front end unit is integrated. Accordingly, an operation frequency of the interface chip is higher than an operation frequency of the core chip. Since the circuits that belong to the front end unit are not included in the core chips CC0 to CC7, the core chips CC0 to CC7 cannot be operated as the single chips, except for when the core chips are operated in a wafer state for a test operation in the course of manufacturing the core chips. The interface chip IF is needed to operate the core chips CC0 to CC7. Accordingly, the memory integration of the core chips is denser than the memory integration of a general single chip. In the semiconductor memory device 10 according to this embodiment, the interface chip has a front end function for communicating with the external device at a first operation frequency, and the plural core chips have a back end function for communicating with only the interface chip at a second operation frequency lower than the first operation frequency. Accordingly, each of the plural core chips includes a memory cell array that stores plural information, and a bit number of plural read data for each I/O (DQ) that are supplied from the plural core chips to the interface chip in parallel is plural and associated with a one-time read command provided from the interface chip to the core chips.

In this case, the plural bit number corresponds to a prefetch data number to be well-known.

The interface chip IF functions as a common front end unit (a processing circuit processing signals to communicate with the eight core chips CC0 to CC7 and a processing circuit processing signals from/to the external.) for the eight core chips CC0 to CC7. Accordingly, all external accesses are performed through the interface chip IF and inputs/outputs of data are also performed through the interface chip IF. In this embodiment, the interface chip IF is disposed between the interposer IP and the core chips CC0 to CC7. However, the position of the interface chip IF is not restricted in particular, and the interface chip. IF may be disposed on the core chips CC0 to CC7 and may be disposed on the back surface IPb of the interposer IP. When the interface chip IF is disposed on the core chips CC0 to CC7 in a face-down manner or is disposed on the back surface IPb of the interposer IP in a face-up manner, the through silicon via TSV does not need to be provided in the interface chip IF. The interface chip IF may be disposed to be interposed between the two interposers IP.

The interposer IP functions as a rewiring substrate to increase an electrode pitch and secures mechanical strength of the semiconductor memory device 10. That is, an electrode 91 that is formed on a top surface IPa of the interposer IP is drawn to the back surface IPb via a through-hole electrode 92 and the pitch of the external terminals SB is enlarged by the rewiring layer 93 provided on the back surface IPb. In FIG. 1, only the two external terminals SB are shown. In actuality, however, three or more external terminals are provided. The layout of the external terminals SB is the same as that of the DDR3-type SDRAM that is determined by the regulation. Accordingly, the semiconductor memory device can be treated as one DDR3-type SDRAM from the external controller.

As shown in FIG. 1, a top surface of the uppermost core chip CC0 is covered by an NCF (Non-Conductive Film) 94 and a lead frame 95. Gaps between the core chips CC0 to CC7 and the interface chip IF are filled with an underfill 96 and surrounding portions of the gaps are covered by a sealing resin 97. Thereby, the individual chips are physically protected.

Figures 2A, 2B, 2C:
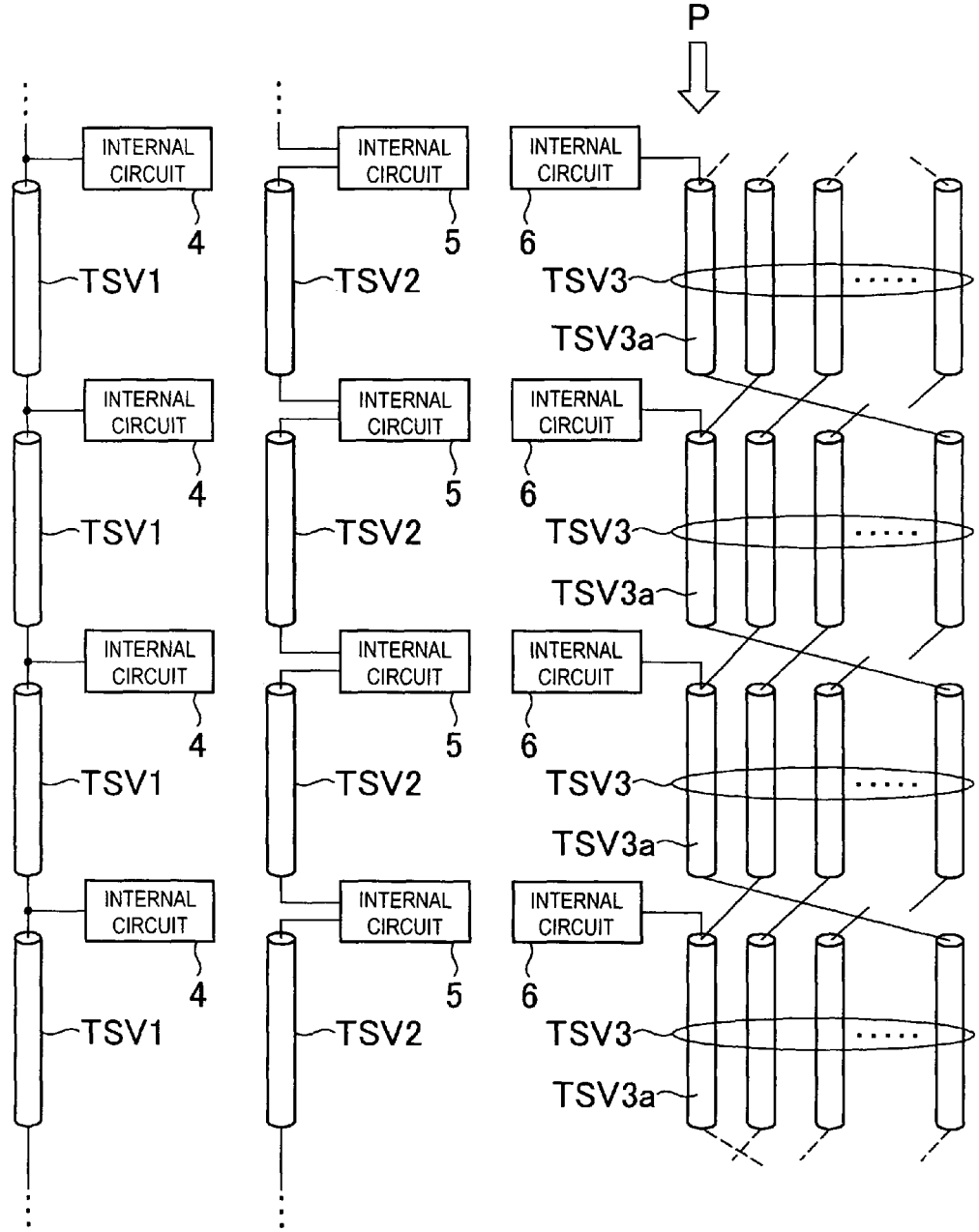
FIGS. 2A to 2C are diagram showing the various types of through silicon vias TSV provided in a core chip.

When most of the through silicon vias TSV provided in the core chips CC0 to CC7 are two-dimensionally viewed from a lamination direction, that is, viewed from an arrow A shown in FIG. 1, the through silicon vias TSV are short-circuited from the through silicon vias TSV of other layers provided at the same position. That is, as shown in FIG. 2A, the vertically disposed through silicon vias TSV1 that are provided at the same position in plan view are short-circuited, and one current path (an internal signal line) is configured by the through silicon vias TSV1. The through silicon vias TSV1 that are provided in the core chips CC0 to CC7 are connected to internal circuits 4 in the core chips, respectively. Accordingly, input signals (command signal, address signal, etc.) that are supplied from the interface chip IF to the through silicon vias TSV1 shown in FIG. 2A are commonly input to the internal circuits 4 of the core chips CC0 to CC7. Output signals (data etc.) that are supplied from the core chips CC0 to CC7 to the TSV1 are wired-ORed and input to the interface chip IF.

Meanwhile, as shown in FIG. 2B, the a part of through silicon vias TSV are not directly connected to the through silicon via TSV2 of other layers provided at the same position in plain view but are connected to the through silicon via TSV2 of other layers through the internal circuits 5 provided in the core chips CC0 to CC7. That is, the internal circuits that are provided in the core chips CC0 to CC7 are cascade-connected through the through silicon vias TSV2 and the current path (the internal signal line) configured by the through silicon vias TSV2 includes the internal circuits 5. This kind of through silicon vias TSV2 is used to sequentially transmit predetermined information to the internal circuits 5 provided in the core chips CC0 to CC7. As this information, layer address information to be described below is exemplified.

Another through silicon via TSV group is short-circuited from the through silicon via TSVs of other layer provided at the different position in plan view, as shown in FIG. 2C. With respect to this kind of through silicon via TSV group 3, internal circuits 6 of the core chips CC0 to CC7 are connected to the TSV3a provided at the predetermined position P in plan view. Each of the current paths (the internal signal lines) configured by the through silicon vias TSV3 is connected to the internal circuit 6 provided in only one of the core chips, respectively. Thereby, information can be selectively input to the internal circuit 6 provided in each of the core chips. As this information, defective chip information described below is exemplified.

As such, as types of the through silicon vias TSV provided in the core chips CC0 to CC7, three types (TSV1 to TSV3) shown in FIGS. 2A to 2C exist. As described above, most of the through silicon vias TSV are of a type shown in FIG. 2A, and an address signal, a command signal, and a clock signal are supplied from the interface chip IF to the core chips CC0 to CC7, through the through silicon vias TSV1 of the type shown in FIG. 2A. Read data and write data are also input to and output from the interface chip IF through the through silicon vias TSV1 of the type shown in FIG. 2A. Meanwhile, the through silicon vias TSV2 and through silicon vias TSV3 of the types shown in FIGS. 2B and 2C are used to provide individual information to the core chips CC0 to CC7 having the same structure.

Figure 3:
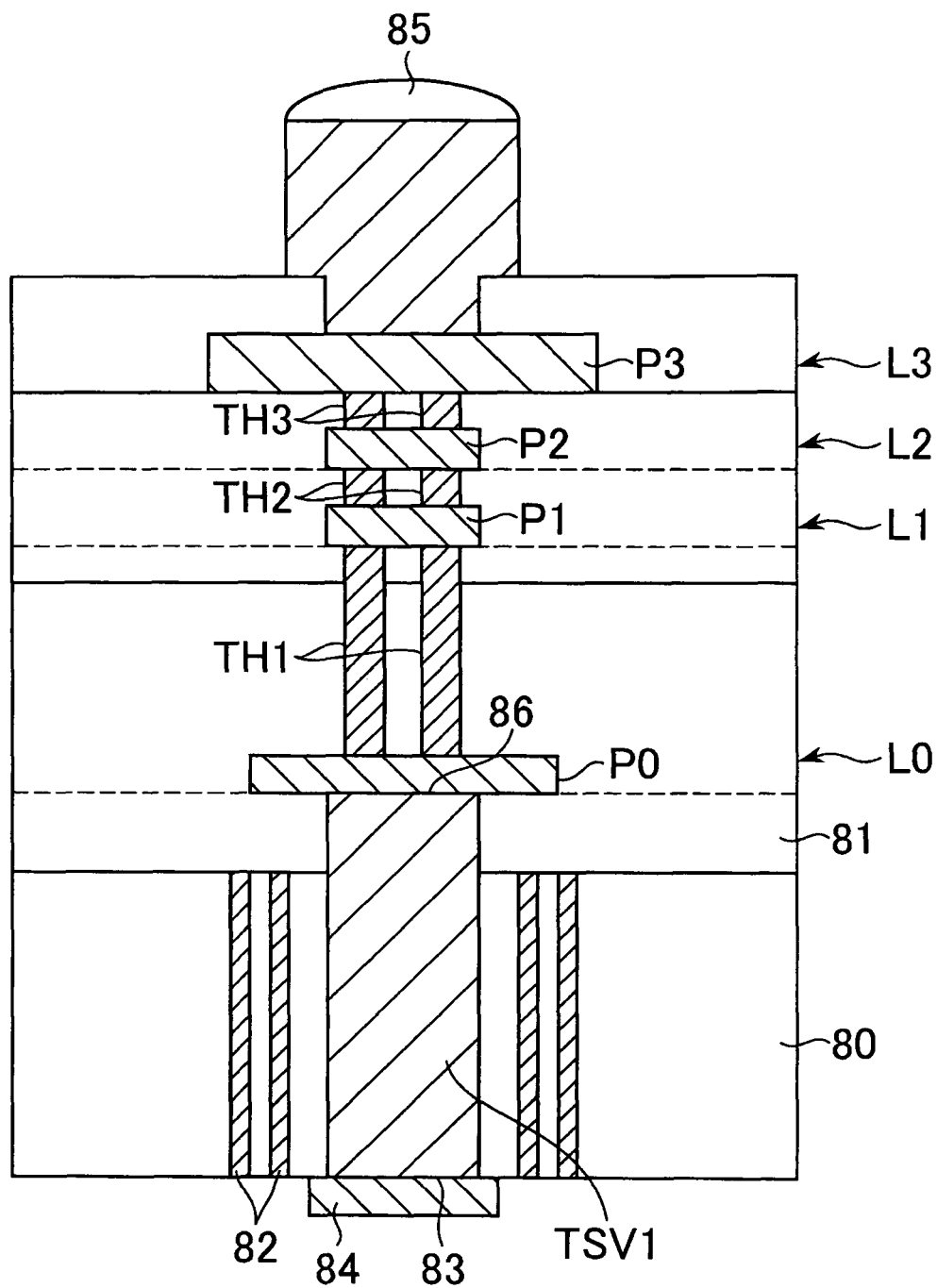
FIG. 3 is a cross-sectional view illustrating the structure of the through silicon via of the type shown in FIG. 2A.

FIG. 3 is a cross-sectional view illustrating the structure of the through silicon via TSV1 of the type shown in FIG. 2A.

As shown in FIG. 3, the through silicon via TSV1 is provided to penetrate a silicon substrate 80 and an interlayer insulating film 81 provided on a surface of the silicon substrate 80. Around the through silicon via TSV1, an insulating ring 82 is provided. Thereby, the through silicon via TSV1 and a transistor region are insulated from each other. In an example shown in FIG. 3, the insulating ring 82 is provided double. Thereby, capacitance between the through silicon via TSV1 and the silicon substrate 80 is reduced.

An end 83 of the through silicon via TSV1 at the back surface of the silicon substrate 80 is covered by a back surface bump 84. The back surface bump 84 is an electrode that contacts a surface bump 85 provided in a core chip of a lower layer. The surface bump 85 is connected to an end 86 of the through silicon via TSV1, through plural pads P0 to P3 provided in wiring layers L0 to L3 and plural through-hole electrodes TH1 to TH3 connecting the pads to each other. Thereby, the surface bump 85 and the back surface bump 84 that are provided at the same position in plan view are short-circuited. Connection with internal circuits (not shown in the drawings) is performed through internal wiring lines (not shown in the drawings) drawn from the pads P0 to P3 provided in the wiring layers L0 to L3.

Figure 4:
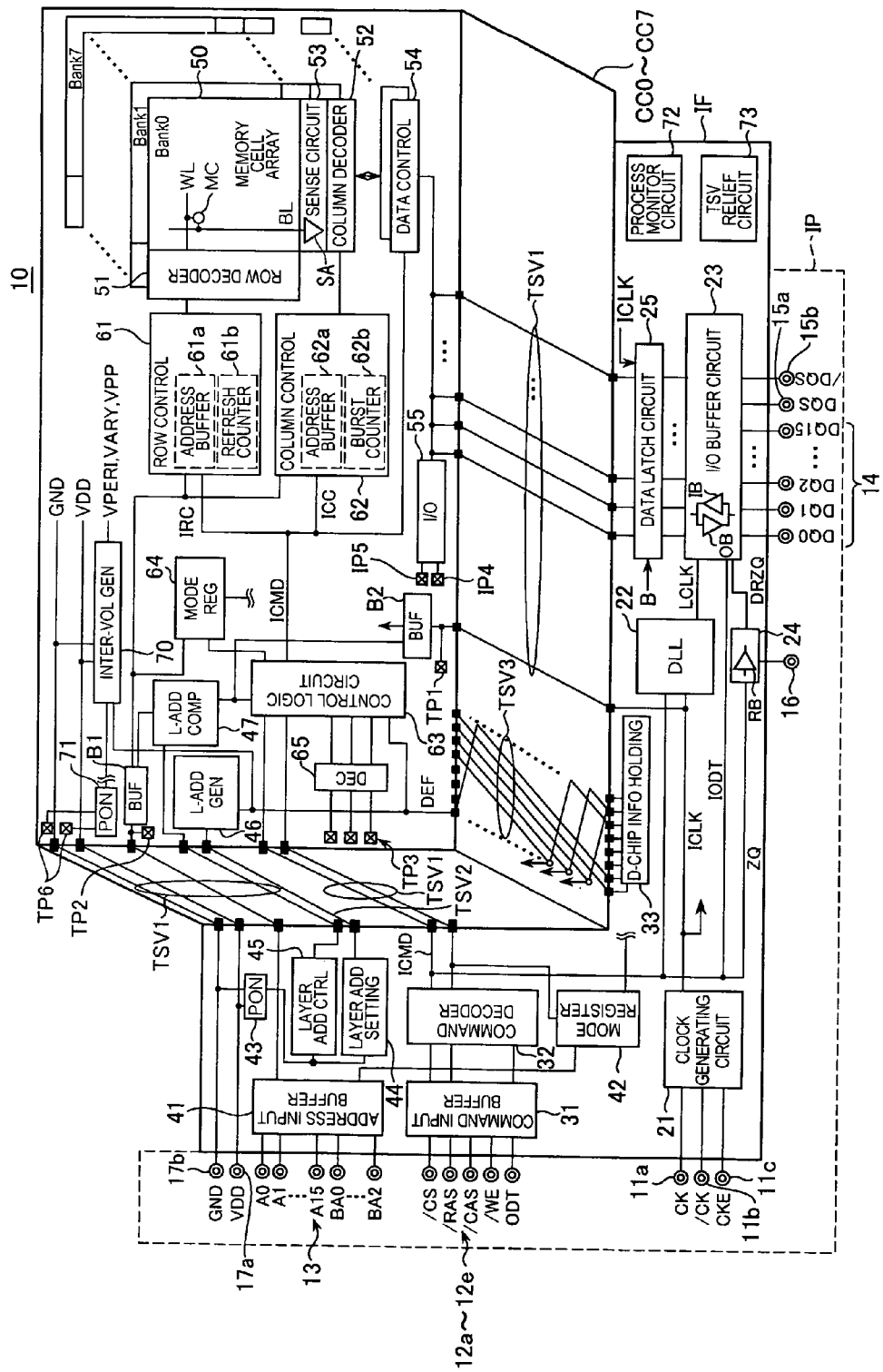
FIG. 4 is a block diagram illustrating the circuit configuration of the semiconductor memory device according the first embodiment of the present invention.

FIG. 4 is a block diagram illustrating the circuit configuration of the semiconductor memory device 10.

As shown in FIG. 4, the external terminals that are provided in the interposer IP include clock terminals 11a and 11b, an clock enable terminal 11c, command terminals 12a to 12e, an address terminal 13, a data input/output terminal 14, data strobe terminals 15a and 15b, a calibration terminal 16, and power supply terminals 17a and 17b. All of the external terminals are connected to the interface chip IF and are not directly connected to the core chips CC0 to CC7, except for the power supply terminals 17a and 17b.

First, a connection relationship between the external terminals and the interface chip IF performing the front end function and the circuit configuration of the interface chip IF will be described.

The clock terminals 11a and 11b are supplied with external clock signals CK and /CK, respectively, and the clock enable terminal 11c is supplied with a clock enable signal CKE. The external clock signals CK and /CK and the clock enable signal CKE are supplied to a clock generating circuit 21 provided in the interface chip IF. A signal where "/" is added to a head of a signal name in this specification indicates an inversion signal of a corresponding signal or a low-active signal. Accordingly, the external clock signals CK and /CK are complementary signals. The clock generating circuit 21 generates an internal clock signal ICLK, and the generated internal clock signal ICLK is supplied to various circuit blocks in the interface chip IF and is commonly supplied to the core chips CC0 to CC7 through the through silicon vias TSV.

A DLL circuit 22 is included in the interface chip IF and an input/output clock signal LCLK is generated by the DLL circuit 22. The input/output clock signal LCLK is supplied to an input/output buffer circuit 23 included in the interface chip IF. A DLL function is used to control the front end unit by using the signal LCLK synchronized with a signal of the external device, when the semiconductor memory device 10 communicates with the external device. Accordingly, DLL function is not needed for the core chips CC0 to CC7 as the back end.

The command terminals 12a to 12e are supplied with a row-address strobe signal /RAS, a column address strobe signal /CAS, a write enable signal /WE, a chip select signal /CS, and an on-die termination signal ODT. These command signals are supplied to a command input buffer 31 that is provided in the interface chip IF. The command signals supplied to the command input buffer 31 are further supplied to a command decoder 32. The command decoder 32 is a circuit that holds, decodes, and counts the command signals in synchronization with the internal clock ICLK and generates various internal commands ICMD. The generated internal command ICMD is supplied to the various circuit blocks in the interface chip IF and is commonly supplied to the core chips CC0 to CC7 through the through silicon vias TSV.

The address terminal 13 is a terminal to which address signals A0 to A15 and BA0 to BA2 are supplied, and the supplied address signals A0 to A15 and BA0 to BA2 are supplied to an address input buffer 41 provided in the interface chip IF. An output of the address input buffer 41 is commonly supplied to the core chips CC0 to CC7 through the through silicon vias TSV. The address signals A0 to A15 are supplied to a mode register 42 provided in the interface chip IF, when the semiconductor memory device 10 enters a mode register set. The address signals BA0 to BA2 (bank addresses) are decoded by an address decoder (not shown in the drawings) provided in the interface chip IF, and a bank selection signal B that is obtained by the decoding is supplied to a data latch circuit 25. This is because bank selection of the write data is performed in the interface chip IF.

The data input/output terminal 14 is used to input/output read data or write data DQ0 to DQ15. The data strobe terminals 15a and 15b are terminals that are used to input/output strobe signals DQS and /DQS. The data input/output terminal 14 and the data strobe terminals 15a and 15b are connected to the input/output buffer circuit 23 provided in the interface chip IF. The input/output buffer circuit 23 includes an input buffer IB and an output buffer OB, and inputs/outputs the read data or the write data DQ0 to DQ15 and the strobe signals DQS and /DQS in synchronization with the input/output clock signal LCLK supplied from the DLL circuit 22. If an internal on-die termination signal IODT is supplied from the command decoder 32, the input/output buffer circuit 23 causes the output buffer OB to function as a termination resistor. An impedance code DRZQ is supplied from the calibration circuit 24 to the input/output buffer circuit 23. Thereby, impedance of the output buffer OB is designated. The input/output buffer circuit 23 includes a well-known FIFO circuit.

The calibration circuit 24 includes a replica buffer RB that has the same circuit configuration as the output buffer OB. If the calibration signal ZQ is supplied from the command decoder 32, the calibration circuit 24 refers to a resistance value of an external resistor (not shown in the drawings) connected to the calibration terminal 16 and performs a calibration operation. The calibration operation is an operation for matching the impedance of the replica buffer RB with the resistance value of the external resistor, and the obtained impedance code DRZQ is supplied to the input/output buffer circuit 23. Thereby, the impedance of the output buffer OB is adjusted to a desired value.

The input/output buffer circuit 23 is connected to a data latch circuit 25. The data latch circuit 25 includes a FIFO circuit (not shown in the drawings) that realizes a FIFO function which operates by latency control realizing the well-known DDR function and a multiplexer MUX (not shown in the drawings). The input/output buffer circuit 23 converts parallel read data, which is supplied from the core chips CC0 to CC7, into serial read data, and converts serial write data, which is supplied from the input/output buffer, into parallel write data. Accordingly, the data latch circuit 25 and the input/output buffer circuit 23 are connected in serial and the data latch circuit 25 and the core chips CC0 to CC7 are connected in parallel. In this embodiment, each of the core chips CC0 to CC7 is the back end unit of the DDR3-type SDRAM and a prefetch number is 8 bits. The data latch circuit 25 and each banks of the core chips CC0 to CC7 are connected respectively, and the number of banks that are included in each of the core chips CC0 to CC7 is 8. Accordingly, connection of the data latch circuit 25 and the core chips CC0 to CC7 becomes 64 bits (8 bits×8 banks) for each DQ.

Parallel data, not converted into serial data, is basically transferred between the data latch circuit 25 and the core chips CC0 to CC7. That is, in a common SDRAM (in the SDRAM, a front end unit and a back end unit are constructed in one chip), between the outside of the chip and the SDRAM, data is input/output in serial (that is, the number of data input/output terminals is one for each DQ). However, in the core chips CC0 to CC7, an input/output of data between the interface chip IF and the core chips is performed in parallel. This point is the important difference between the common SDRAM and the core chips CC0 to CC7. However, all of the prefetched parallel data do not need to be input/output using the different through silicon vias TSV, and partial parallel/serial conversion may be performed in the core chips CC0 to CC7 and the number of through silicon vias TSV that are needed for each DQ may be reduced. For example, all of data of 64 bits for each DQ do not need to be input/output using the different through silicon vias TSV, and 2-bit parallel/serial conversion may be performed in the core chips CC0 to CC7 and the number of through silicon vias TSV that are needed for each DQ may be reduced to ½ (32).

To the data latch circuit 25, a function for enabling a test in an interface chip unit is added. The interface chip does not have the back end unit. For this reason, the interface chip cannot be operated as a single chip in principle. However, if the interface chip never operates as the single chip, an operation test of the interface chip in a wafer state may not be performed. This means that the semiconductor memory device 10 cannot be tested in case an assembly process of the interface chip and the plural core chips is not executed, and the interface chip is tested by testing the semiconductor memory device 10. In this case, when a defect that cannot be recovered exists in the interface chip, the entire semiconductor memory device 10 is not available. In consideration of this point, in this embodiment, a portion of a pseudo back end unit for a test is provided in the data latch circuit 25, and a simple memory function is enabled at the time of a test.

The power supply terminals 17a and 17b are terminals to which power supply potentials VDD and VSS are supplied, respectively. The power supply terminals 17a and 17b are connected to a power-on detecting circuit 43 provided in the interface chip IF and are also connected to the core chips CC0 to CC7 through the through silicon vias TSV. The power-on detecting circuit 43 detects the supply of power. On detecting the supply of power, the power-on detecting circuit activates a layer address control circuit 45 on the interface chip IF.

The layer address control circuit 45 changes a layer address due to the I/O configuration of the semiconductor device 10 according to the present embodiment. As described above, the semiconductor memory device 10 includes 16 data input/output terminals 14. Thereby, a maximum I/O number can be set to 16 bits (DQ0 to DQ15). However, the I/O number is not fixed to 16 bits and may be set to 8 bits (DQ0 to DQ7) or 4 bits (DQ0 to DQ3). The address allocation is changed according to the I/O number and the layer address is also changed. The layer address control circuit 45 changes the address allocation according to the I/O number and is commonly connected to the core chips CC0 to CC7 through the through silicon vias TSV.

The interface chip IF is also provided with a layer address setting circuit 44. The layer address setting circuit 44 is connected to the core chips CC0 to CC7 through the through silicon vias TSV. The layer address setting circuit 44 is cascade-connected to the layer address generating circuit 46 of the core chips CC0 to CC7 using the through silicon via TSV2 of the type shown in FIG. 2B, and reads out the layer addresses set to the core chips CC0 to CC7 at testing.

The interface chip IF is also provided with a defective chip information holding circuit 33. When a defective core chip that does not normally operates is discovered after an assembly, the defective chip information holding circuit 33 holds its chip number. The defective chip information holding circuit 33 is connected to the core chips CC0 to CC7 through the through silicon vias TSV. The defective chip information holding circuit 33 is connected to the core chips CC0 to CC7 while being shifted, using the through silicon via TSV3 of the type shown in FIG. 2C.

A process monitor circuit 72 and a TSV relief circuit 73 are also provided in the interface chip IF. The process monitor circuit 72 is at least a circuit for measuring device characteristics of each core chip to code them. This coding enables the timing of each core chip to be adjusted. Specifically, an inverter chain circuit that can vary steps is provided in the interface chip IF and the core chip, the number of steps is adjusted so that their delay times are equal to each other, and a difference in the number of steps is coded.

The above description is the outline of the connection relationship between the external terminals and the interface chip IF and the circuit configuration of the interface chip IF.

Next, the circuit configuration of the core chips CC0 to CC7 will be described.

As shown in FIG. 4, memory cell arrays 50 that are included in the core chips CC0 to CC7 performing the back end function are divided into eight banks. A bank is a unit that can individually receive a command. That is, the individual banks can be independently and nonexclusively controlled. From the outside of the semiconductor memory device 10, each back can be independently accessed. For example, a part of the memory cell array 50 belonging to the bank 1 and another part of the memory cell array 50 belonging to the bank 2 are controlled nonexclusively. That is, word lines WL and bit lines BL corresponding to each banks respectively are independently accessed at same period by different commands one another. For example, while the bank 1 is maintained to be active (the word lines and the bit lines are controlled to be active), the bank 2 can be controlled to be active. However, the banks shares the external terminals (for example, plural control terminals and plural I/O terminals) of the semiconductor memory device 10. In the memory cell array 50, the plural word lines WL and the plural bit lines BL intersect each other, and memory cells MC are disposed at intersections thereof (in FIG. 4, only one word line WL, one bit line BL, and one memory cell MC are shown). The word line WL is selected by a row decoder 51. The bit line BL is connected to a corresponding sense amplifier SA in a sense circuit 53. The sense amplifier SA is selected by a column decoder 52.

The row decoder 51 is controlled by a row address supplied from a row control circuit 61. The row control circuit 61 includes an address buffer 61a that receives a row address supplied from the interface chip IF through the through silicon via TSV, and the row address that is buffered by the address buffer 61a is supplied to the row decoder 51. The address signal that is supplied through the through silicon via TSV is supplied to the row control circuit 61 through the input buffer B1. The row control circuit 61 also includes a refresh counter 61b. When a refresh signal is issued by a control logic circuit 63, a row address that is indicated by the refresh counter 61b is supplied to the row decoder 51.

The column decoder 52 is controlled by a column address supplied from a column control circuit 62. The column control circuit 62 includes an address buffer 62a that receives the column address supplied from the interface chip IF through the through silicon via TSV, and the column address that is buffered by the address buffer 62a is supplied to the column decoder 52. The column control circuit 62 also includes a burst counter 62b that counts the burst length.

The sense amplifier SA selected by the column decoder 52 is connected to the data control circuit 54 through some amplifiers (sub-amplifiers or data amplifiers, for example) which are not shown in the drawings. Thereby, read data of 8 bits (=prefetch number) for each I/O (DQ) is output from the data control circuit 54 at reading, and write data of 8 bits is input to the data control circuit 54 at writing. The data control circuit 54 and the interface chip IF are connected in parallel through the through silicon via TSV.

The control logic circuit 63 receives an internal command ICMD supplied from the interface chip IF through the through silicon via TSV and controls the row control circuit 61 and the column control circuit 62, based on the internal command ICMD. The control logic circuit 63 is connected to a layer address comparing circuit (chip information comparing circuit) 47. The layer address comparing circuit 47 detects whether the corresponding core chip is target of access, and the detection is performed by comparing a SEL (chip selection information) which is a part of the address signal supplied from the interface chip IF through the through silicon via TSV and a layer address LID (chip identification information) set to the layer address generating circuit 46.

In the layer address generating circuit 46, unique layer addresses are set to the core chips CC0 to CC7, respectively, at initialization. A method of setting the layer addresses is as follows. First, after the semiconductor memory device 10 is initialized, a minimum value (0, 0, 0) as an initial value is set to the layer address generating circuits 46 of the core chips CC0 to CC7. The layer address generating circuits 46 of the core chips CC0 to CC7 are cascade-connected using the through silicon vias TSV of the type shown in FIG. 2B, and have increment circuits provided therein. The layer address (0, 0, 0) that is set to the layer address generating circuit 46 of the core chip CC0 of the uppermost layer is transmitted to the layer address generating circuit 46 of the second core chip CC1 through the through silicon via TSV and is incremented. As a result, a different layer address (0, 0, 1) is generated. Hereinafter, in the same way as the above case, the generated layer addresses are transmitted to the core chips of the lower layers and the layer address generating circuits 46 in the core chips increment the transmitted layer addresses. A maximum value (1, 1, 1) as a layer address is set to the layer address generating circuit 46 of the core chip CC7 of the lowermost layer. Thereby, the unique layer addresses are set to the core chips CC0 to CC7, respectively.

The layer address generating circuit 46 is provided with a defective chip signal DEF supplied from the defective chip information holding circuit 33 of the interface chip IF, through the through silicon via TSV. As the defective chip signal DEF is supplied to the individual core chips CC0 to CC7 using the through silicon via TSV3 of the type shown in FIG. 2C, the defective chip signals DEF can be supplied to the core chips CC0 to CC7, individually. The defective chip signal DEF is activated when the corresponding core chip is a defective chip. When the defective chip signal DEF is activated, the layer address generating circuit 46 transmits, to the core chip of the lower layer, a non-incremented layer address, not an incremented layer address. The defective chip signal DEF is also supplied to the control logic circuit 63. When the defective chip signal DEF is activated, the control logic circuit 63 is completely halted. Thereby, the defective core chip performs neither read operation nor write operation, even though an address signal or a command signal is input from the interface chip IF.

An output of the control logic circuit 63 is also supplied to a mode register 64. When an output of the control logic circuit 63 shows a mode register set, the mode register 64 is updated by an address signal. Thereby, operation modes of the core chips CC0 to CC7 are set.

Each of the core chips CC0 to CC7 has an internal voltage generating circuit 70. The internal voltage generating circuit 70 is provided with power supply potentials VDD and VSS. The internal voltage generating circuit 70 receives these power supply potentials and generates various internal voltages. As the internal voltages that are generated by the internal voltage generating circuit 70, an internal voltage VPERI (≈VDD) for operation power of various peripheral circuits, an internal voltage VARY (<VDD) for an array voltage of the memory cell array 50, and an internal voltage VPP (>VDD) for an activation potential of the word line WL are included. In each of the core chips CC0 to CC7, a power-on detecting circuit 71 is also provided. When the supply of power is detected, the power-on detecting circuit 71 resets various internal circuits.

The peripheral circuits in the core chips CC0 to CC7 operates in synchronization with the internal clock signal ICLK that is supplied form the interface chip IF through the through silicon via TSV. The internal clock signal ICLK supplied through the through silicon via TSV is supplied to the various peripheral circuits through the input buffer B2.

The above description is the basic circuit configuration of the core chips CC0 to CC7. In the core chips CC0 to CC7, the front end unit for an interface with the external device is not provided. Therefore the core chip cannot operate as a single chip in principle. However, if the core chip never operates as the single chip, an operation test of the core chip in a wafer state may not be performed. This means that the semiconductor memory device 10 cannot be tested, before the interface chip and the plural core chips are fully assembled. In other words, the individual core chips are tested when testing the semiconductor memory device 10. When unrecoverable defect exists in the core chips, the entire semiconductor memory device 10 is led to be unavailable. In this embodiment, in the core chips CC0 to CC7, a portion of a pseudo front end unit, for testing, that includes some test pads TP and a test front end unit of a test command decoder 65 is provided, and an address signal, a test data, or a command signal can be input from the test pads TP. It is noted that the test front end unit is provided for a simple test in a wafer test, and does not have all of the front end functions in the interface chip. For example, since an operation frequency of the core chips is lower than an operation frequency of the front end unit, the test front end unit can be simply realized with a circuit that performs a test with a low frequency.

The kind of the test pads TP is almost the same as those of the external terminals provided in the interposer IP. Specifically, the test pads TP include a test pad TP1 supplied with the clock signal, a test pad TP2 supplied with the address signal, test pads TP3 supplied with the command signal, a test pad TP4 for performing input/output of test data, a test pad TP5 for performing input/output of data strobe signal, test pads 6 for supplying power-supply voltages.

A common external command (not decoded) is input at testing. Therefore, the test command decoder 65 is also provided in each of the core chips CC0 to CC7. Because serial test data is input and output at testing, a test input/output circuit 55 is also provided in each of the core chips CC0 to CC7.

This is the entire configuration of the semiconductor memory device 10. Because in the semiconductor memory device 10, the 8 core chips of 1 GB are laminated, the semiconductor memory device 10 has a memory capacity of 8 GB in total. Because the chip selection signal /CS is input to one terminal (chip selection terminal), the semiconductor memory device is recognized as a single DRAM having the memory capacity of 8 GB, in view of the controller.

A configuration of a test circuit for determining the magnitude of parasitic resistance value of an internal signal line constituted by a through silicon via TSV is described below. In the following descriptions, while an internal signal line constituted by the through silicon via TSV1 as shown in FIG. 2A is described, the present invention can be applied to other types of internal signal lines constituted by through silicon vias.

Figure 5:
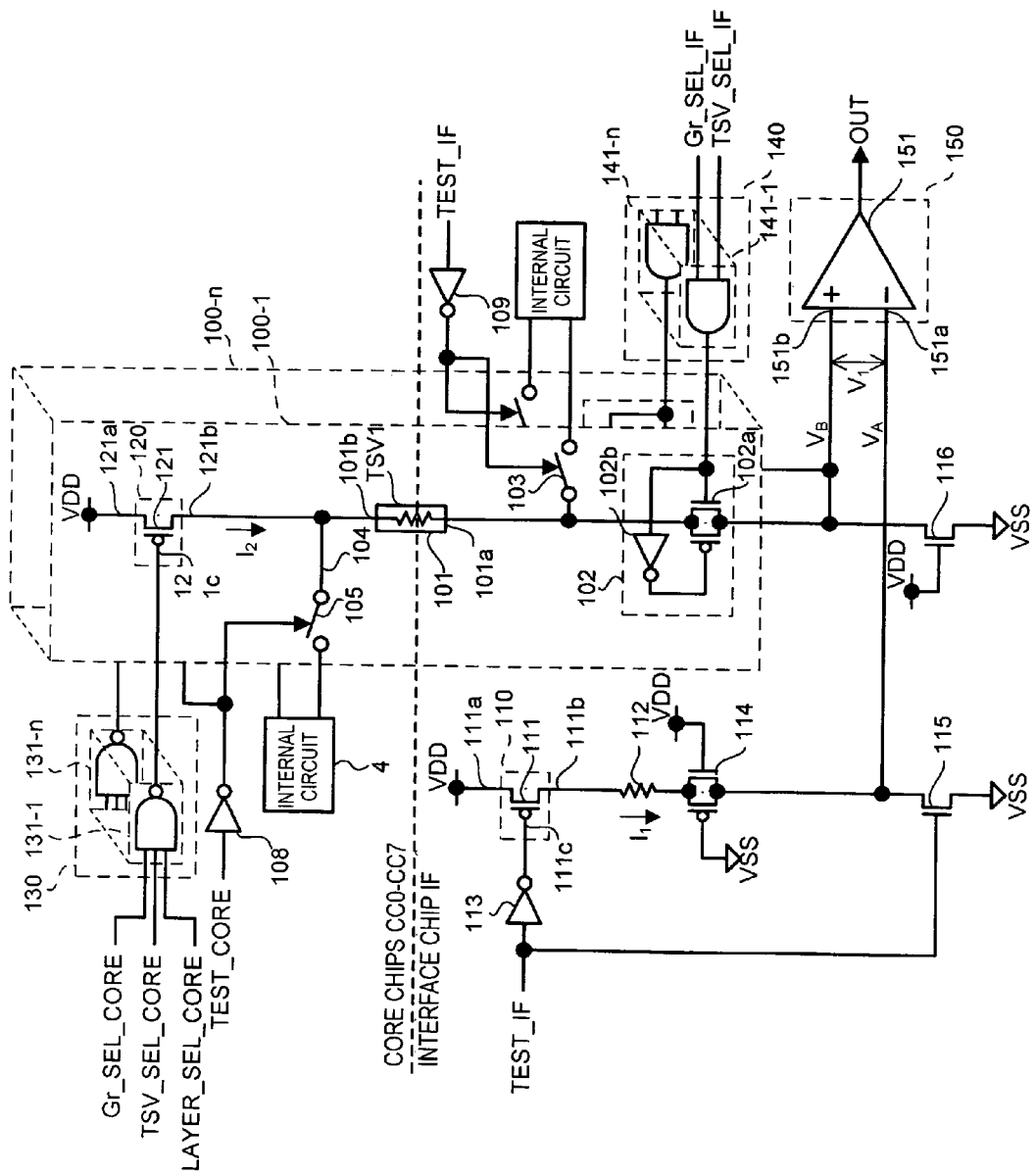
FIG. 5 is a circuit diagram showing a configuration of a test circuit of a semiconductor device according to the first embodiment of the present invention.

FIG. 5 is a circuit diagram showing a configuration of a test circuit of a semiconductor device 10 according to the first embodiment. Most of circuit components constituting the test circuit shown in FIG. 5 are included in the TSV relief circuit 73 mentioned above. While FIG. 5 shows only one core chip, a circuit similar to that shown in FIG. 5 is provided in all the core chips CC0 to CC7.

As shown in FIG. 5, the semiconductor device 10 includes a test circuit 100 (test circuits 100-1 to 100-n) for each to-be-tested internal signal line 101 (first internal signal line). Each test circuit 100 includes, in addition to the internal signal line 101 including the through silicon via TSV1, a switch circuit 102 arranged to be in series with the internal signal line 101 on an interface chip IF side, a switch element 103 provided at an internal wiring for connecting an internal circuit within the interface chip IF (the data latch circuit 25 shown in FIG. 4) to the internal signal line 101, a switch element 105 provided at an internal wiring 104 for connecting the internal circuit 4 within a core chip to the internal signal line 101, and a second circuit 120. The switch circuit 102 includes a transfer gate 102a (first switch element) and a NOT circuit 102b that serves as an inverter. This configuration is the same as that of the NOT circuit described below. The second circuit 120 includes a P-channel MOS transistor 121.

A test signal TEST_IF is inputted via a NOT circuit 109 to the switch element 103. The test signal TEST_IF is a high active signal that is activated when the internal signal line 101 is tested and inactivated when the internal signal line 101 is not tested. When the internal signal line 101 is tested, the switch element 103 is switched off (electrically disconnected (non-conducted)) and the internal circuit is disconnected from each internal signal line 101. When the internal signal line 101 is not tested, the switch element 103 is switched on (electrically connected (conducted)) and the internal circuit is connected to each internal signal line 101. This description is also applied to the following descriptions of "on" and "off".

The command decoder 32 within the interface chip IF also has a function of determining a test mode. When a command (test signal) for entering a test mode is externally inputted (from a controller or the like) to the mode register 42 and this command is registered in a predetermined bit in the mode register 42, the command decoder 32 generates (activates) the test signal TEST_IF. The test signal TEST_IF is also supplied to the core chips CC0 to CC7 and test signals are generated (activated) by circuits (not shown).

The switch circuits 102 and 121 and the switch element 105 are described later.

The interface chip IF is also provided with a first circuit 110 (current generation circuit) including a P-channel MOS transistor 111. A source 111a (first controlled terminal) of the transistor 111 is connected to a power supply wiring to which a power supply potential VDD (first power supply potential) is supplied. A drain 111b (second controlled terminal) is connected via a reference resistance 112 to be described later, a transfer gate 114, and an N-channel MOS transistor 115 to a power supply wiring to which a ground potential VSS (second power supply potential) is supplied. The test signal TEST_IF mentioned above is inputted via a NOT circuit 113 to a gate 111c (control terminal) of the transistor 111. When the internal signal line 101 is tested, the transistor 111 is switched on and a current $I_1$ (a drain current of the transistor 111) flows from the first circuit 110 to the reference resistance 112. When the internal signal line 101 is not tested, the transistor 111 is switched off and the current $I_1$ does not flow.

The reference resistance 112, the replica element 114 of the transfer gate 102a, and the N-channel MOS transistor 115 (first element) are serially connected to each other between the drain 111b of the transistor 111 and the power supply wiring to which the ground potential VSS is supplied. Note that the order of this serial connection is the same as the order of a route to be measured including the P-channel MOS transistor 121, the internal signal line 101, the transfer gate 102a, and a transistor 116 described later. Accordingly, when the order of connecting the elements within the route to be measured is different from that of FIG. 5, the order of connecting the elements in the current $I_1$ route becomes different correspondingly. The replica element has electrical characteristics that are the same as those of the transfer gate 102a (switch element). Preferably, the replica element means an element whose configuration, impurity profile, W/L ratio, and gate dielectric film thickness are the same as those of a subject element (the transfer gate 102a), and which is formed on the same substrate or a substrate with the same impurity density. The power supply potential VDD and the ground potential VSS are always supplied respectively to gates of the N-channel MOS transistor and the P-channel MOS transistor constituting the replica element 114 and the transistors are always switched on. The replica element 114 is provided for setting conditions of the current path including the internal signal line 101 (a current path through which a current $I_2$ flows to be described later) and conditions of the current path including the reference resistance (the current path through which the current $I_1$ flows) the same.

The reference resistance 112 is a resistance element that has a resistance value according to a target value of a parasitic resistance value of the internal signal line 101. More specifically, the resistance value of the reference resistance 112 is preferably a maximum value within a tolerance of the parasitic resistance value (a maximum resistance value when the semiconductor device 10 is determined to be a good one as the result of test). That is, when the parasitic resistance value of the internal signal line 101 is larger than the resistance value of the reference resistance 112, the internal signal line 101 is a defective one. The current $I_1$ and the current $I_2$ to be described later can have current values that do not depend on temperature by a well-known circuit technique.

The test signal TEST_IF mentioned above is inputted to a gate of the transistor 115. When the internal signal line 101 is tested, the transistor 115 is switched on. When the internal signal line 101 is not tested, the transistor 115 is switched off.

Each internal signal line 101 is connected to the power supply wiring to which the ground potential VSS is supplied via, in addition to the transfer gate 102a mentioned above, the N-channel MOS transistor 116 (first element) that serves as a replica element of the transistor 115. The power supply potential VDD is always supplied to a gate of the transistor 116 and thus the transistor 116 is always switched on.

Further, the interface chip IF includes an internal-signal-line selection receiving unit 140 (internal-signal-line selection receiving unit) that receives selection of one or a plurality of the internal signal lines 101. The internal-signal-line selection receiving unit 140 has an AND circuit 141 for each internal signal line 101 (AND circuits 141-1 to 141-n) and a to-be-tested group selection signal Gr_SEL_IF and a to-be-tested through silicon via selection signal TSV_SEL_IF are inputted to each AND circuit 141. Selection of to-be-tested groups means selection among, for example, a first group constituted by a plurality of I/Os, a second group constituted by a plurality of addresses, and a third group constituted by a plurality of control signals. Selection of to-be-tested through silicon vias means selecting a signal among a plurality of signals in each group, for example, selecting an address signal among sixteen address signals.

The to-be-tested group selection signal Gr_SEL_IF is used when the internal signal lines 101 are grouped and test on a group basis. When a particular group is selected, only the to-be-tested group selection signal Gr_SEL_IF inputted to the AND circuit 141 corresponding to the internal signal line 101 belonging to that group is activated (the switch circuit 102 is conducted) and the to-be-tested group selection signals Gr_SEL_IF inputted to other AND circuits 141 are inactivated (the switch circuits 102 are not conducted). When the test is not performed, the to-be-tested group selection signal is always inactivated.

The to-be-tested through silicon via selection signal TSV_SEL_IF is used when the to-be-tested internal signal line 101 designated one by one. Only the to-be-tested through silicon via selection signal TSV_SEL_IF inputted to the AND circuit 141 corresponding to the designated to-be-tested internal signal line 101 is activated and to-be-tested through silicon via selection signals TSV_SEL_IF inputted to other AND circuits 141 are inactivated. When the test is not performed, the to-be-tested through silicon via selection signal is always activated.

An output of the AND circuit 141 is activated when the inputted to-be-tested group selection signal Gr_SEL_IF and the inputted to-be-tested through silicon via selection signal TSV_SEL_IF are activated and the transfer gate 102a in the corresponding switch circuit 102 is switched on. The corresponding internal signal line 101 is thus connected to a determination circuit 150 to be described later. When any the inputted to-be-tested group selection signal Gr_SEL_IF and the inputted to-be-tested through silicon via selection signal TSV_SEL_IF is inactivated, the transfer gate 102a in the corresponding switch circuit 102 is switched off. The corresponding internal signal line 101 is thus disconnected from the determination circuit 150 to be described later.

The determination circuit 150 is also provided in the interface chip IF. The determination circuit 150 has a comparator 151 and its inverted input terminal 151a (first input terminal) is connected to an end of the reference resistance 112 that is opposite to an end to which the first circuit 110 is connected (more specifically, between the replica element 114 and the transistor 115). A non-inverting input terminal 151b (second input terminal) is connected to an end 101a of the internal signal line 101 in the interface chip IF (more specifically, between the switch circuit 102 and the transistor 116).

The comparator 151 outputs a voltage OUT according to a differential voltage $V_1$ between a voltage $V_A$ of the inverted input terminal 151a (hereinafter, "reference voltage $V_A$") and a voltage $V_B$ of the non-inverting input terminal 151b (hereinafter, "internal signal line voltage $V_B$"). Specifically, when the reference voltage $V_A$ is larger than the internal signal line voltage $V_B$, the output voltage OUT has low potential. When the reference voltage $V_A$ is lower than the internal signal line voltage $V_B$, the output voltage OUT has high potential. The output voltage OUT is externally outputted from the data input/output terminal 14 shown in FIG. 4 and outputted to the TSV relief circuit 73 shown in FIG. 4.

The second circuit 120 is provided in each core chip. A transistor that has the same size as that of the transistor 111 is used as the transistor 121 in the second circuit 120. A source 121a (third controlled terminal) of the transistor 121 is connected to the power supply wiring to which the power supply potential VDD (first power supply potential) is supplied and a drain 121b (fourth controlled terminal) is connected to each internal signal line 101. A chip-selection receiving unit 130 (chip-selection receiving unit) is connected to the gate 121c (control terminal) of the transistor 121.

The chip-selection receiving unit 130 has a NAND circuit 131 for each internal signal line 101 (NAND circuits 131-1 to 131-n). A to-be-tested group selection signal Gr_SEL_CORE and a to-be-tested through silicon via selection signal TSV_SEL_CORE are inputted to each NAND circuit 131 as in the internal-signal-line selection receiving unit 140 described above. A top layer selection signal LAYER_SEL_CORE for selecting a top layer of layers to be tested is also inputted.

The to-be-tested through silicon via selection signal TSV_SEL_CORE and the to-be-tested group selection signal Gr_SEL_CORE must be signals for selecting the same through silicon via TSV in correspondence with the to-be-tested through silicon via selection signal TSV_SEL_IF in the interface chip IF. The to-be-tested through silicon via selection signal TSV_SEL_CORE and the to-be-tested group selection signal Gr_SEL_CORE thus are the ones supplied from the interface chip IF or generated within the core chip by signals controlled by the interface chip IF. The to-be-tested TSV selected in the interface chip IF is always coincident with the one selected in the core chip.

The NAND circuit 131 inactivates its output when all the to-be-tested group selection signal Gr_SEL_CORE, the to-be-tested through silicon via selection signal TSV_SEL_CORE, and the top layer selection signal LAYER_SEL_CORE are activated. Among the test circuits 100-1 to 100-n within the core chip selected by the top layer selection signal LAYER_SEL_CORE, the transistor 121 included in the test circuit 100 selected by the to-be-tested group selection signal Gr_SEL_CORE and the to-be-tested through silicon via selection signal TSV_SEL_CORE is switched on. When the transistor 121 is switched on, the current $I_2$ (the drain current of the transistor 121) flows from the second circuit 120 to each internal signal line 101. When the transistor 121 is switched off, the current $I_2$ does not flow. For example, when the core chip constituted by eight layers and a sixth layer is selected by the top layer selection signal LAYER_SEL_CORE, the resistance of the through silicon vias TSV between the first layer and the sixth layer is measured.

The switch element 105 (second switch element) is connected between the internal signal line 101 and the internal circuit 4 of the core chip. The switch element 105 is controlled by a test signal TEST_CORE inputted via a NOT circuit 108. The test signal TEST_CORE is a high active signal. When the test signal TEST_CORE is high, the switch element 105 is switched off and the internal circuit 4 is disconnected from the internal signal line 101. When the through silicon via TSV is not tested, the test signal TEST_CORE is inactivated, the switch element 105 is switched on, and the internal circuit 4 is thus connected to the internal signal line 101. The test signal TEST_CORE and the test signal TEST_IF are activated at the same time. Accordingly, the test signal TEST_CORE is supplied from the interface chip IF or generated in the core chip by controlling the interface chip IF and activated at the same time. When the test signal TEST_CORE and the test signal TEST_IF are activated, the internal signal line 101 is disconnected from the internal circuit of the interface chip IF and the internal circuit 4 of the core chip.

Because the semiconductor device 10 has the configuration described above, the current $I_1$ and the current $I_2$ flowing at the time of test are equal to each other. Further, the difference $V_1$ between the reference voltage $V_A$ appearing at the inverted input terminal 151a of the comparator 151 and the internal signal line voltage $V_B$ appearing at the non-inverting input terminal 151b is in accordance with the difference between the reference resistance 112 and the parasitic resistance value of the internal signal line 101. Therefore, by referencing the output voltage OUT of the comparator 151, the magnitude of parasitic resistance value of the internal signal line 101 can be determined.

Figure 6:
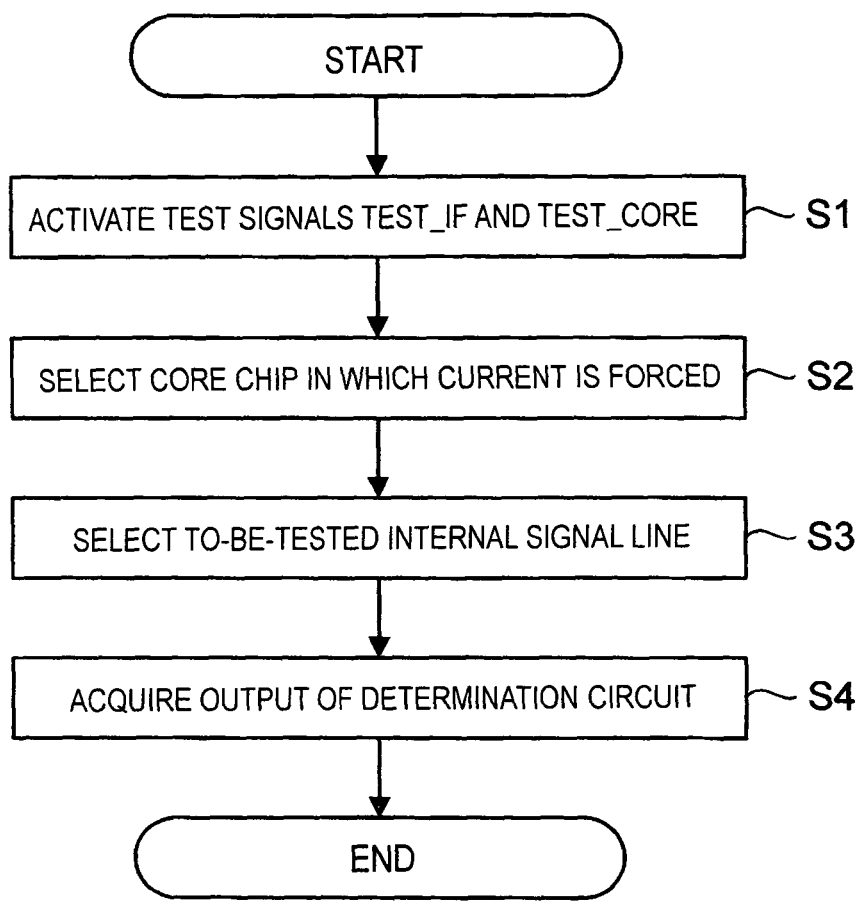
FIG. 6 is a flowchart of a method of testing the semiconductor device for determining the magnitude of parasitic resistance value of the internal signal line.

FIG. 6 is a flowchart of a method of testing the semiconductor device 10 for determining the magnitude of parasitic resistance value of the internal signal line. The testing method is described below with reference to FIG. 6, as well as FIG. 5.

As shown in FIG. 6, the TEST_IF signal and the TEST_CORE signal that serve as test signals are activated (step S1). The switch elements 103 and 105 are thus switched off and the internal signal line 101 is in a floated state, that is, disconnected from the internal circuit. This is performed in all the test circuits 100-1 to 100-n at the same time. The transistors 111 and 115 in the interface chip are switched on and the current I₁ begins to flow through the reference resistance 112, the replica element 114, and the transistor 115. The reference voltage $V_A$ is thus applied to the inverted input terminal 151a of the comparator 151.

A core chip in which a current is forced is then selected (step S2). That is, the top layer selection signal LAYER_SEL_CORE is activated. The top layer selection signal LAYER_SEL_CORE (the selection signal of the core chip) activates only a layer when, for example, a core chip constituted by of eight layers. The through silicon vias TSV between any core chip and the interface chip IF can be tested.

Next, the to-be-tested internal signal line is selected (step S3). By controlling by the interface chip IF, the to-be-tested group selection signals Gr_SEL_IF, Gr_SEL_CORE and the to-be-tested through silicon via selection signals TSV_SEL_IF, TSV_SEL_CORE (selection signals of the internal signal line) are selectively activated. The selected internal signal line 101 in the interface chip IF must be coincident with the one in the core chip. Only the transfer gate 102a of the to-be-tested internal signal line 101 on the interface chip IF side is switched on and only the transistor 121 of the to-be-tested internal signal line 101 on the core chip side is switched on. That is, the drain current $I_2$ of the transistor 121 flows through the internal signal line 101, the transfer gate 102a, and the transistor 116. The internal signal line voltage $V_B$ is applied to the non-inverting input terminal 151b of the comparator 151 in the interface chip. The voltage difference $V_1$ according to the difference between the reference resistance 112 and the parasitic resistance value of the internal signal line 101 thus appears between the inverted input terminal 151a and the non-inverting input terminal 151b of the comparator 151.

Finally, the output voltage OUT of the determination circuit 150 is taken out of the data input/output terminal 14 (step S4). As described above, the output voltage OUT has high potential as the parasitic resistance value of the internal signal line 101 is larger than the resistance value of the reference resistance 112 and has low potential as the parasitic resistance value is smaller than the resistance value of the reference resistance 112. Accordingly, by referencing the output voltage OUT using a so-called tester arranged outside the semiconductor device 10, a detailed parasitic resistance value of the internal signal line 101 can be determined precisely.

At step S4, the output voltage OUT is also inputted to the TSV relief circuit 73 shown in FIG. 4. The TSV relief circuit 73 (redundant circuit) determines, based on the output voltage OUT, whether the parasitic resistance value is larger than the resistance value of the reference resistance 112 for each internal signal line 101. The internal signal line 101 whose parasitic resistance value is larger than the resistance value of the reference resistance 112 is subjected to a process of replacing the corresponding internal signal line with an auxiliary internal signal line 101 by the same manner as that of relief of memory cells (a redundant process of an internal signal line). That is, the number of steps of measuring the output voltage OUT in a so-called tester arranged outside the semiconductor device 10 can be reduced.

Figure 7:
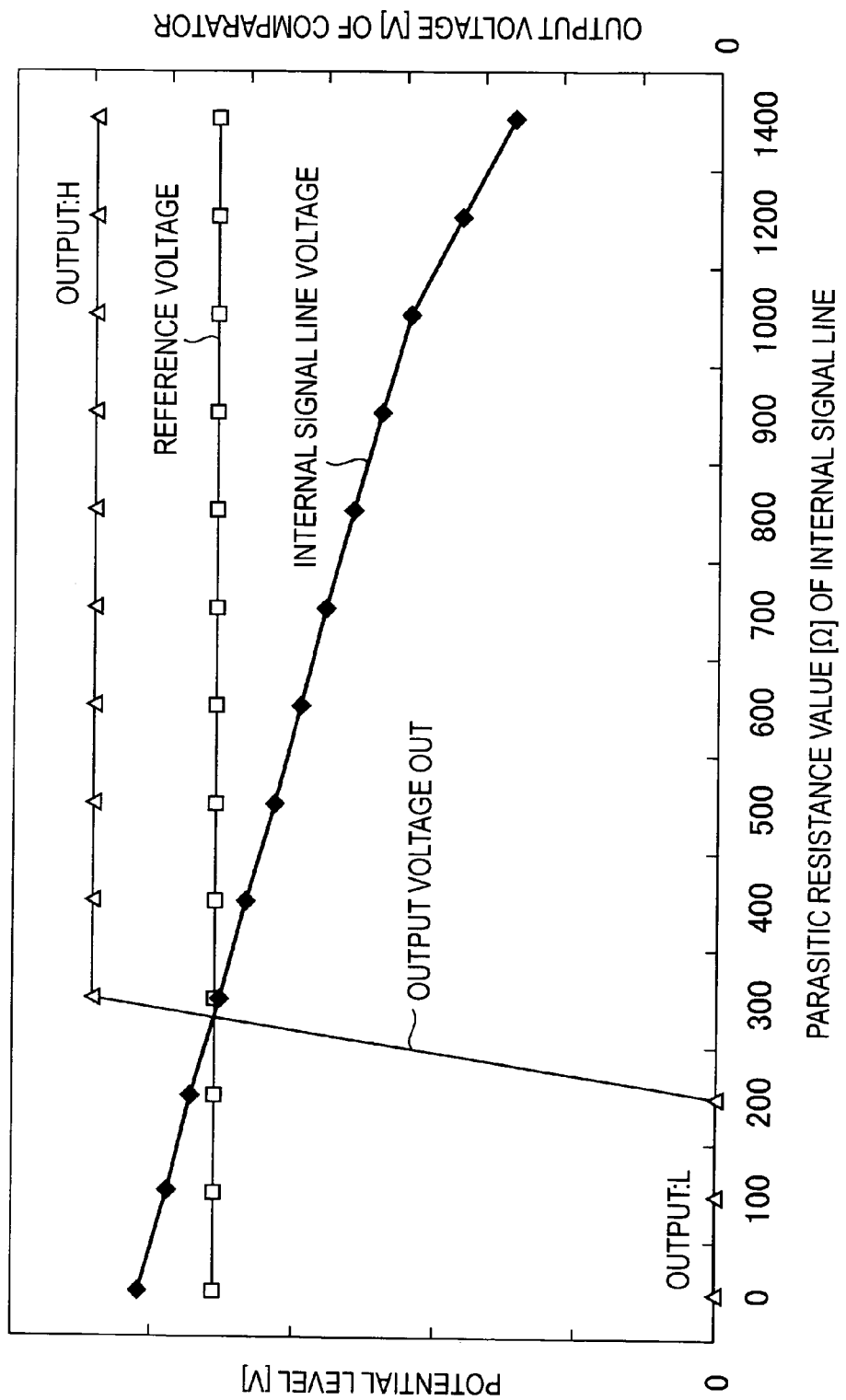
FIG. 7 shows a relationship between the parasitic resistance value ($\Omega$) of the internal signal line indicated as a horizontal axis, the potential level (V) of the reference voltage $V_A$ and the internal signal line voltage $V_B$ indicated as a left vertical axis, and the output voltage OUT (V) of the comparator indicated as a right vertical axis.

FIG. 7 shows a relationship between the parasitic resistance value (Ω) of the internal signal line 101 indicated as a horizontal axis, the potential level (V) of the reference voltage $V_A$ and the internal signal line voltage $V_B$ indicated as a left vertical axis, and the output voltage OUT (V) of the comparator 151 indicated as a right vertical axis.

As shown in FIG. 7, when the reference voltage $V_A$ is larger than the internal signal line voltage $V_B$, that is, when the parasitic resistance value of the internal signal line 101 is larger than the resistance value of the reference resistance 112, the output voltage OUT has low potential. When the reference voltage $V_A$ is lower than the internal signal line voltage $V_B$, that is, when the parasitic resistance value of the internal signal line 101 is smaller than the resistance value of the reference resistance 112, the output voltage OUT has high potential. That is, low potential of the output voltage OUT indicates that the parasitic resistance value of the internal signal line 101 is larger than the resistance value of the reference resistance 112 and an undesirable state occurs.

As described above, according to the semiconductor device 10 of the first embodiment, by referencing the voltage OUT outputted by the determination circuit 150, the magnitude of parasitic resistance value of the internal signal line 101 can be determined.

While FIG. 5 shows that the NAND circuits 131-1 to 131-n are provided within the chip-selection receiving unit 130 for the respective internal signal lines 101, only one NAND circuit 131 can be provided for controlling all the test circuits 100-1 to 100-n at a time. However, in this case, when a short-circuit defect occurs between through silicon vias TSV, a defective voltage level is propagated to other through silicon vias TSV, which is not preferable when a short-circuit mode defect of the through silicon via TSV is concerned. When a short-circuit mode defect is not concerned, by providing only one NAND circuit, the circuit of a core chip can be simplified and a chip area can be reduced.

For the transistors 111 and 121, the transistors 115 and 116 and the transistors constituting the transfer gates 102a and 114 shown in FIG. 5, transistors with the same size are preferably used, respectively.

Figure 8:
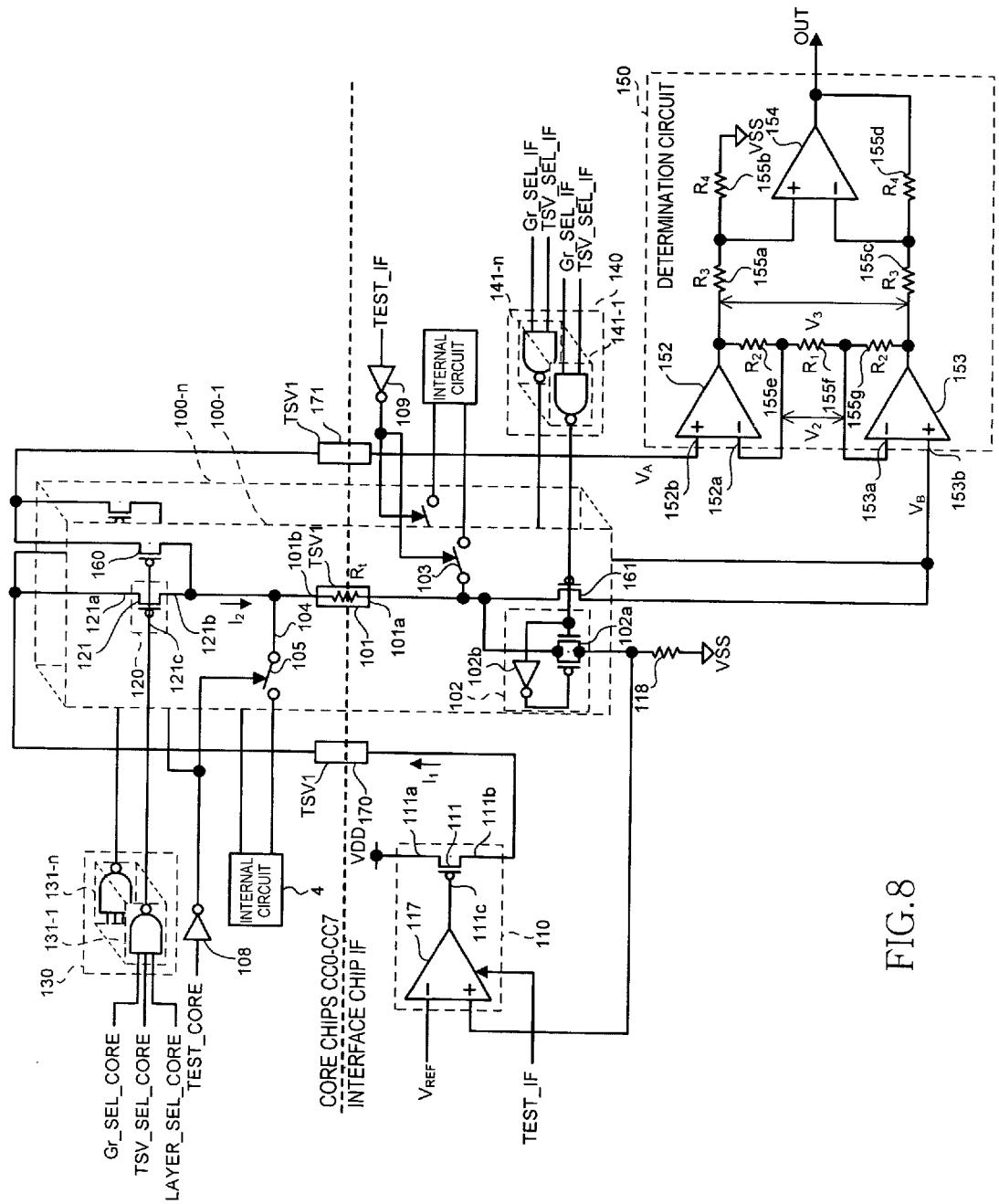
FIG. 8 is a circuit diagram showing a configuration of a test circuit of the semiconductor device according to a second embodiment of the present invention.

FIG. 8 is a circuit diagram showing a configuration of a test circuit of the semiconductor device 10 according to a second embodiment of the present invention.

The semiconductor device 10 according to the second embodiment is similar to the semiconductor device 10 according to the first embodiment except for the configuration of the test circuit. Most circuit elements constituting the test circuit shown in FIG. 8 are included in the TSV relief circuit 73 described above. While FIG. 8 shows only a core chip, a circuit similar to that shown in FIG. 8 is provided in all the core chips CC0 to CC7.

The configuration of a test circuit of the semiconductor device 10 according to the second embodiment is different from that of the first embodiment in configurations of the first and second circuits and the determination circuit. Differences are mainly described below.

The first circuit 110 includes a force amplifier 117, in addition to the transistor 111. The gate 111c of the transistor 111 is connected to an output terminal of the force amplifier 117. A non-inverting input terminal of the force amplifier 117 is connected via a resistance 118 to a power supply wiring to which a ground potential VSS is supplied and a voltage $V_{REF}$ with a predetermined value is inputted to an inverted input terminal.

An output end of the first circuit 110 (the drain 111b of the transistor 111) is connected to an input end of the second circuit 120 (the source 121a of the transistor 121) by an internal signal line 170 (second internal signal line) constituted by the through silicon via TSV1 that is the same as that of FIG. 2A.

Further, each internal signal line 101 is connected between the non-inverting input terminal of the force amplifier 117 and the resistance 118 via a P-channel MOS transistor (fifth switch element) constituting the transfer gate 102a in the switch circuit 102.

With the above configuration, the transistor 111 and the force amplifier 117 constituting the first circuit 110 function as a current generation circuit for generating a fixed current. The generated fixed current is outputted as the current $I_1$ from the first circuit 110 to the second circuit 120. The output current $I_2$ of the second circuit 120 is equal to the fixed current $I_1$ and supplied to each internal signal line 101.

The test signal TEST_IF is inputted to the force amplifier 117. The force amplifier 117 is thus operated when the test signal TEST_IF is activated, that is, when the internal signal line 101 is tested and is not operated when the test signal TEST_IF is inactivated, that is, when the internal signal line 101 is not tested. Accordingly, the current $I_1$ flows from the first circuit 110 only when the internal signal line 101 is tested.

Also in the second embodiment, the gate 121c of the transistor 121 is connected to the chip-selection receiving unit 130 (chip-selection receiving unit). The transistor 121 thus functions as a third switch element provided between the first circuit 110 that serves as a current generation circuit and each internal signal line 101. Specific operations of the transistor 121 are the same as those described in the first embodiment.

The determination circuit 150 constitutes a sense amplifier for amplifying a potential difference between input terminals. Specifically, the determination circuit 150 has operational amplifiers 152 to 154, a resistance with a resistance value $R_1$, and two resistances with each of resistance values $R_2$ to $R_4$. These are connected as follows. An output terminal of the operational amplifier 152 is connected via a resistance 155a with the resistance value $R_3$ and a resistance 155b with the resistance value $R_4$ to a power supply wiring to which a ground potential VSS is supplied. A non-inverting input terminal of the operational amplifier 154 is connected between the resistance 155a and the resistance 155b. An output terminal of the operational amplifier 153 is connected via a resistance 155c with the resistance value $R_3$ and a resistance 155d with the resistance value $R_4$ to an output terminal of the operational amplifier 154. An inverted input terminal of the operational amplifier 154 is connected between the resistance 155c and the resistance 155d. Further, a resistance 155e with the resistance value $R_2$, a resistance 155f with the resistance value $R_1$, and a resistance 155g with the resistance value $R_2$ are serially connected to each other in this order between a wiring between the output terminal of the operational amplifier 152 and the resistance 155a and a wiring between the output terminal of the operational amplifier 153 and the resistance 155c. A connected point of the resistance 155e and the resistance 155f is connected to an inverted input terminal 152a of the operational amplifier 152. A connected point of the resistance 155f and the resistance 155g is connected to an inverted input terminal 153a of the operational amplifier 153. A non-inverting input terminal 152b of the operational amplifier 152 and a non-inverting input terminal 153b of the operational amplifier 153 are a first input terminal and a second input terminal in the determination circuit 150, respectively.

The reference voltage $V_A$ and the internal signal line voltage $V_B$ are inputted respectively to the non-inverting input terminal 152b that serves as the first input terminal and the non-inverting input terminal 153b that serves as the second input terminal.

The reference voltage $V_A$ and the internal signal line voltage $V_B$ in the second embodiment are described below.

The first input terminal 152b of the determination circuit 150 to which the reference voltage $V_A$ is inputted is commonly connected via an internal signal line 171 (third internal signal line) constituted by the through silicon via TSV1 that is the same as that of FIG. 2A and a P-channel MOS transistor 160 (fourth switch element) to an end 101b of the internal signal line 101 within a core chip.

On the other hand, the second input terminal 153b of the determination circuit 150 to which the internal signal line voltage $V_B$ is inputted is commonly connected via a P-channel MOS transistor 161 (sixth switch element) to the end 101a of each internal signal line 101 within the interface chip IF.

The transistors 160 and 161 are provided for electrically connecting the determination circuit 150 to the internal signal line 101 when a test is performed and electrically disconnecting the determination circuit 150 from the, internal signal line 101 when a test is not performed. That is, a gate of the transistor 160 is connected to an output of the chip-selection receiving unit 130 as shown in FIG. 8. The transistor 160 is thus switched on in a core chip to be tested and the first input terminal 152b of the determination circuit 150 is connected to each internal signal line 101. In a core chip that is not tested, the transistor 160 is switched off and the first input terminal 152b of the determination circuit 150 is disconnected from the each internal signal line 101. Similarly, an output of the internal-signal-line selection receiving unit 140 is inputted to a gate of the transistor 161. Accordingly, when the internal signal line 101 is tested, the transistor 161 is switched on and the second input terminal 153b of the determination circuit 150 is connected to each internal signal line 101. When a test is not performed, the transistor 161 is switched off and the second input terminal 153b of the determination circuit 150 is disconnected from the internal signal line 101.

A difference $V_A-V_B$ between the reference voltage $V_A$ and the internal signal line voltage $V_B$ is equal to a potential difference appearing at both ends of the internal signal line 101 by the current $I_1$ (a difference between a voltage of the end 101b of the internal signal line 101 in the core chip and a voltage of the end 101a of the internal signal line 101 in the interface chip IF). Because such a potential difference is obtained merely by multiplying the parasitic resistance value of the internal signal line 101 to be tested by the current $I_1$, the difference $V_A-V_B$ is thus represented by the following equation (1). $R_t$ indicates the parasitic resistance value of the to-be-tested internal signal line 101.

$$V_A - V_B = I_1 \cdot R_t \qquad (1)$$

Regarding connection of the determination circuit 150 described above, a measurement system is not affected by a wiring resistance. Assume that the disconnection of the determination circuit 150 from the internal signal line 101 when a test is not performed is realized by connecting a source side of the transistor 121 to the first input terminal 152b and a drain side of the transfer gate 102a to the second input terminal 153b. The difference $V_A-V_B$ between the reference voltage $V_A$ and the internal signal line voltage $V_B$ may include voltages across the transistor 121 and across the transfer gate 102a. Meanwhile, when the connection described above is realized and an input impedance of the determination circuit 150 is sufficiently large, a potential difference appearing at both ends of the internal signal line 101 purely appears in the difference $V_A-V_B$.

Returning to the description of the determination circuit 150, a potential difference $V_2$ between the inverted input terminal 152a of the operational amplifier 152 and the inverted input terminal 153a of the operational amplifier 153, a potential difference $V_3$ between the output terminal of the operational amplifier 152 and the output terminal of the operational amplifier 153, and the output voltage OUT of the operational amplifier 154 are represented by the following equations (2) to (4).

$$V_2 = V_A - V_B \tag{2}$$

$$V_3 = V_2 \cdot \left(1 + 2 \cdot \frac{R_2}{R_1}\right) \tag{3}$$

$$OUT = V_3 \cdot \frac{R_4}{R_3} \tag{4}$$

That is, the voltage $V_2$ is equal to the difference between the reference voltage $V_A$ and the internal signal line voltage $V_B$. The voltage $V_3$ is obtained by amplifying the voltage $V_2$ using the operational amplifiers 152 and 153. Specifically, the voltage $V_3$ is obtained by adding a value calculated by amplifying the voltage $V_2$ by an amplification factor $R_2/R_1$ of the operational amplifiers 152 and 153 to the voltage $V_2$. The output voltage OUT is obtained by amplifying the voltage $V_3$ with an amplification factor $R_4/R_3$.

When the equations (1) to (4) are solved simultaneously, the output voltage OUT is calculated as the following equation (5). In the right side of the equation (5), there are known predetermined values other than the parasitic resistance value $R_t$ of the internal signal line 101. It is thus understood from the equation (5) that the output voltage OUT is proportional to the parasitic resistance value $R_t$ of the internal signal line 101. That is, the output voltage OUT of the determination circuit 150 is in accordance with the parasitic resistance value of the internal signal line 101 and the parasitic resistance value of the internal signal line 101 can be obtained from the output voltage OUT.

$$OUT = I_1 \cdot \left(1 + 2 \cdot \frac{R_2}{R_1}\right) \cdot \frac{R_4}{R_3} \cdot R_t \tag{5}$$

Figure 9:
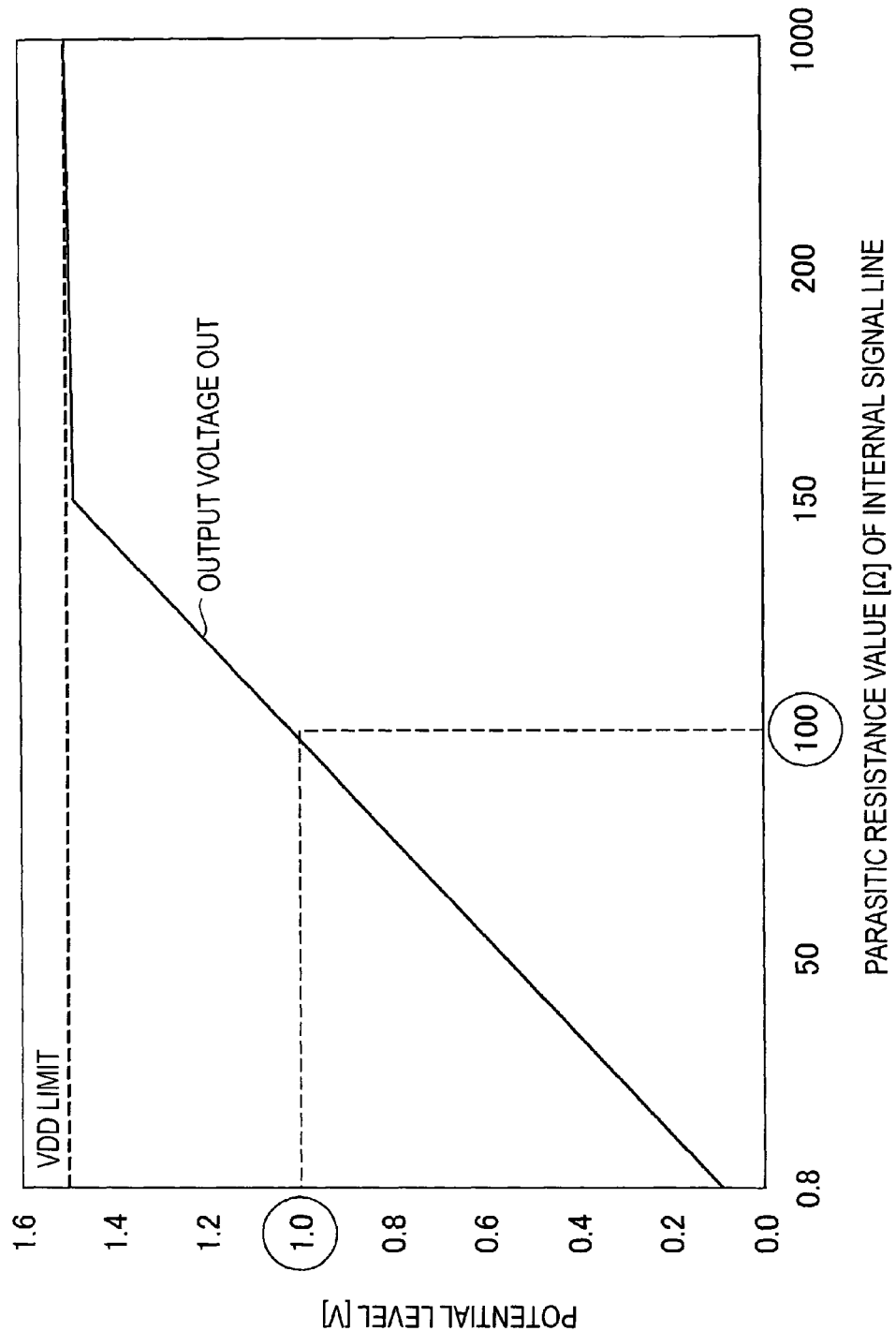
FIG. 9 shows a relationship between the parasitic resistance value ($\Omega$) of the internal signal line indicated as a horizontal axis and the output voltage OUT (V) indicated as a vertical axis.

FIG. 9 shows a relationship between the parasitic resistance value (Ω) of the internal signal line 101 indicated as a horizontal axis and the output voltage OUT (V) indicated as a vertical axis. As clearly seen from FIG. 9, the parasitic resistance value (Ω) is proportional to the output voltage OUT (V) as long as the output voltage OUT (V) is equal to or lower than the supply voltage VDD. Accordingly, the parasitic resistance value of the internal signal line 101 can be obtained from the output voltage OUT. According to an example of FIG. 9, when the output voltage OUT is 1.0 V, 100Ω is obtained as the parasitic resistance value of the internal signal line 101.

As described above, according to the semiconductor device 10 of the second embodiment, a test is performed by the same procedure as that described in the first embodiment with reference to FIG. 6 and the voltage OUT outputted by the determination circuit 150 is referenced. The parasitic resistance value of the internal signal line 101 can thus be obtained. Therefore, the magnitude of parasitic resistance value of the internal signal line 101 can be also determined.

According to the configuration of FIG. 8, a pair property of transistors constituting the transistors 111 and 121, the transistors 121 and 102, or the transistors 160 and 161 does not need to be considered. Transistors with the same size do not need to be used. This is because the semiconductor device 10 according to the second embodiment is hardly affected by the wiring resistance. The transistors 160 and 161 for determining resistance measurement points are preferably arranged so as to be adjacent to terminals of the internal signal wiring 101 so that a measured resistance does not include an excessive wiring resistance.

The internal signal lines 170 and 171 have preferably a redundant configuration that, for example, two through silicon vias TSV are connected in parallel to each other in case that the internal signal lines 170 and 171 are broken. Even when the internal signal line 170 and/or the internal signal line 171 has high resistance, the remaining internal signal line 170 and/or the internal signal line 171 can continue the test.

One internal signal line 171 is desirably provided for each group to be tested. That is, one internal signal line 171 is desirably provided for a predetermined number of internal signal lines 101.

It suffices that the first circuit 110 and the determination circuit 150 are provided at least within the semiconductor device 10. The parasitic resistance value of the internal signal line 101 can be measured with high precision. This is because, as described above, the potential difference appearing at the both ends of the internal signal line 101 purely appears in the difference $V_A-V_B$.

Figure 10:
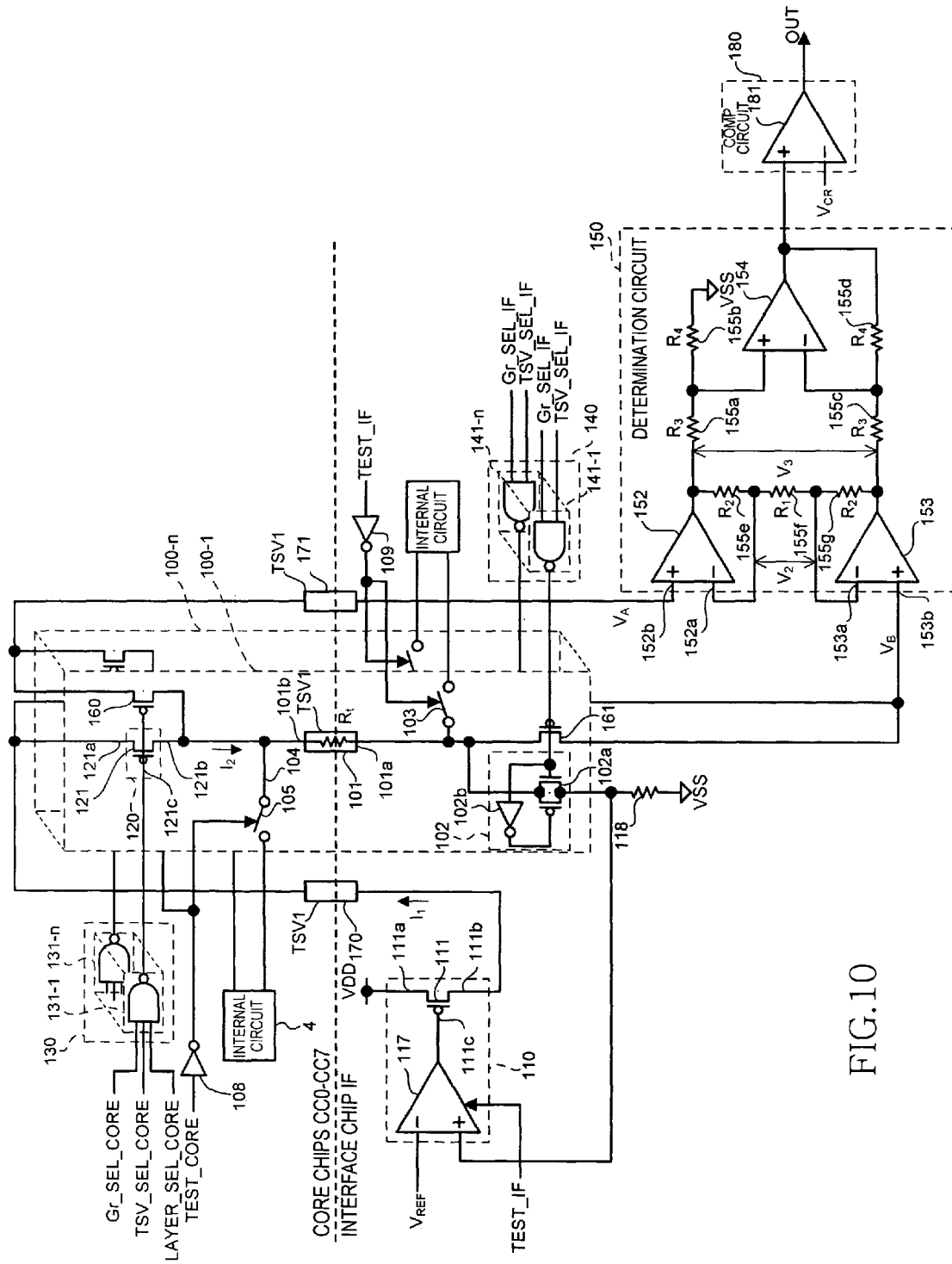
FIG. 10 is a circuit diagram showing a configuration of a test circuit of the semiconductor device according to a third embodiment of the present invention.

FIG. 10 is a circuit diagram showing a configuration of a test circuit of the semiconductor device 10 according to a third embodiment of the present invention.

The semiconductor device 10 according to the third embodiment is similar to the semiconductor device 10 according to the first embodiment except for the configuration of the test circuit. Most circuit elements constituting the test circuit shown in FIG. 10 are included in the TSV relief circuit 73 described above. While FIG. 10 shows only a core chip, a circuit similar to that shown in FIG. 10 is provided in all the core chips CC0 to CC7.

The configuration of a test circuit of the semiconductor device 10 according to the third embodiment is different from that of the second embodiment in that a comparison circuit 180 is provided in a downstream of the determination circuit. Differences from the second embodiment are mainly described below.

As shown in FIG. 10, the comparison circuit 180 has a comparator 181. A non-inverting input terminal of the comparator 181 is connected to an output terminal of the determination circuit 150 (an output terminal of the operational amplifier 154). A predetermined threshold voltage $V_{CR}$ is inputted to an inverted input terminal. The output voltage OUT is outputted from an output terminal of the comparator 181.

Figure 11:
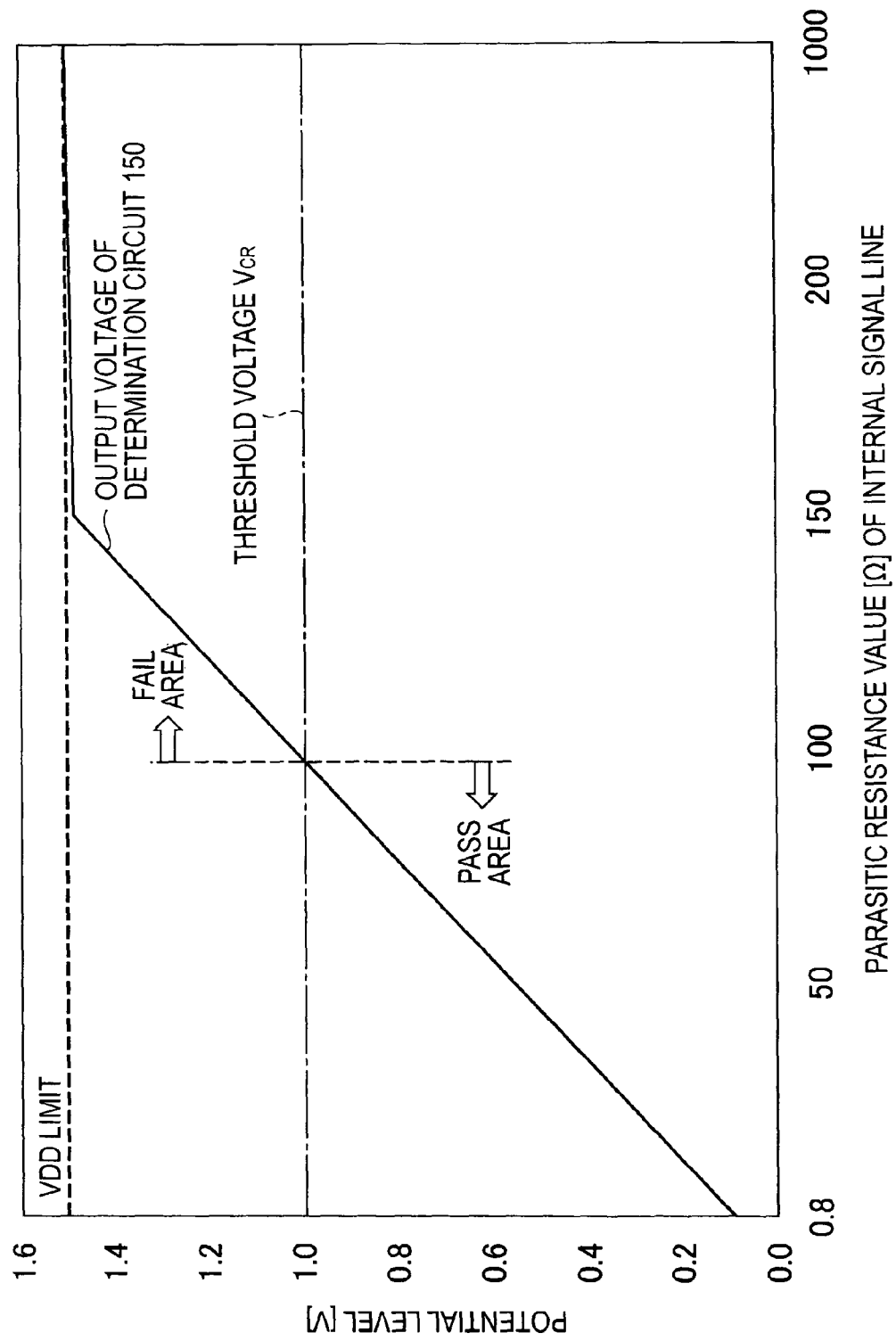
FIG. 11 is for explaining an operation of the comparator according to the third embodiment of the present invention.

FIG. 11 is for explaining an operation of the comparator 181. FIG. 11 is the same as FIG. 9 except that the threshold voltage $V_{CR}$ is added.

As shown in FIG. 11, the threshold voltage $V_{CR}$ always has a fixed value (1.0 V in FIG. 11). The comparator 181 compares an output voltage of the determination circuit 150 that is inputted to the non-inverting input terminal to the threshold voltage $V_{CR}$ with a fixed value. When the output voltage of the determination circuit 150 is higher than the threshold voltage $V_{CR}$, the output voltage OUT has high potential (in a fail area). When the output voltage of the determination circuit 150 is not higher than the threshold voltage $V_{CR}$, the output voltage OUT has low potential (in a pass area). Accordingly, when the output voltage OUT has high potential, it means that the output voltage of the determination circuit 150 is higher than the threshold voltage $V_{CR}$ and the parasitic resistance value of the internal signal line 101 becomes large to an undesirable extent. Meanwhile, when the output voltage OUT has low potential, it means that the parasitic resistance value of the internal signal line 101 is not problematic.

As described above, according to the semiconductor device 10 of the third embodiment, a fail/pass is determined by the comparison circuit 180 in the interface chip IF. By inputting the threshold voltage $V_{CR}$ from a so-called tester arranged outside the semiconductor device 10 to the semiconductor device 10, the time required for the measurement test can be reduced as compared to a case of measuring the output voltage OUT by the tester. In addition, it means the semiconductor device 10 can implement the redundancy of the through silicon vias TSV autonomously by the simple TSV relief circuit 73. These are included in a well-known BIST (Built-in Self test). In this case, a fail/pass does not need to be determined in a so-called tester outside the semiconductor device 10, resulting in simplification of test steps. When these are included in BIST, the threshold voltage $V_{CR}$ is desirably generated within the semiconductor device 10.

Figure 12:
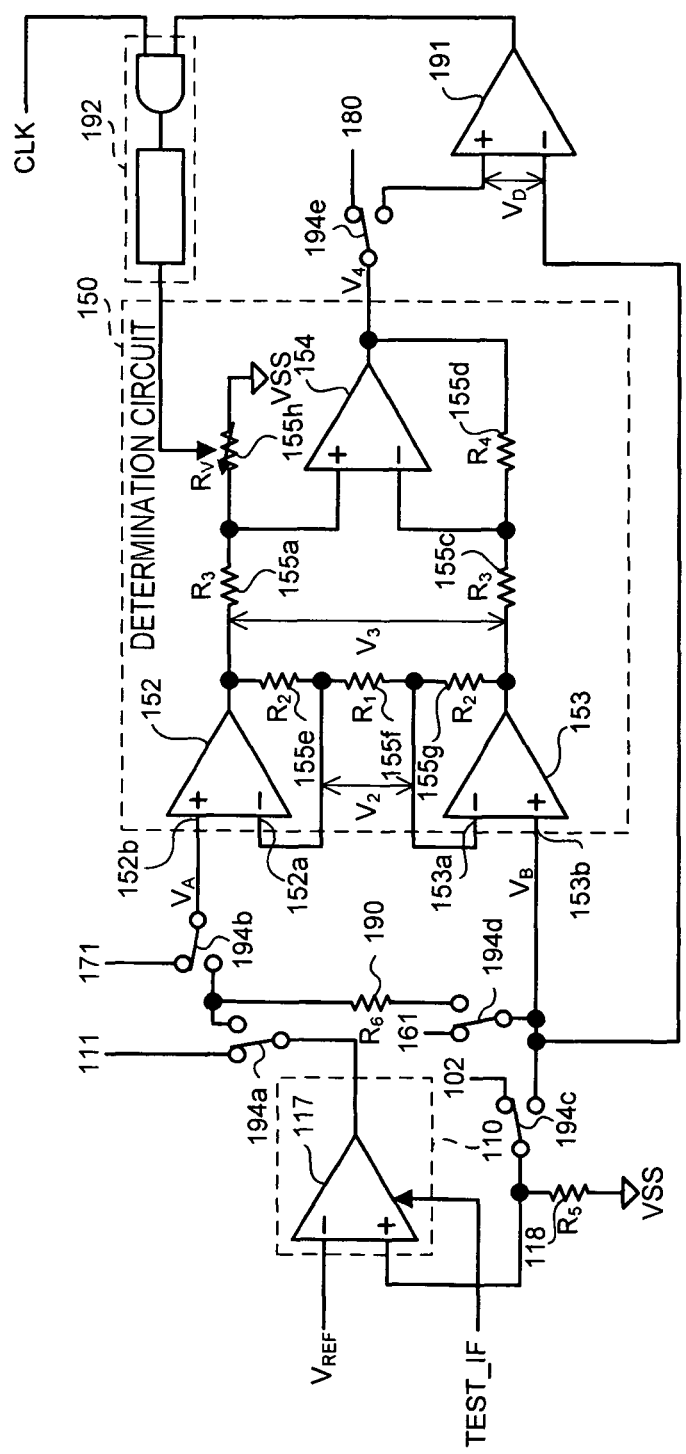
FIG. 12 is a circuit diagram showing a part of configuration of a test circuit of the semiconductor device according to a fourth embodiment of the present invention.

FIG. 12 is a circuit diagram showing a part of configuration of a test circuit of the semiconductor device 10 according to a fourth embodiment of the present invention. The semiconductor device 10 according to the fourth embodiment is a modified example of the semiconductor device according to the third embodiment (FIG. 10). The semiconductor device 10 according to the fourth embodiment is different from the semiconductor device 10 according to the third embodiment in that the semiconductor device 10 according to the fourth embodiment has a function of canceling an input offset of the determination circuit 150. The basic configuration of a test circuit is the same as that of the semiconductor device 10 according to the third embodiment shown in FIG. 10. In FIG. 12, many elements common to those of the semiconductor device 10 according to the third embodiment are omitted. Differences from the semiconductor device 10 according to the third embodiment are mainly described below.

As shown in FIG. 12, the semiconductor device 10 according to the fourth embodiment includes a variable resistance 155$h$ instead of the resistance 155$b$ in the determination circuit 150. Further, the semiconductor device 10 includes a resistance 190 with a resistance value $R_6$, a comparator 191 (comparing unit), a counter/latch circuit 192 (amplification-factor adjusting unit), and switch elements 194$a$ to 194$e$. These components are provided in the interface chip IF. A resistance value of the resistance 118 is indicated by $R_5$, a resistance value of the variable resistance 155$h$ is indicated by $R_V$. An output voltage of the operational amplifier 154 is indicated by $V_4$.

An amplification factor A of the determination circuit 150 including the variable resistance 155$h$ is represented by the following equation (6). An amplification factor $A_0$ in the equation (6) is the amplification factor of the determination circuit 150 when $R_V = R_4$ and represented by the equation (7). As can be understood from these equations, the amplification factor A can be adjusted by adjusting the resistance value $R_V$. That is, the amplification factor A of the determination circuit 150 according to the fourth embodiment is variable.

$$A = A_0 \cdot \frac{1 + \frac{R_3}{R_4}}{1 + \frac{R_3}{R_V}} \quad (6)$$

$$A_0 = \left(1 + 2 \cdot \frac{R_2}{R_1}\right) \cdot \frac{R_4}{R_3} \quad (7)$$

The outline of the semiconductor device 10 according to the fourth embodiment is described first. The determination circuit 150 may have input offsets because of errors in threshold voltage of transistors. The input offset itself is merely a voltage of 10 mV. However, because the determination circuit 150 has the amplification function, the input offset is also amplified to become a large error in the output voltage $V_4$ of the determination circuit 150. For example, when the amplification factor A is 20, an input offset of 10 mV becomes an error of 200 mV in the output voltage $V_4$. In the semiconductor device 10 according to the fourth embodiment, by adjusting the amplification factor A of the determination circuit 150, the input offset is cancelled.

To be more specific, the semiconductor device 10 is designed to enter a calibration mode in response to external instruction signals (not shown). In the calibration mode, the first circuit 110 and the determination circuit 150 are disconnected from the through silicon via and the comparison circuit 180, and the non-inverting input terminal 152$b$ and the non-inverting input terminal 153$b$ are short-circuited via the resistance 190. An input voltage $V_A - V_B$ of the determination circuit 150 thus becomes a fixed value (a value that does not depend on the parasitic resistance value of the through silicon via). Accordingly, assume that the input offset of the determination circuit 150 is zero, the output voltage $V_4$ of the operational amplifier 154 is a fixed value obtained by multiplying the fixed value by the above amplification factor A. When the input offset is not zero, the output voltage $V_4$ is shifted from the fixed value correspondingly. The semiconductor device 10 detects such a shift by the calibration mode and adjusts the amplification factor A of the determination circuit 150 according to the magnitude of the detected shift so that the input offset is cancelled (so that the output voltage $V_4$ of the operational amplifier 154 is equal to the fixed value). Detailed descriptions thereof are given below.

The switch elements 194$a$ to 194$e$ are one-circuit-two-contact type switches. A common terminal, one output terminal, and other output terminal of the switch element 194$a$ are connected to an output terminal of the force amplifier 117, the gate 111$c$ of the transistor 111 (FIG. 10), and one end of the resistance 190, respectively. A common terminal, one output terminal, and other output terminal of the switch element 194$b$ are connected to the non-inverting input terminal 152$b$ of the operational amplifier 152, an end of the internal signal line 171 in the interface chip IF, and one end of the resistance 190, respectively. A common terminal and other output terminal of the switch element 194$c$ are connected to a non-inverting input terminal of the force amplifier 117 and the non-inverting input terminal 153$b$ of the operational amplifier 153, respectively. One output terminal of the switch element 194$c$ is connected via the switch circuit 102 to the end 101$a$ of the internal signal line 101 in the interface chip IF (FIG. 10). A common terminal and other output terminal of the switch element 194$d$ are connected to the non-inverting input terminal 153$b$ of the operational amplifier 153 and the other end of the resistance 190, respectively. One output terminal of the switch element 194$d$ is connected via the transistor 161 to the end 101$a$ of the internal signal line 101 in the interface chip IF (FIG. 10). A common terminal, one output terminal, and other output terminal of the switch element 194$e$ are connected to an output terminal of the operational amplifier 154, the non-inverting input terminal of the comparator 181 (FIG. 10), and a non-inverting input terminal of the comparator 191, respectively.

When the semiconductor device 10 does not enter the calibration mode, the switch elements 194$a$ to 194$e$ connect between their common terminals and their one output terminals and open between their common terminals and their other output terminals. When the semiconductor device 10 enters the calibration mode, the switch elements 194$a$ to 194$e$ open between their common terminals and their one output terminals and connect between their common terminals and their other output terminals. The first circuit 110 and the determination circuit 150 are thus disconnected from the through silicon via and the comparison circuit 180, and the non-inverting input terminal 152b and the non-inverting input terminal 153b are short-circuited via the resistance 190.

Connections and operations of respective elements when the semiconductor device 10 does not enter the calibration mode are as described in the second and third embodiments, and thus descriptions thereof are omitted. Descriptions are continued below on an assumption that the semiconductor device 10 has entered the calibration mode.

The force amplifier 117 starts to operate when the test signal TEST_IF is activated and flows a current to the resistance 190. This current enables the reference voltage $V_{REF}$ (second predetermined voltage) that is inputted to the inverted input terminal of the force amplifier 117 to be amplified at the amplification factor $R_6/R_5$, and a voltage $V_{REF} \cdot (R_6/R_5)$ (first predetermined voltage) is applied between the non-inverting input terminal 152b and the non-inverting input terminal 153b. In other words, the force amplifier 117, the resistance 118, and the resistance 190 function as a voltage application unit that amplifies the reference voltage $V_{REF}$ at the amplification factor $R_6/R_5$ to generate the voltage $V_{REF} \cdot (R_6/R_5)$ and apply the same between the non-inverting input terminal 152b and the non-inverting input terminal 153b. As a result, the output voltage $V_4$ of the determination circuit 150 is represented by the following equation (8) wherein $V_{OFFSET}$ is the input offset of the determination circuit 150. As clearly seen from the equation (8), when $R_V = R_4$ and $V_{OFFSET} = 0$, the output voltage $V_4$ is the fixed value $V_{REF} \cdot (R_6/R_5) \cdot A_0$.

$$V_4 = \left(V_{REF} \cdot \frac{R_6}{R_5} + V_{OFFSET}\right) \cdot A \quad (8)$$

The output voltage $V_4$ and the internal signal line voltage $V_B$ (the input voltage of the non-inverting input terminal 153b of the operational amplifier 153) are inputted to a non-inverting input terminal and an inverted input terminal of the comparator 191, respectively. The internal signal line voltage $V_B$ is equal to the reference voltage $V_{REF}$ (the second predetermined voltage) by a virtual short-circuit of the force amplifier 117. The comparator 191 thus compares the output voltage $V_4$ to the reference voltage $V_{REF}$ and outputs high when a difference $V_D = V_4 - V_{REF}$ is plus and low when the difference is small.

A specific value of the resistance value $R_6$ of the resistance 190 is determined so that the output voltage $V_4$ when $R_V = R_4$ and $V_{OFFSET} = 0$ is equal to the reference voltage $V_{REF}$. That is, $(R_6/R_5) \cdot A_0 = 1$. The difference $V_D$ is thus represented by the following equation (9).

$$V_D = V_4 - V_{REF} = V_{REF} \cdot \left(\frac{1 + \frac{R_3}{R_4}}{1 + \frac{R_3}{R_V}} - 1\right) + V_{OFFSET} \cdot A \quad (9)$$

The counter/latch circuit 192 adjusts the amplification factor A of the determination circuit 150 based on the output voltage of the comparator 191 (a result of comparison). An operation of the counter/latch circuit 192 is described below in detail.

A clock signal CLK is also inputted to the counter/latch circuit 192. The clock signal CLK can be an external clock signal CK or can be a clock signal generated within the semiconductor device 10 (an internal clock signal ICLK, for example). The counter/latch circuit 192 contains a counter and increases a count value of the counter by one step when the output voltage of the comparator 191 is high at a rising edge (or a falling edge) of the clock signal CLK. When the output voltage of the comparator 191 is low at the rising edge (or the falling edge) of the clock signal CLK, the count value of the counter is decreased by one step.

The counter/latch circuit 192 adjusts the amplification factor A based on the count value of the counter in a direction that the difference $V_D$ is zero. Specifically, the resistance value $R_V$ of the variable resistance 155h is adjusted. The counter/latch circuit 192 reduces the resistance value $R_V$ by one step when the count value of the counter is increased by one step, that is, when $V_4 > V_{REF}$ to reduce the amplification factor A. The output voltage $V_4$ is reduced and thus the difference $V_D$ approximates zero. Meanwhile, when the count value of the counter is decreased by one step, that is, when $V_4 < V_{REF}$, the resistance value $R_V$ is increased by one step to increase the amplification factor A. The output voltage $V_4$ is increased and thus the difference $V_D$ approximates zero.

As described above, according to the semiconductor device 10 of the fourth embodiment, the difference $V_D$ can approximate zero. That is, the input offset of the determination circuit 150 can be cancelled.

Specific numerical examples are given to facilitate the understanding of the description. For example, when $R_1 = 100$ k$\Omega$, $R_2 = 200$ k$\Omega$, $R_3 = 200$ k$\Omega$, $R_4 = 800$ k$\Omega$, and $R_5 = 5$ k$\Omega$, the amplification factor $A_0$ is 20 by the equation (7) and $R_6$ is 100$\Omega$. When $R_V$ is 800 k$\Omega$ ($=R_4$), the difference $V_D$ is equal to 20 $V_{OFFSET}$ by the equation (9). By adjusting the resistance value $R_V$ so that the output voltage $V_4$ is smaller by 20 $V_{OFFSET}$ as compared to the case of $R_V = R_4 = 800$ k$\Omega$, the input offset of the determination circuit 150 can be cancelled.

Figure 13:
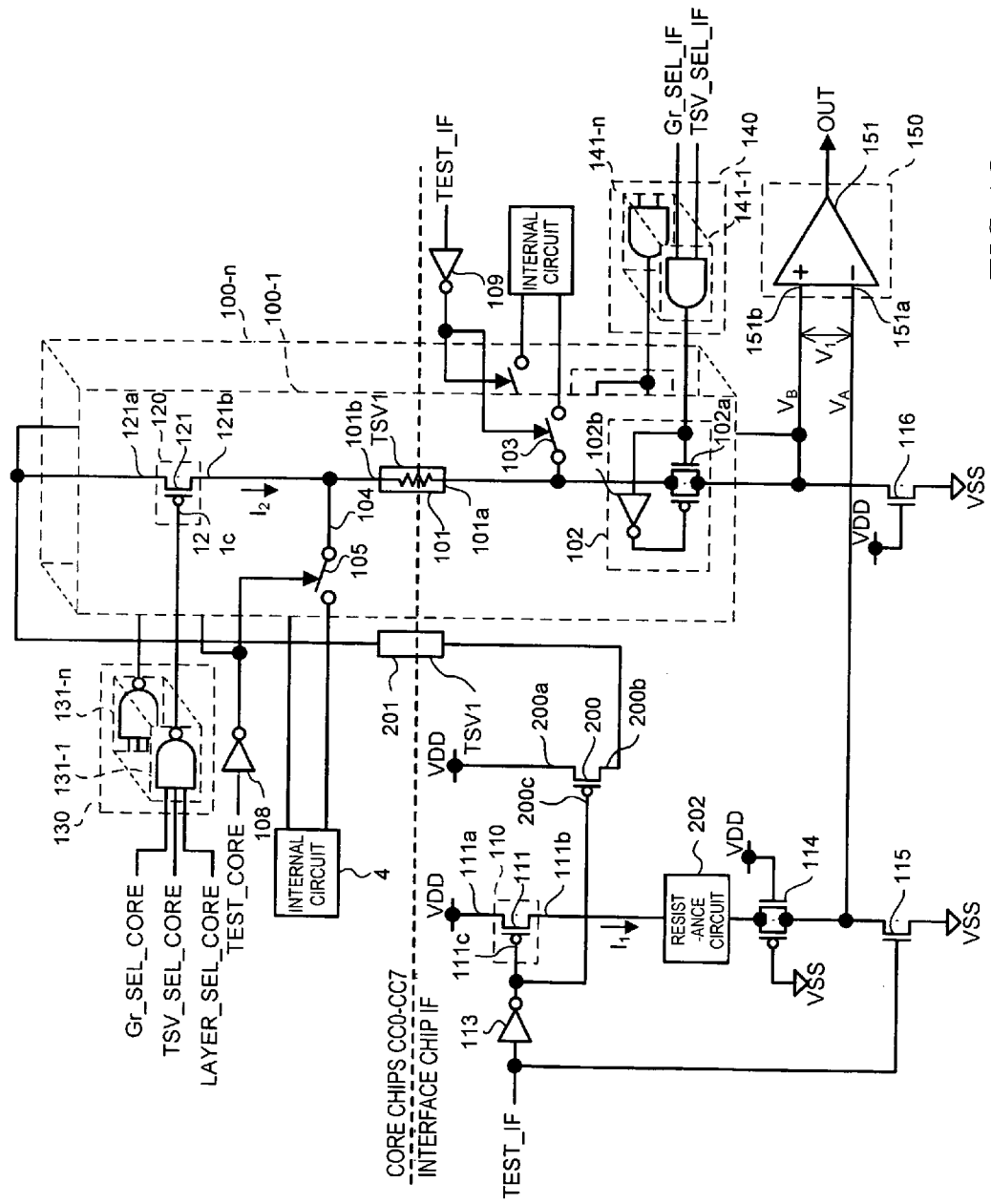
FIG. 13 is a circuit diagram showing a configuration of a test circuit of the semiconductor device according to a fifth embodiment of the present invention.

FIG. 13 is a circuit diagram showing a configuration of a test circuit of the semiconductor device 10 according to a fifth embodiment of the present invention. The semiconductor device 10 according to the fifth embodiment is a modified example of the semiconductor device 10 according to the first embodiment (FIG. 5) and different from the semiconductor device 10 according to the first embodiment in that the source 121a of the transistor 121 within the second circuit 120 is connected via the through silicon via TSV1 (an internal signal line 201: fourth internal signal line) to a power supply wiring in the interface chip IF and a resistance circuit 202 is provided.

In the semiconductor device 10 according to the fifth embodiment, although not shown in FIG. 13, connection methods of a wiring from each internal signal line 101 to the internal signal line 201 and from each transfer gate 102a to the non-inverting input terminal 151b of the comparator 151 are devised. Detailed descriptions thereof are given below with reference to FIG. 14. By such a devise, influence of a wiring resistance (a parasitic resistance) can be cancelled (corrected) using the resistance circuit 202. Differences from the semiconductor device 10 according to the first embodiment are mainly described below.

The semiconductor device 10 according to the fifth embodiment includes, as shown in FIG. 13, a P-channel MOS transistor 200 in the interface chip IF. A source 200a of the transistor 200 is connected to a power supply wiring to which the power supply potential VDD is supplied and a drain 200b is commonly connected via the internal signal line 201 that is constituted by the through silicon via TSV1 as shown in FIG.

2A to the source 121a of each transistor 121. The test signal TEST_IF is inputted via the NOT circuit 113 to a gate 200c of the transistor 200. The transistor 200 is thus switched on/off in cooperation with the transistor 111. As in the first embodiment, the current $I_2$ flows through the to-be-tested internal signal line 101.

The resistance circuit 202 is arranged between the transistor 111 and the transfer gate 114. The resistance circuit 202 includes, in addition to the reference resistance 112 shown in FIG. 5, a resistance (a correction resistance) for canceling a difference in wiring resistance (parasitic resistance) between a wiring through which the current flows (a wiring from the transistor 111 via the reference resistance 112 to the transfer gate 114) and a wiring through which the current $I_2$ flows (a wiring from the transistor 200 via the internal signal line 201, the transistor 121, and the internal signal line 101 to the transfer gate 102a).

Figure 14:
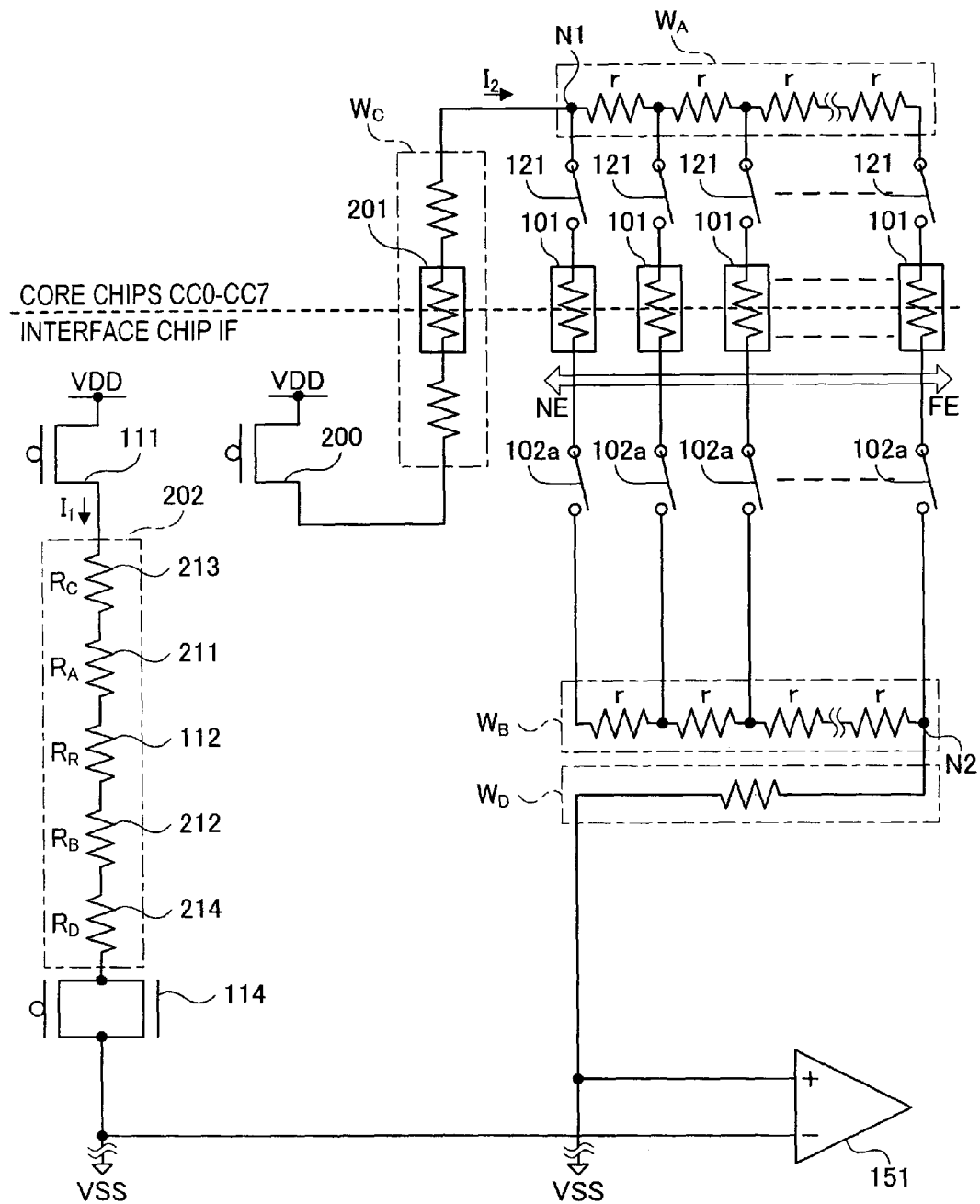
FIG. 14 shows a wiring resistance of the semiconductor device according to the fifth embodiment.

FIG. 14 shows a wiring resistance of the semiconductor device 10 according to the fifth embodiment. In FIG. 14, parts not necessary for explaining the wiring resistance are omitted.

As shown in FIG. 14, the respective internal signal lines 101 are connected in parallel to each other between a wiring $W_A$ (a first wiring) in a core chip and a wiring $W_B$ (a second wiring) in the interface chip IF. The wiring $W_A$ is wired so that resistances between adjacent internal signal lines 101 have a same value r. Similarly, the wiring $W_B$ is wired so that resistances between adjacent internal signal lines 101 have r.

The internal signal line 201 (fourth internal signal line) is connected to the wiring $W_A$ at one end (a node N1) of the wiring $W_A$. The node N1 is thus a near end (NE) when seen from the internal signal line 201. Meanwhile, the comparator 151 is connected to the wiring $W_B$ at an end (a node N2) of the wiring $W_B$ that corresponds to the other end of the wiring $W_A$. Therefore, the node N2 is a far end (FE) when seen from the internal signal line 201.

A wiring resistance between the transistor 200 and the node N1 (a wiring resistance of a wiring $W_C$ shown in FIG. 14) is common to all internal signal lines 101. Meanwhile, each wiring resistance between the node N1 and each internal signal line 101 (a wiring resistance of the wiring $W_A$) is different for each internal signal line 101. Specifically, the wiring resistance is reduced as approaching the near end when seen from the internal signal line 201 and is increased as approaching the far end when seen from the internal signal line 201.

Similarly, a wiring resistance between the comparator 151 and the node N2 (a wiring resistance of a wiring $W_D$ shown in FIG. 14) is common to all internal signal lines 101. Each wiring resistance between the node N2 and each internal signal line 101 (a wiring resistance of the wiring $W_B$) is different for each internal signal line 101. Specifically, the wiring resistance is increased as approaching the near end when seen from the internal signal line 201 and is reduced as approaching the far end when seen from the internal signal line 201.

Because the wiring from each internal signal line 101 to the internal signal line 201 and the wiring from each transfer gate 102a to the non-inverting input terminal 151b of the comparator 151 are connected as described above, wiring resistances for the respective internal signal lines 101 are equal to each other.

That is, when the number of the internal signal lines 101 is indicated by N, resistances of the wirings $W_A$ and $W_B$ of an nth internal signal line 101 from the near end are represented by (n−1)·r and (N−n)·r, respectively. When the resistances are added, (n−1)·r+(N−n)·=(N−1)r is obtained, which is a fixed value that does not depend on n. This means that the wiring resistance of the wirings $W_A$ and $W_B$ for each internal signal line 101 is a fixed value. The wiring resistance to which wiring resistances of the wirings $W_C$ and $W_D$ are added is the same for the internal signal lines 101.

In this manner, the wiring resistances corresponding to the respective internal signal lines 101 are equal to each other. In the fifth embodiment, a difference in wiring resistance between the wiring through which the current flows and the wiring through which the current $I_2$ flows can be cancelled by using the resistance circuit 202.

FIG. 14 also shows the resistance circuit 202 in detail. As shown in FIG. 14, the resistance circuit 202 is configured so that a resistance element 213 with a resistance value $R_C$, a resistance element 211 with a resistance value $R_A$, a reference resistance 112 with a resistance value a resistance element 212 with a resistance value $R_B$, and a resistance element 214 with a resistance value $R_D$ are serially connected to each other between the transistor 111 and the transfer gate 114. The arrangement of the resistances is not limited to that shown in FIG. 14. For example, their order can be changed appropriately or some resistances (such as the resistance elements 212 and 214) can be serially connected to each other between the transfer gate 114 and the comparator 151.

The resistance values $R_C$ and $R_D$ are set so as to be equal to the wiring resistance values of the wiring $W_C$ and the wiring $W_D$. In case the ON resistance of the transistor 200 cannot be ignored, the ON resistance may be added to the resistance values $R_C$. The resistance values $R_A$ and $R_B$ are set so that their sum $R_A+R_B$ is equal to the (N−1)r mentioned above, that is, the wiring resistance of the wirings $W_A$ and $W_B$ for each internal signal line 101. The wiring resistance of the wiring from the transistor 111 to the comparator 151 is equal to the wiring resistance of the wiring from the transistor 200 to the comparator 151. The difference in wiring resistance between the wiring through which the current $I_1$ flows and the wiring through which the current $I_2$ flows is thus cancelled.

As described above, according to the semiconductor device 10 of the fifth embodiment, it is possible to realize canceling of the influence of the wiring resistance.

Figure 15:
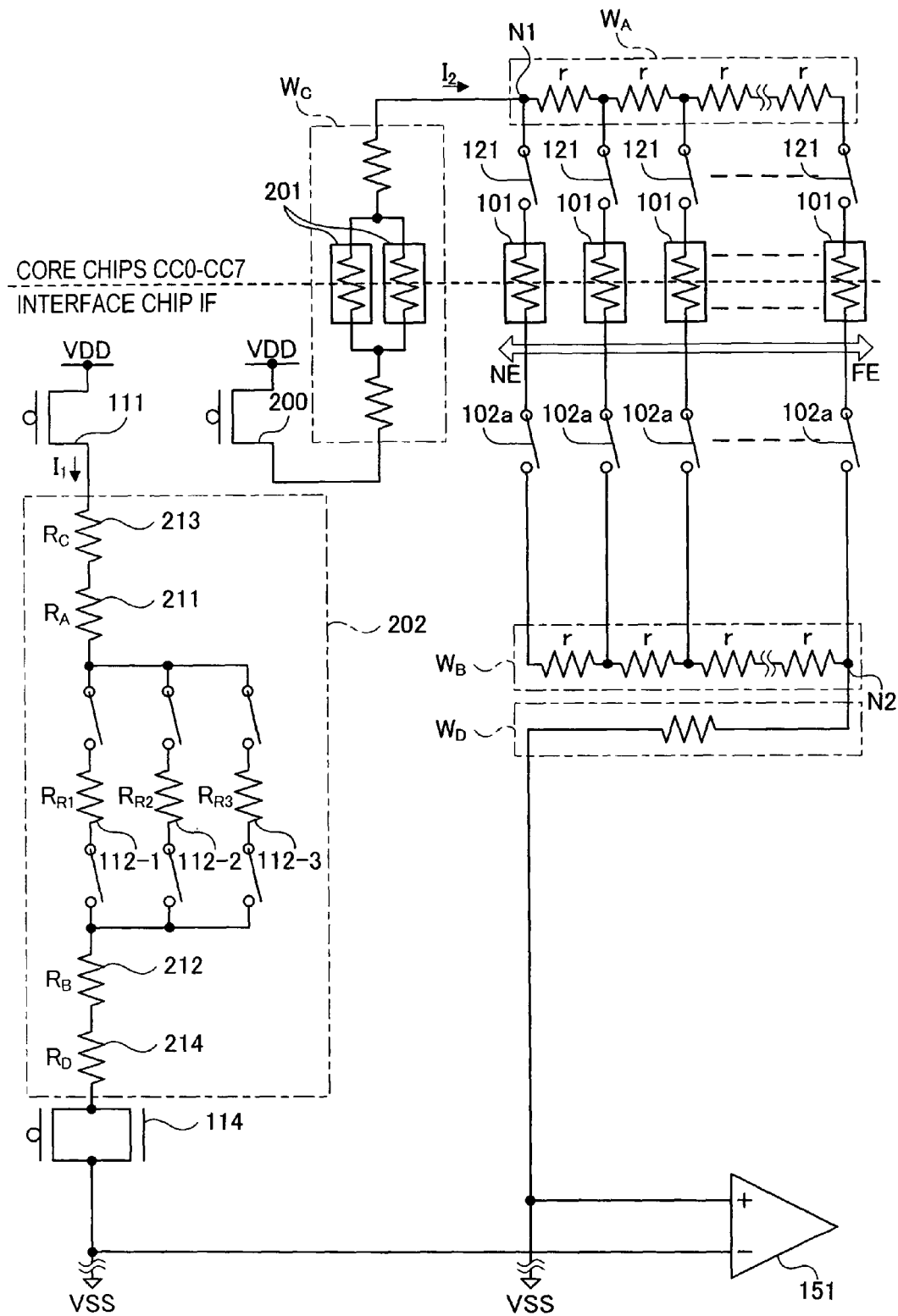
FIG. 15 is a circuit diagram showing a part of configuration of a test circuit of the semiconductor device according to a sixth embodiment of the present invention.

FIG. 15 is a circuit diagram showing a part of configuration of a test circuit of the semiconductor device 10 according to a sixth embodiment of the present invention. As is clear from a comparison between FIG. 15 to FIG. 14, the semiconductor device 10 according to the sixth embodiment is a modified example of the semiconductor device 10 according to the fifth embodiment. The sixth embodiment is different from the semiconductor device 10 according to the fifth embodiment in that, specifically, three reference resistances 112 are provided and two internal signal lines 201 are provided.

The three reference resistances 112-1 to 112-3 are connected in parallel to each other between the resistance element 213 and the resistance element 212. A switch element is provided at both ends of each reference resistance and only one of the three reference resistances 112-1 to 112-3 selected by an external instruction signal (not shown) is incorporated into the circuit.

Resistance values of the reference resistances 112-1 to 112-3 are $R_{R1}$, $R_{R2}$, and $R_{R3}$, respectively. These resistance values are different from each other. Specifically, $R_{R1}=50\Omega$, $R_{R2}=300\Omega$, and $R_{R3}=1$ k$\Omega$.

By providing these three reference resistances 112-1 to 112-3, the parasitic resistance value of the internal signal line 101 can be confirmed more finely. When only one reference resistance 112 is provided as shown in FIG. 14, only a relationship in magnitude between the parasitic resistance value of the to-be-tested internal signal line 101 and the resistance value $R_R$ of the reference resistance 112 can be obtained as the test result. According to the sixth embodiment, the test is performed while the reference resistances 112-1 to 112-3 are switched. The relationship in magnitude with each of the resistance values $R_{R1}$, $R_{R2}$, and $R_{R3}$ can be obtained. The parasitic resistance value of the internal signal line 101 can thus be confirmed more finely.

While a case of three reference resistances 112 has been described above, it is needless to mention that the number of reference resistances 112 that can be arranged is not limited to three.

In the semiconductor device 10 according to the sixth embodiment, two internal signal lines 201 are provided and connected in parallel to each other between the node N1 and the transistor 200. Even when any one of the internal signal lines 201 is defective or its parasitic resistance value is so large that the line cannot be used actually, the parasitic resistance value of the internal signal line 101 can be tested appropriately.

Figure 16A:
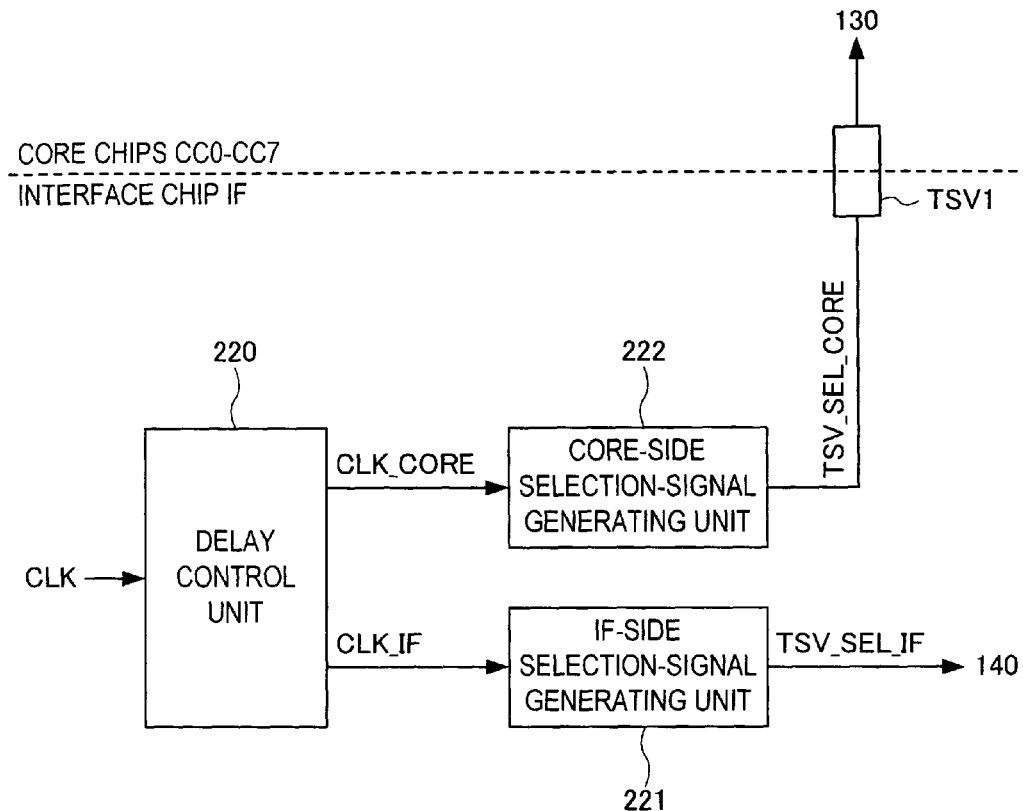
FIG. 16A is a functional block diagram of the semiconductor device according to a seventh embodiment of the present invention.

FIG. 16A is a functional block diagram of the semiconductor device 10 according to a seventh embodiment of the present invention. According to the semiconductor device 10 of the seventh embodiment, the internal signal line 101 through which the current $I_2$ flows (FIG. 5) is made to be different from the internal signal line 101 connected to the comparator 151 (FIG. 5) in the semiconductor device 10 according to the first embodiment, so that an electrical short-circuit can be detected between adjacent through silicon vias. Although not shown in FIG. 16A, the configuration of a test circuit of the semiconductor device 10 according to the seventh embodiment is the same as that of the semiconductor device 10 shown in FIG. 5. Differences from the semiconductor device 10 according to the first embodiment are mainly described below.

As shown in FIG. 16A, the semiconductor device 10 according to the seventh embodiment includes a delay control unit 220 (clock generation circuit), an IF-side selection-signal generating unit 221 (first selection-signal generation circuit), and a CORE-side selection-signal generating unit 222 (second selection-signal generation circuit) within the interface chip IF.

The delay control unit 220 generates an internal clock signal CLK_IF (first clock signal) and an internal clock signal CLK_CORE (second clock signal) that have a same clock period based on the clock signal CLK and outputs them to the IF-side selection-signal generating unit 221 and to the CORE-side selection-signal generating unit 222, respectively. The clock signal CLK can be an external clock signal CK or can be a clock signal generated within the semiconductor device 10 (an internal clock signal ICLK, for example).

The delay control unit 220 starts to generate the internal clock signals CLK_IF and CLK_CORE at the time when the test signal TEST_IF (FIG. 5) is activated (at the time when the internal signal line 101 begins to be tested), and ends generation of the internal clock signals at the time when the test signal TEST_IF is inactivated. A timing that the internal clock signal CLK_IF starts to be generated is shifted from a timing that the internal clock signal CLK_CORE starts to be generated by one clock. Details of this operation are described later.

The IF-side selection-signal generating unit 221 generates the to-be-tested through silicon via selection signal TSV_SEL_IF (first selection signal) in synchronization with the internal clock signal CLK_IF and outputs the resultant signal to the internal-signal-line selection receiving unit 140. The internal-signal-line selection receiving unit 140 that receives the to-be-tested through silicon via selection signal TSV_SE-L_IF connects the internal signal line 101 designated by the received signal to the non-inverting input terminal 151b of the comparator 151 using the switch circuit 102. Because details of this operation are the same as those described in the first embodiment, descriptions thereof are omitted.

The CORE-side selection-signal generating unit 222 generates the to-be-tested through silicon via selection signal TSV_SEL_CORE (second selection signal) in synchronization with the internal clock signal CLK_CORE and outputs the resultant signal to the chip-selection receiving unit 130 via the through silicon via TSV1. The chip-selection receiving unit 130 receiving the to-be-tested through silicon via selection signal TSV_SEL_CORE causes the current $I_2$ to flow through the internal signal line 101 designated by the received signal by using the second circuit 120. Because details of this operation are the same as those described in the first embodiment, descriptions thereof are omitted.

Figure 16B:
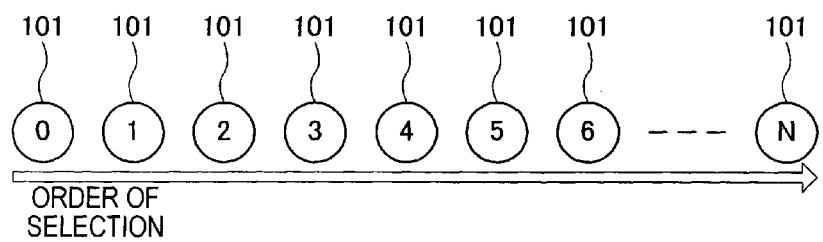
FIG. 16B shows a planar arrangement of the to-be-tested internal signal lines.

FIG. 16B shows a planar arrangement of the to-be-tested internal signal lines 101, that is, the through silicon vias TSV1 (FIG. 3) seen from a top surface of a core chip. Circles shown in FIG. 16B indicate the internal signal lines 101 and consecutive numbers are applied to the circles for convenience of description. The number of the to-be-tested internal signal lines 101 is N+1 from 0 to N. As shown in FIG. 16B, these N+1 internal signal lines 101 are arranged in line from the number 0 to the number N. Accordingly, two internal signal lines 101, that is, an n−1th one and an n+1th one are adjacent to an nth internal signal line 101 (except for a 0th line and an Nth line).

The IF-side selection-signal generating unit 221 selects the internal signal lines 101 one by one from the number 0 to the number N as a line to be tested and outputs the to-be-tested through silicon via selection signal TSV_SEL_IF for designating the selected internal signal line 101. The selection is performed in synchronization with the internal clock signal CLK_IF. Similarly, the CORE-side selection-signal generating unit 222 selects the internal signal lines 101 one by one from the number 0 to the number N as a line to be tested and outputs the to-be-tested through silicon via selection signal TSV_SEL_CORE for designating the selected internal signal line 101. The selection is performed in synchronization with the internal clock signal CLK_CORE.

Figure 17A:
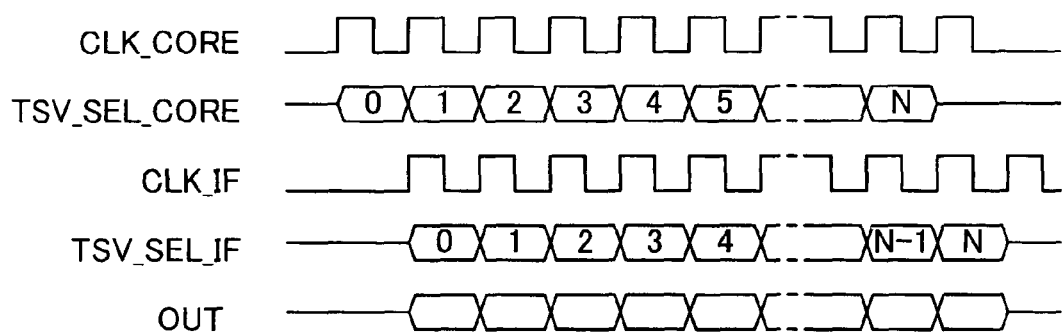
FIGS. 17A and 17B are timing diagrams of the internal clock signals CLK_IF and CLK_CORE and other signals.
Figure 17B:
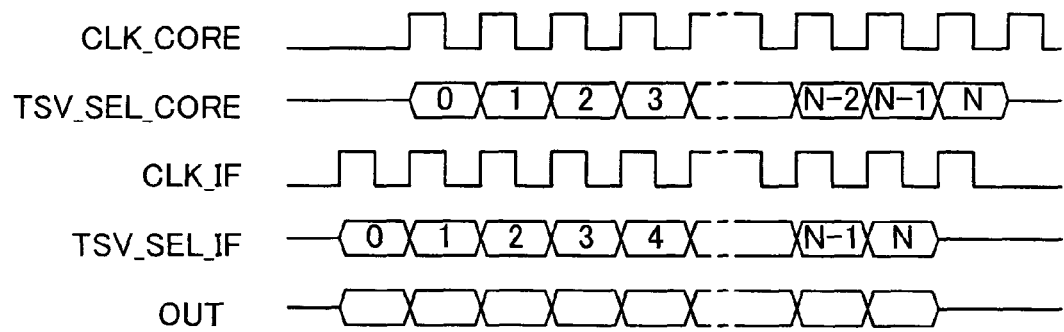

FIGS. 17A and 17B are timing diagrams of the internal clock signals CLK_IF and CLK_CORE and other signals. As shown in FIGS. 17A and 17B, the delay control unit 220 shifts the timing the internal clock signal CLK_IF starts to be generated from the timing the internal clock signal CLK_CORE starts to be generated by one clock. According to an example of FIG. 17A, the internal clock signal CLK_IF starts to be generated with a delay of one clock. In an example of FIG. 17B, the internal clock signal CLK_IF starts to be generated with an advance of one clock.

As described above, two internal signal lines 101 are adjacent to one to-be-tested internal signal line 101 except for the through silicon vias TSV1 arranged at both ends (the number 0 internal signal line 101 and the number N internal signal line 101). A short-circuit must be detected for these two internal signal lines 101. Accordingly, the delay control unit 220 preferably performs both the processing of FIG. 17A and the processing of FIG. 17B successively.

Because the delay control unit 220 shifts the timing the internal clock signal CLK_IF starts to be generated from the timing the CLK_CORE starts to be generated, the internal signal lines 101 designated by the to-be-tested through silicon via selection signals TSV_SEL_IF and TSV_SEL_CORE are shifted from each other by one clock as shown in FIGS. 17A and 17B. Consequently, when the nth internal signal line 101 is connected to the comparator 151 (FIG. 5), the current $I_2$ is made to flow through the adjacent n−1th or n+1th internal signal line 101. In a normal state, the current $I_2$ does not flow through the nth internal signal line 101 and thus the internal signal line voltage $V_B$ inputted to the non-inverting input terminal 151b of the comparator 151 should be smaller than the reference voltage $V_A$. However, when a short-circuit occurs between the internal signal lines 101, the current $I_2$ flows through the nth internal signal line 101 and the internal signal line voltage $V_B$ is larger than the reference voltage $V_A$ in most cases, although depending on the extent of the short-circuit (short-circuit resistance value).

Figure 18:
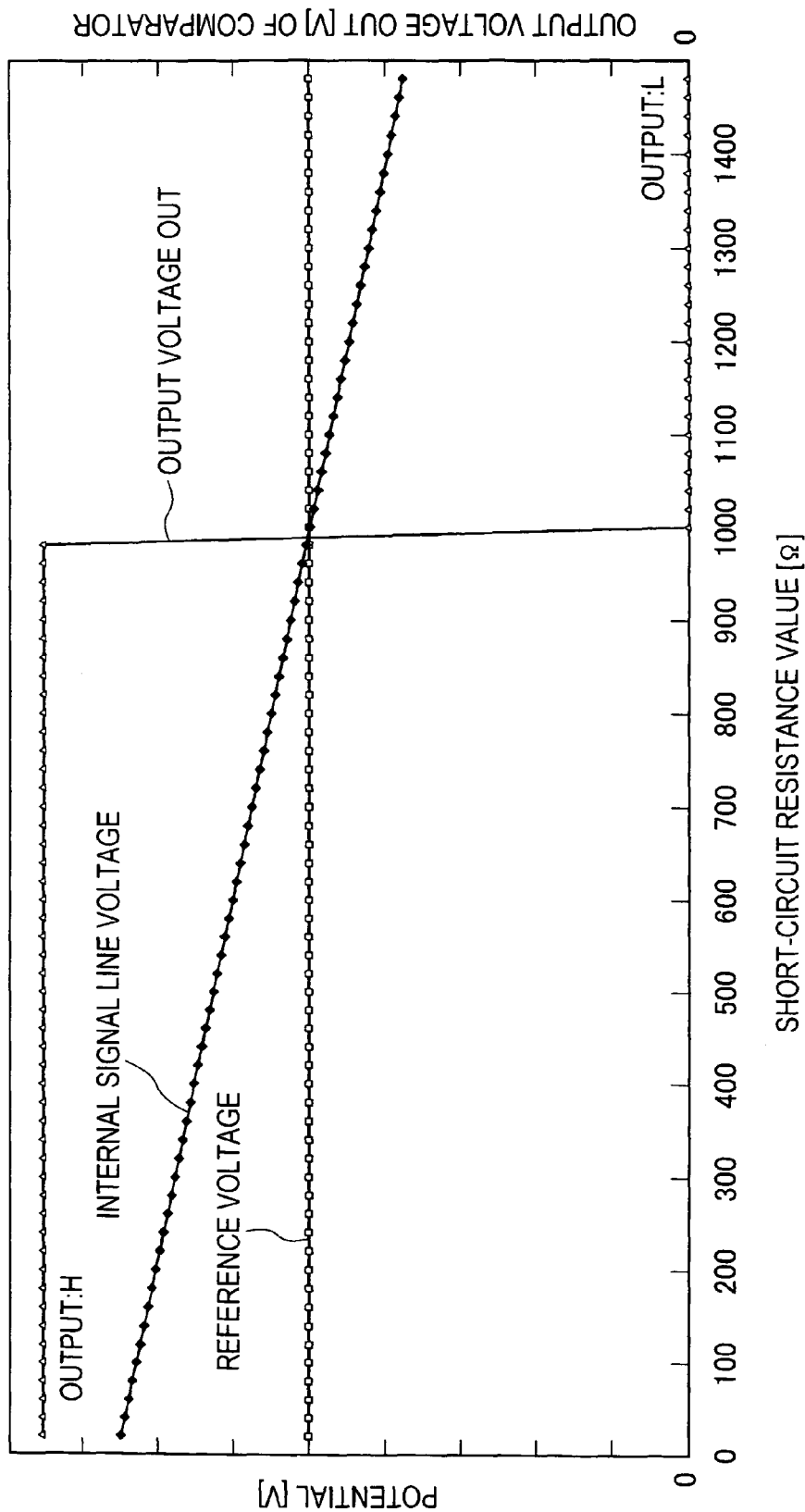
FIG. 18 shows a relationship between the short-circuit resistance value (Ω) indicated as a horizontal axis, a potential level (V) of the reference voltage $V_A$ and the internal signal line voltage $V_B$ indicated as a left vertical axis, and the output voltage OUT (V) of the comparator indicated as a right vertical axis.

FIG. 18 shows a relationship between the short-circuit resistance value (Ω) indicated as a horizontal axis, a potential level (V) of the reference voltage $V_A$ and the internal signal line voltage $V_B$ indicated as a left vertical axis, and the output voltage OUT (V) of the comparator 151 indicated as a right vertical axis. The short-circuit resistance value means a resistance value of a current path which can be formed between the internal signal line 101 through which the current $I_2$ flows and the to-be-tested internal signal line 101. Small short-circuit resistance value means that a short-circuit occurs between these internal signal lines 101.

As shown in FIG. 18, when the reference voltage $V_A$ is smaller than the internal signal line voltage $V_B$, that is, when the short-circuit resistance value is smaller than a predetermined value (a value when the reference voltage $V_A$ is equal to the internal signal line voltage $V_B$), the output voltage OUT has high potential. Meanwhile, when the reference voltage $V_A$ is larger than the internal signal line voltage $V_B$, that is, when the short-circuit resistance value is larger than the predetermined value, the output voltage OUT has low potential. The output voltage OUT with high potential means that the short-circuit resistance value is smaller than the predetermined value and an undesirable state occurs.

As described above, according to the semiconductor device 10 of the seventh embodiment, by referencing the output voltage OUT of the comparator 151, the magnitude of the short-circuit resistance value between the internal signal lines 101 can be determined. A short-circuit between adjacent through silicon vias can thus be detected.

Figure 19:
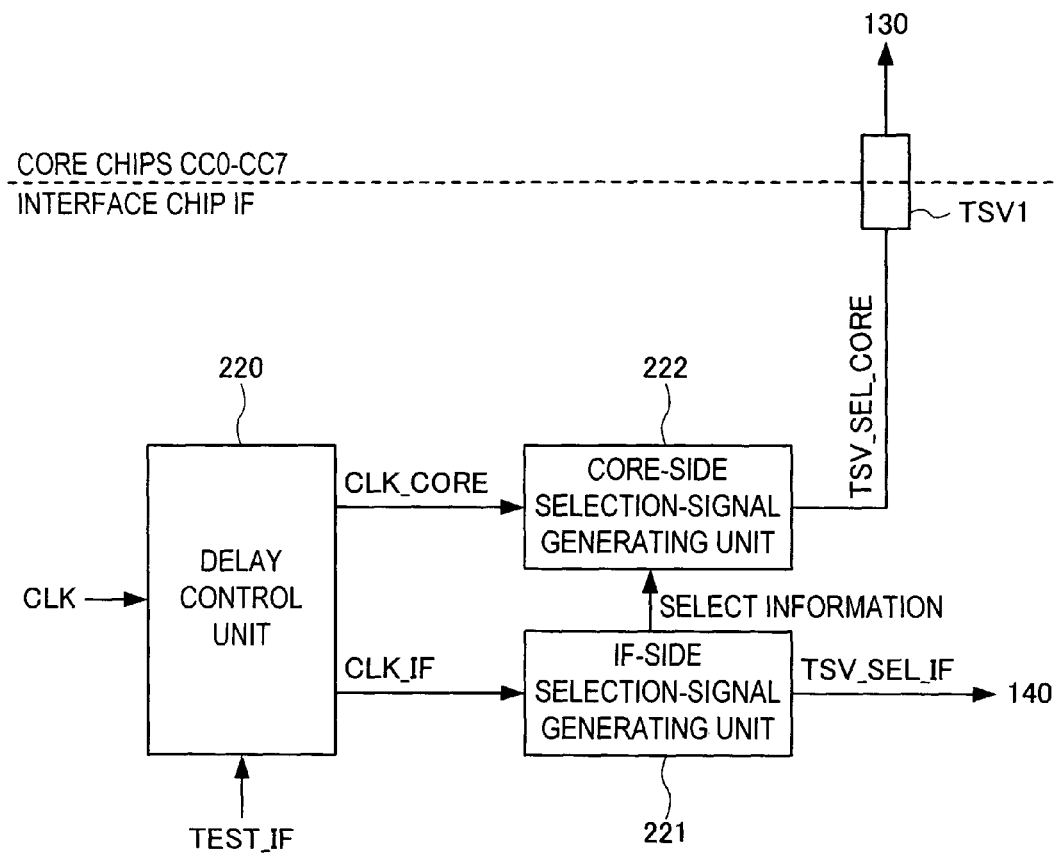
FIG. 19 is a functional block diagram of the semiconductor device according to an eighth embodiment of the present invention.

FIG. 19 is a functional block diagram of the semiconductor device 10 according to an eighth embodiment of the present invention. The semiconductor device 10 according to the eighth embodiment is different from the semiconductor device 10 according to the seventh embodiment in that the current $I_2$ is made to flow through all internal signal lines 101 adjacent to the to-be-tested internal signal line 101 at a time. Differences from the semiconductor device 10 according to the seventh embodiment are mainly described below.

In the semiconductor device 10 according to the eighth embodiment, as shown in FIG. 19, select information is transmitted from the IF-side selection-signal generating unit 221 to the CORE-side selection-signal generating unit 222. The select information indicates the to-be-tested internal signal line 101. The CORE-side selection-signal generating unit 222 generates and outputs a to-be-tested through silicon via selection signal TSV_SEL_CORE for designating all the internal signal lines 101 other than the internal signal line 101 indicated by the select information at the same time.

Figure 20A:
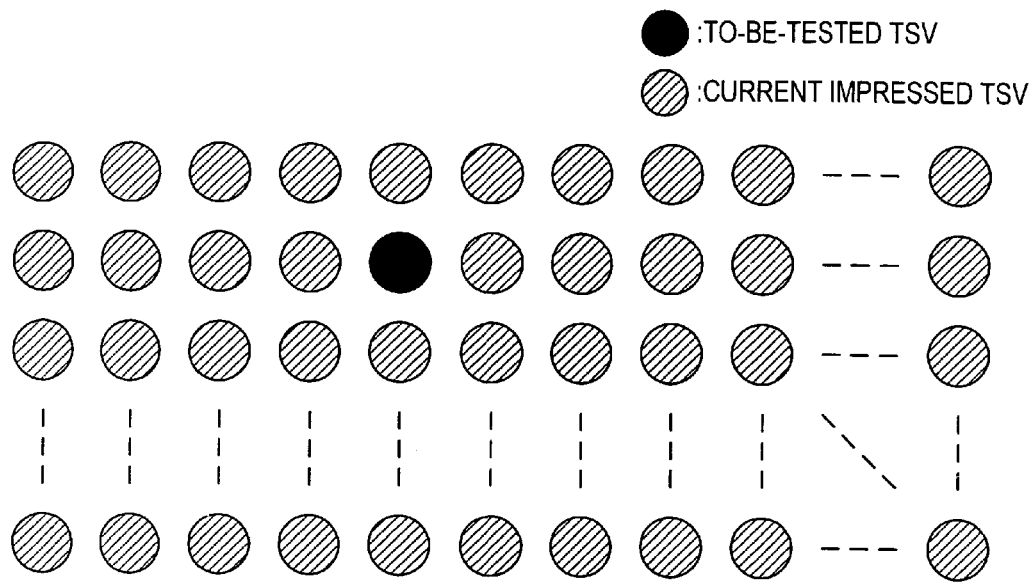
FIGS. 20A and 20B shows a planar arrangement of the to-be-tested internal signal lines.

FIG. 20A shows a planar arrangement of the to-be-tested internal signal lines 101, that is, the through silicon vias TSV1 (FIG. 3) seen from a top surface of a core chip. Also in FIG. 20A, circles indicate the respective internal signal lines 101 as in FIG. 16B. A large number of internal signal lines 101 are arranged in a matrix (in an X direction and a Y direction).

The IF-side selection-signal generating unit 221 selects the internal signal lines 101 arranged in a matrix one by one in a predetermined order and outputs the select information indicating the selected internal signal line 101 and the to-be-tested through silicon via selection signal TSV_SEL_IF for, designating the selected internal signal line 101. The selection is performed in synchronization with the internal clock signal CLK_IF.

The CORE-side selection-signal generating unit 222 selects all the internal signal lines 101 other than the to-be-tested internal signal line 101 (indicated by a sold circle in FIG. 20A) and outputs the to-be-tested through silicon via selection signal TSV_SEL_CORE for designating the selected internal signal line 101. As shown in FIG. 20A, the current $I_2$ flows through all the internal signal lines 101 other than the to-be-tested internal signal line 101. When the internal signal line 101 that is short-circuited with respect to the to-be-tested internal signal line 101, the reference voltage $V_A$ is smaller than the internal signal line voltage $V_B$ and the output voltage OUT has high potential as shown in the example of FIG. 18. Accordingly, a short-circuit between adjacent through silicon vias can be detected.

As described above, according to the semiconductor device 10 of the eighth embodiment, as in the seventh embodiment, a short-circuit between adjacent through silicon vias can be detected. The test is performed for the same time as the number of the internal signal lines 101. The test can thus be performed efficiently in a short time.

While the CORE-side selection-signal generating unit 222 flows the current $I_2$ in all the internal signal lines 101 other than the to-be-tested internal signal line 101 according to the eighth embodiment, the current $I_2$ does not need to be flown in all the internal signal lines 101 when the internal signal lines 101 are grouped, which is described in detail.

Figure 20B:
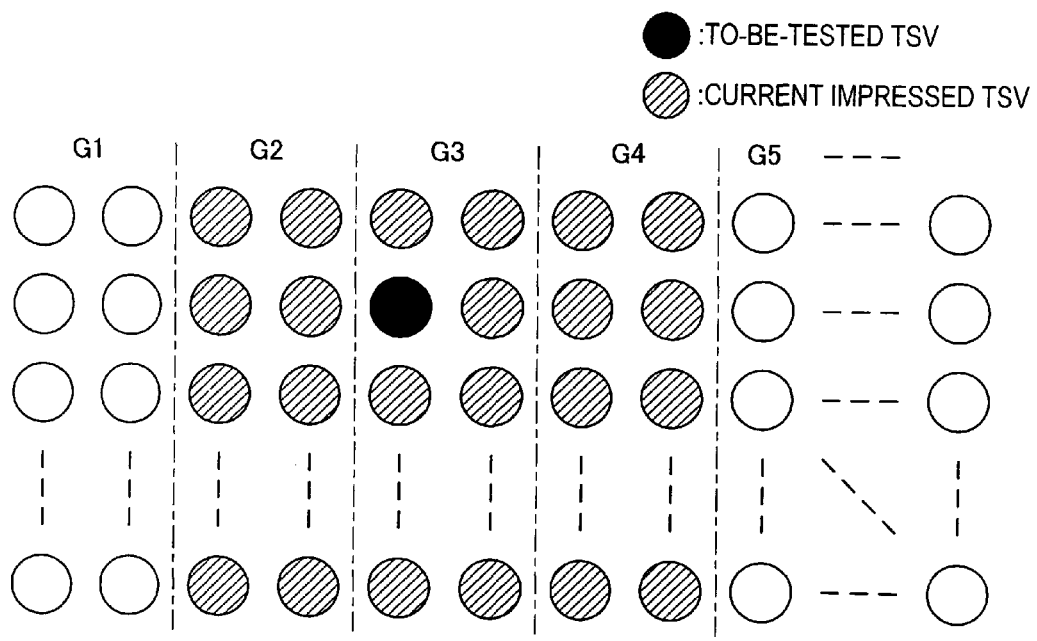

FIG. 20B shows a planar arrangement of the to-be-tested internal signal lines 101, that is, the through silicon vias TSV1 (FIG. 3) seen from the top surface of a core chip. Also in FIG. 20B, circles indicate the respective internal signal lines 101 as in FIG. 20A. A large number of internal signal lines 101 are arranged in a matrix.

In this modified example, the CORE-side selection-signal generating unit 222 stores grouped internal signal lines 101. Reference characters G1, G2, G3 . . . shown in FIG. 20B indicate consecutive numbers of the stored groups. The CORE-side selection-signal generating unit 222 also stores one or a plurality of other groups adjacent to the corresponding group for each group.

When the select information is inputted from the IF-side selection-signal generating unit 221, the CORE-side selection-signal generating unit 222 first determines a group to which the internal signal line 101 indicated by the select information belongs. The unit 222 selects all other internal signal lines 101 belonging to the determined group and all internal signal lines 101 belonging to all groups adjacent to the determined group, and outputs the to-be-tested through silicon via selection signal TSV_SEL_IF for designating the selected internal signal line 101.

The above processing enables a short-circuit between adjacent through silicon vias to be detected even when the current $I_2$ is not made to flow through all the internal signal lines 101 other than the to-be-tested internal signal line 101. Consumption power at the time of test can thus be reduced.

The semiconductor device 10 according to the eighth embodiment shown in FIG. 19 can set a plurality of the to-be-tested internal signal lines 101 at the same time. For example, the to-be-tested internal signal lines 101 can be set like a checkerboard in FIGS. 20A and 20B. It suffices that the checker pattern includes at least one or more internal signal lines 101 that are not tested. The test pattern can be stripe patterns in an X direction or a Y direction. Also in this case, it suffices that the to-be-tested internal signal lines 101 include at least one or more internal signal lines 101 that are not tested. Further, the checker pattern or the stripe pattern can be provided for each of the groups shown in FIG. 20B.

Figure 21:
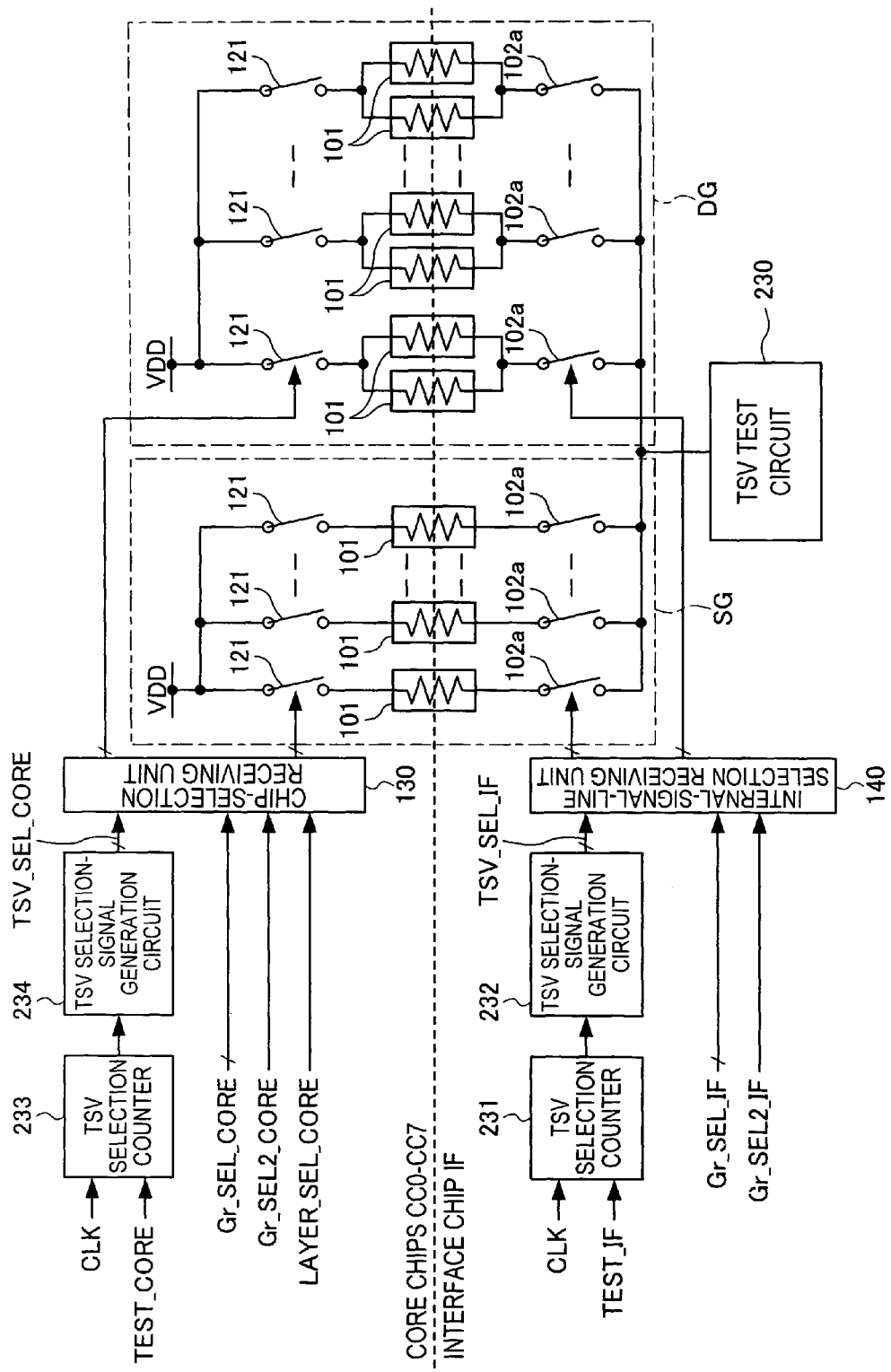
FIG. 21 shows apart of a configuration of a test circuit of the semiconductor device according to a ninth embodiment of the present invention.

FIG. 21 shows a part of a configuration of a test circuit of the semiconductor device 10 according to a ninth embodiment of the present invention. The semiconductor device 10 according to the ninth embodiment is a modified example of the semiconductor device 10 according to the first embodiment (FIG. 5) and is different from the semiconductor device 10 according to the first embodiment in that some of the to-be-tested internal signal lines 101 are constituted by a plurality of the through silicon vias TSV1 (the through silicon vias TSV shown in FIG. 2A) connected in parallel to each other.

The reason why the internal signal line 101 is constituted by a plurality of the through silicon vias TSV1 is to relieve defective through silicon vias. Because the through silicon vias TSV1 are connected in parallel, even when some of them are defective (non-conductive or have high resistance), the remaining through silicon vias TSV1 that are not defective can input/output signals. Such a relief unit is called "parallel connected relief unit". Hereinafter, an internal signal line group that is constituted by internal signal lines 101 relieved by the "parallel connected relief unit" is called an internal signal line group DG (first internal signal line group) as shown in FIG. 21.

On the other hand, the to-be-tested internal signal line 101 explained so far is constituted by a single through silicon via TSV1 and is relieved by a redundant process performed by the TSV relief circuit 73 (FIG. 4), that is, by a process of replacing a defective internal signal line 101 with an auxiliary one. Such a relief unit is called "auxiliary TSV replacement relief unit". Hereinafter, an internal signal line group that is constituted by internal signal lines 101 relieved by the "auxiliary TSV replacement relief unit" is called an internal signal line group SG (second internal signal line group) as shown in FIG. 21.

The internal signal line 101 belonging to the internal signal line group DG is usually used for inputting/outputting highly important signals including special signals such as a signal that needs to be transmitted at high speed and a reset signal and test signals used after assembling laminated layers. The internal signal line 201 shown in FIG. 15 is one of these internal signal lines.

Basically, any auxiliary internal signal line 101 is not prepared for the internal signal line 101 belonging to the internal signal line group DG. Therefore, in conventional techniques, the internal signal line 101 is not tested as described in the first to eighth embodiments. When the internal signal line 101 belonging to the internal signal line group DG cannot be tested at all, it is difficult to find out causes when the semiconductor device 10 operates improperly. The semiconductor device 10 according to the ninth embodiment has been developed in view of such problems and its object is to enable the internal signal line 101 belonging to the internal signal line group DG to be tested. Specific descriptions thereof are given below.

As shown in FIG. 21, the semiconductor device 10 according to the ninth embodiment includes a TSV test circuit 230, a TSV selection counter 231, and a TSV selection-signal generation circuit 232, and the internal-signal-line selection receiving unit 140 shown in FIG. 5 within the interface chip IF. A TSV selection counter 233, a TSV selection-signal generation circuit 234, and the chip-selection receiving unit 130 shown in FIG. 5 are provided within each of the core chips CC0 to CC7.

A configuration in the core chip is described first. A core chip side end of each internal signal line 101 is commonly connected via the transistor 121 shown in FIG. 5 (indicated as a simple switch in FIG. 21 for simplicity) to a power supply wiring to which the power supply potential VDD is supplied.

The clock signal CLK and the test signal TEST_CORE are inputted to the TSV selection counter 233. The TSV selection counter 233 performs a count operation according to the clock signal CLK when the test signal TEST_CORE is activated (that is, when the internal signal line 101 is tested). That is, the number of clocks of the clock signal CLK is counted from when the test signal TEST_CORE is activated to when the test signal TEST_CORE is inactivated and a signal indicating a count value is outputted.

The TSV selection-signal generation circuit 234 generates the to-be-tested through silicon via selection signal TSV_SEL_CORE according to the output signal (the count value) of the TSV selection counter 233.

In the ninth embodiment, m+1 internal signal lines 101 are grouped for each internal signal line group and the test is performed on the group basis. In other words, the number of internal signal lines 101 to be tested at a time (the number of internal signal lines 101 tested while the test signal TEST_CORE continues to be activated) is m+1 at a maximum. In this case the to-be-tested through silicon via selection signal TSV_SEL_CORE generated by the TSV selection-signal generation circuit 234 is a parallel signal for an m+1 series. Signals constituting the parallel signal are distinguished from each other by attaching symbols <0> to <m> to the end of a reference character indicating a signal.

In the ninth embodiment, when a signal line corresponds to a $k_2$th internal signal line 101 ($k_2$ is an integer of 0 to m) belonging to a $k_1$th group ($k_1$ is an integer of 0 or more) in the internal signal line group SG, such a signal line is indicated by attaching <S-$k_1$-$k_2$> to the end of the reference character, like an internal signal line 101<S-$k_1$-$k_2$>. Similarly, when a signal line corresponds to a $k_4$th internal signal line 101 ($k_4$ is an integer of 0 to m) belonging to a $k_3$th group ($k_3$ is an integer of 0 or more) in the internal signal line group DG, such a signal line is indicated by attaching <D-$k_3$-$k_4$> to the end of the reference character.

The TSV selection-signal generation circuit 234 activates a to-be-tested through silicon via selection signal TSV_SEL_CORE<0> (makes it high) and inactivates other to-be-tested through silicon via selection signals TSV_SEL_CORE (makes them low) when the count value is 1. The TSV selection-signal generation circuit 234 activates a to-be-tested through silicon via selection signal TSV_SEL_CORE<1> (makes it high) and inactivates other to-be-tested through silicon via selection signals TSV_SEL_CORE (makes them low) when the count value is 2. Similarly, such an activation process is performed successively to a to-be-tested through silicon via selection signal TSV_SEL_CORE<m>.

The generated to-be-tested through silicon via selection signals TSV_SEL_CORE<0> to <m> are inputted to the chip-selection receiving unit 130. The chip-selection receiving unit 130 has an output terminal for each internal signal line 101 and each output terminal is connected to a gate of a corresponding transistor 121. The chip-selection receiving unit 130 regenerates the to-be-tested through silicon via selection signals TSV_SEL_CORE for the respective internal signal lines 101 using the inputted to-be-tested through silicon via selection signals TSV_SEL_CORE<0> to <m> and outputs resultant signals from the corresponding output terminals to the respective transistors 121.

A TSV group selection signal Gr_SEL2_CORE for designating one of the internal signal line groups SG and DG is also inputted to the chip-selection receiving unit 130. This TSV group selection signal Gr_SEL2_CORE is used for designating an internal signal line group to be tested from outside of the semiconductor device 10. Specifically, this TSV group selection signal Gr_SEL2_CORE is activated (becomes high) when the internal signal line 101 belonging to the internal signal line group DG is tested and inactivated (becomes low) when the internal signal line 101 belonging to the internal signal line group SG is tested.

The to-be-tested group selection signal Gr_SEL_CORE and the top layer selection signal LAYER_SEL_CORE described in the first embodiment are also inputted to the chip-selection receiving unit 130.

Among these signals, the to-be-tested group selection signal Gr_SEL_CORE is a parallel signal provided for the number of groups (larger one among the numbers of groups of the internal signal line groups SG and DG) and used for designating a group to be tested from outside of the semiconductor device 10. Signals constituting the parallel signal are distinguished from each other by attaching a symbol such as <0> to the end of a reference character indicating a signal. For example, when the group to be tested is a 0th group, a to-be-tested group selection signal Gr_SEL_CORE<0> is activated (becomes high) and other to-be-tested group selection signal Gr_SEL_CORE<1> is inactivated (becomes low).

The chip-selection receiving unit 130 selects one internal signal line 101 according to other three types of input signals when the core chip is selected by the top layer selection signal LAYER_SEL_CORE. Specifically, among internal signal lines 101 in an internal signal group designated by the TSV group selection signal Gr_SEL2_CORE, the internal signal line 101 in a group designated by the to-be-tested group selection signal Gr_SEL_CORE and designated by the to-be-tested through silicon via selection signals TSV_SEL_CORE<0> to <m> is selected. The to-be-tested through silicon via selection signal TSV_SEL_CORE corresponding to the selected internal signal line 101 is activated and other signals are inactivated. When the corresponding core chip is not selected by the top layer selection signal LAYER_SEL_CORE, all to-be-tested through silicon via selection signals TSV_SEL_CORE are inactivated.

Figure 22:
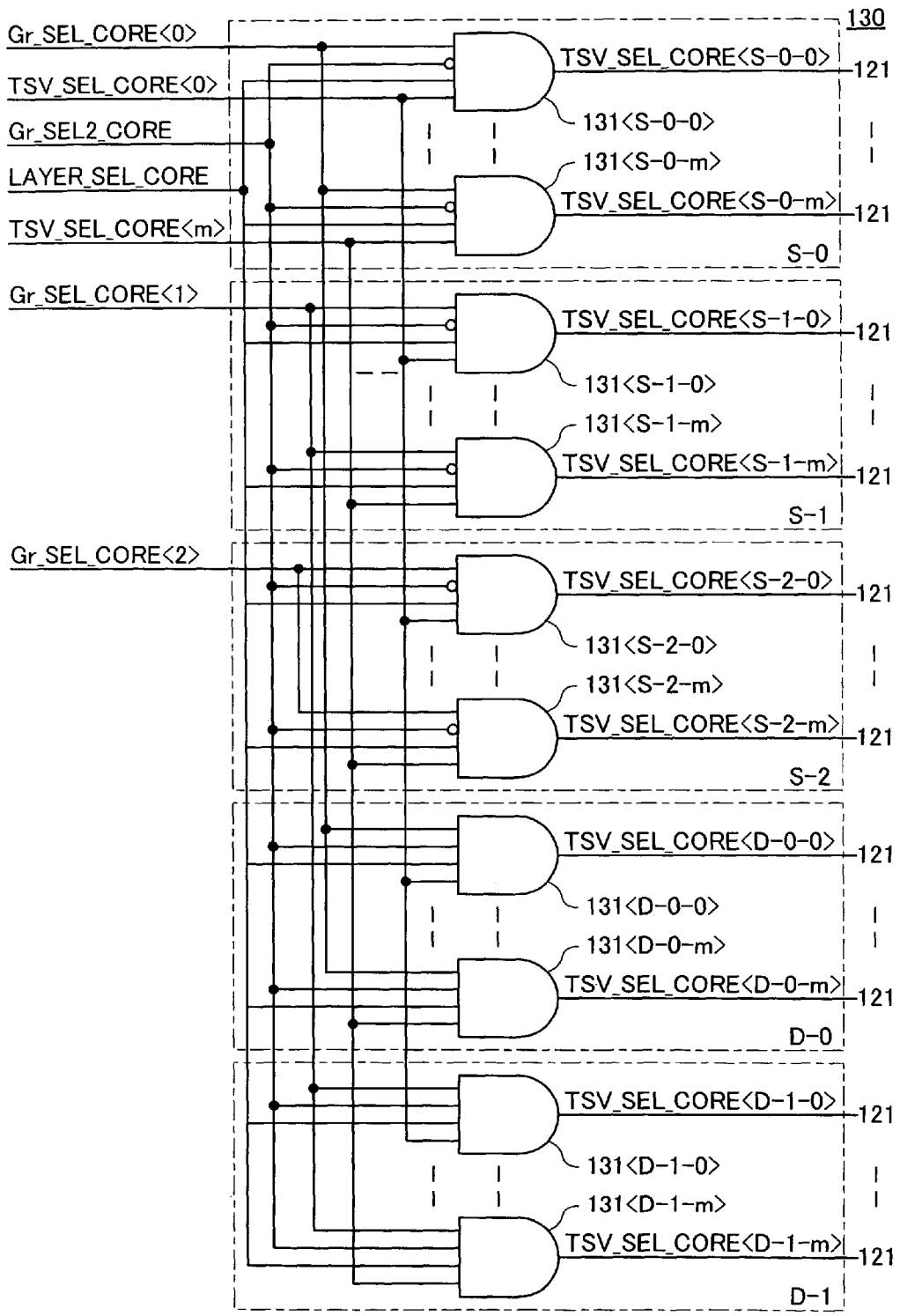
FIG. 22 shows an internal configuration of the chip-selection receiving unit.

FIG. 22 shows an internal configuration of the chip-selection receiving unit 130. While maximum values of $k_1$ and $k_3$ are 2 and 1, respectively in FIG. 13 for simplicity, these maximum values of $k_1$ and $k_3$ are not limited to 2 and 1.

As shown in FIG. 22, the chip-selection receiving unit 130 has the AND circuit 131 for each internal signal line 101. An output of each AND circuit 131 is the to-be-tested through silicon via selection signal TSV_SEL_CORE described above.

An inverted signal of the TSV group selection signal Gr_SE2_CORE, a to-be-tested group selection signal Gr_SEL_CORE<$k_1$> corresponding to the $k_1$th group, a to-be-tested through silicon via selection signal TSV_SEL_CORE<$k_2$> corresponding to the $k_2$th internal signal line 101, and the top layer selection signal LAYER_SEL_CORE are inputted to an AND circuit 131<S-$k_1$-$k_2$> for the internal signal line 101<S-$k_1$-$k_2$>. The AND circuit 131<S-$k_1$-$k_2$> activates an output signal TSV_SEL_CORE<S-$k_1$-$k_2$> when all these signals are high. The AND circuit 131<S-$k_1$-$k_2$> thus activates the output signal TSV_SEL_CORE<S-$k_1$-$k_2$> when the $k_1$th group belonging to the internal signal line group SG is selected as a group to be tested, the to-be-tested through silicon via selection signal TSV_SEL_CORE<$k_2$> corresponding to the $k_2$th internal signal line 101 in that group is activated, and the corresponding core chip is on the top layer of layers to be tested.

When the output signal TSV_SEL_CORE<S-$k_1$-$k_2$> is activated, the transistor 121 corresponding to the internal signal line 101<S-$k_1$-$k_2$> is switched on and the supply voltage VDD is supplied to a core chip side end of that internal signal line 101. Other internal signal lines 101 are disconnected from the power supply wiring to which the supply voltage VDD is supplied.

Similarly, the TSV group selection signal Gr_SEL2_CORE, a to-be-tested group selection signal Gr_SEL_CORE<$k_3$> corresponding to the $k_3$th group, and a to-be-tested through silicon via selection signal TSV_SEL_CORE<$k_4$> corresponding to the $k_4$th internal signal line 101 are inputted to an AND circuit 131<D-$k_3$-$k_4$> for an internal signal line 101<D-$k_3$-$k_4$>. The AND circuit 131<D-$k_3$-$k_4$> activates an output signal TSV_SEL_CORE<D-$k_3$-$k_4$> when all these signals are high. The AND circuit 131<D-$k_3$-$k_4$> activates the output signal TSV_SEL_CORE<D-$k_3$-$k_4$> when the $k_3$th group belonging to the internal signal line group DG is selected as a group to be tested, the to-be-tested through silicon via selection signal TSV_SEL_CORE<$k_4$> corresponding to the $k_4$th internal signal line 101 in that group is activated, and the corresponding core chip is on the top layer of layers to be tested.

When the output signal TSV_SEL_$_{CORE<D-k3}$-$k_4$> is thus activated, the transistor 121 corresponding to the internal signal line 101<D-$k_3$-$k_4$> is switched on and the supply voltage VDD is supplied to the core chip side end of the corresponding internal signal line 101. Other internal signal lines 101 are disconnected from the power supply wiring to which the supply voltage VDD is supplied.

In the core chip side, only one to-be-tested internal signal line 101 is connected to the power supply wiring to which the supply voltage VDD is supplied in the core chip that is the top layer of layers to be test and other internal signal lines 101 are disconnected from the power supply wiring to which the supply voltage VDD is supplied by the processing of the chip-selection receiving unit 130. A drain current of the transistor 121 is outputted the internal signal line 101 connected to the power supply wiring.

Figure 23:
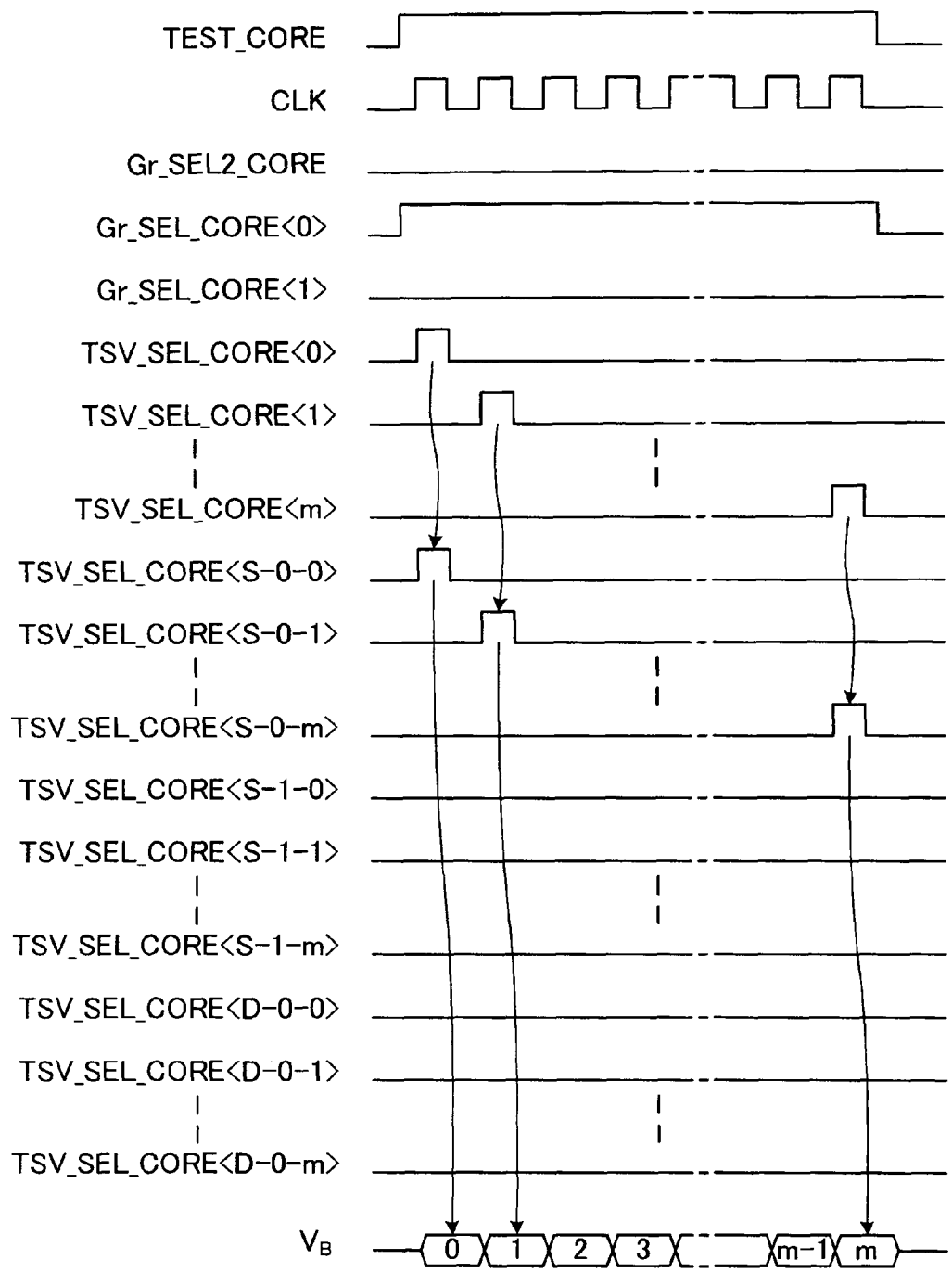
FIGS. 23 and 24 are timing diagrams of signals for explaining the above processing in a time series.
Figure 24:
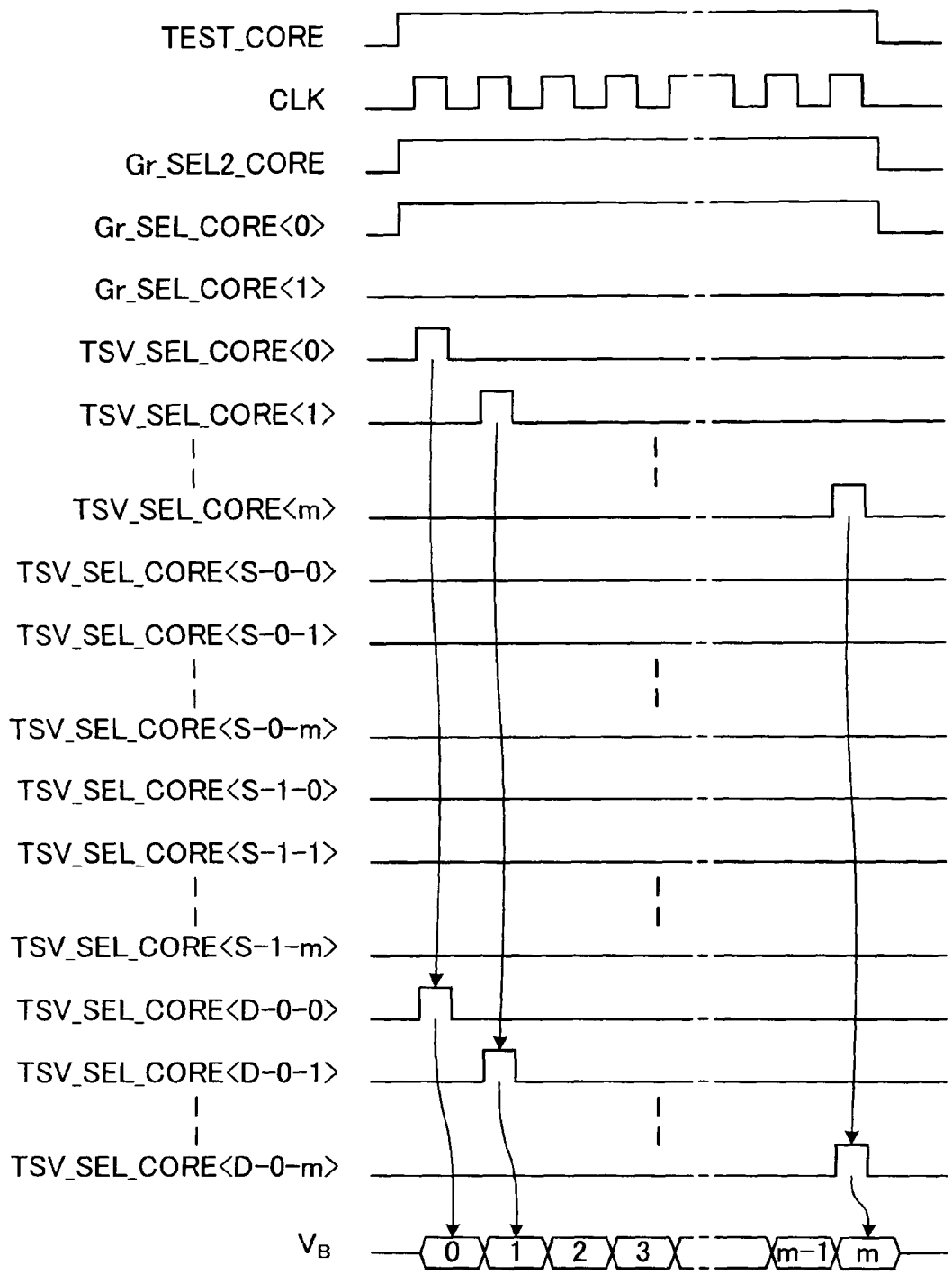

FIGS. 23 and 24 are timing diagrams of signals for explaining the above processing in a time series. In FIGS. 23 and 24, the top layer selection signal LAYER_SEL_CORE is omitted.

An example of FIG. 23 indicates a case that the TSV group selection signal Gr_SEL2_CORE is inactivated (low) and the to-be-tested group selection signal Gr_SEL_CORE<0> is activated (high). In this case, m+1 internal signal lines 101<S-0-0> to <S-0-m> belonging to the 0th group in the internal signal line group SG are successively selected as a line to be tested.

As shown in FIG. 23, when the test signal TEST_CORE is activated, the to-be-tested through silicon via selection signals TSV_SEL_CORE<0> to <m> are successively activated according to the clock signal CLK. The to-be-tested through silicon via selection signals TSV_SEL_CORE<S-0-0> to <S-0-m> are then successively activated. The supply voltage VDD is supplied to the internal signal line 101 that the to-be-tested through silicon via selection signal TSV_SEL_CORE is activated and the drain current of the transistor 121 flows through that signal line.

The processing within the interface chip IF is described later. While a current flows through the internal signal line

101, the interface chip IF side end of that internal signal line 101 is connected to the TSV test circuit 230. As shown in FIG. 23, parasitic resistance values of the internal signal lines 101<S-0-0> to <S-0-m> are reflected successively to the input voltage (the internal signal line voltage $V_B$) of the second input terminal 151b of the determination circuit 150 (FIG. 5), and thus these internal signal line 101 can be tested.

An example of FIG. 24 indicates a case that the TSV group selection signal Gr_SEL2_CORE is activated (high) and the to-be-tested group selection signal Gr_SEL_CORE<0> is activated (high). In this case, m+1 internal signal lines 101 belonging to the 0th group in the internal signal line group DG are successively selected as a line to be tested.

While redundant descriptions thereof are omitted, the to-be-tested through silicon via selection signals TSV_SEL_CORE<D-0-0> to <D-0-m> are successively activated in this example. Parasitic resistance values of the internal signal lines 101<D-0-0> to <D-0-m> are successively reflected to the input voltage (the internal signal line voltage $V_B$) of the second input terminal 151b of the determination circuit 150 (FIG. 5) as shown in FIG. 24 and thus these internal signal lines 101 can be tested.

Returning to FIG. 21, the configuration within the interface chip IF is described. The TSV test circuit 230 is for determining the magnitude of parasitic resistance value of each internal signal line 101. Specifically, various circuits for generating the reference voltage $V_A$ including the first circuit 110 shown in FIG. 5 and the determination circuit 150 for comparing the reference voltage $V_A$ to the internal signal line voltage $V_B$ correspond to the TSV test circuit 230.

The interface chip IF side end of each internal signal line 101 is connected via the transfer gate 102a also shown in FIG. 5 (indicated as a simple switch in FIG. 21 for simplicity) to the TSV test circuit 230. Because the specific configuration of the TSV test circuit 230 is the same as that shown in FIG. 5, detailed descriptions thereof are omitted.

The clock signal CLK and the test signal TEST_IF are inputted to the TSV selection counter 231. The TSV selection counter 231 performs the count operation according to the clock signal CLK when the test signal TEST_IF is activated (that is, when the internal signal line 101 is tested) like the TSV selection counter 233 described above. Because the specific processing is the same as that of the TSV selection counter 233, detailed descriptions thereof are omitted.

The TSV selection-signal generation circuit 232 generates the to-be-tested through silicon via selection signal TSV_SEL_IF according to the output signal (the count value) of the TSV selection counter 231 as in the TSV selection-signal generation circuit 234 described above. The to-be-tested through silicon via selection signal TSV_SEL_IF is also a parallel signal for m+1 series like the to-be-tested through silicon via selection signal TSV_SEL_CORE. Because the specific processing of the TSV selection-signal generation circuit 232 is the same as that of the TSV selection-signal generation circuit 234, detailed descriptions thereof are omitted.

To-be-tested through silicon via selection signals TSV_SEL_IF<0> to <m> are inputted to the internal-signal-line selection receiving unit 140. The internal-signal-line selection receiving unit 140 has an output terminal for each internal signal line 101 and each output terminal is connected to the corresponding transfer gate 102a. The internal-signal-line selection receiving unit 140 regenerates the to-be-tested through silicon via selection signals TSV_SEL_IF for the respective internal signal lines 101 from the inputted to-be-tested through silicon via selection signals TSV_SEL_IF<0> to <m> and outputs resultant signals from the corresponding output terminals to the respective transfer gate 102a.

A TSV group selection signal Gr_SEL2_IF and the to-be-tested group selection signal Gr_SEL_IF are also inputted to the internal-signal-line selection receiving unit 140. These are the same as the TSV group selection signal Gr_SEL2_CORE and the to-be-tested group selection signal Gr_SEL_CORE, respectively.

The internal-signal-line selection receiving unit 140 selects one internal signal line 101 according to three types of input signals. The to-be-tested through silicon via selection signal TSV_SEL_IF corresponding to the selected internal signal line 101 is activated and other signals are inactivated. Specifically, among the internal signal lines 101 in an internal signal group designated by the TSV group selection signal Gr_SEL2_IF, the internal signal line 101 in a group designated by the to-be-tested group selection signal Gr_SEL_IF and designated by the to-be-tested through silicon via selection signals TSV_SEL_IF<0> to <m> is selected. The to-be-tested through silicon via selection signal TSV_SEL_IF corresponding to the selected internal signal line 101 is activated and other signals are inactivated.

Because the configuration of the internal-signal-line selection receiving unit 140 and the detailed processing are the same as those of the chip-selection receiving unit 130, descriptions thereof are omitted. When an output signal TSV_SEL_IF<S-$k_1$-$k_2$> of the internal-signal-line selection receiving unit 140 is activated, the transfer gate 102a corresponding to the internal signal line 101<S-$k_1$-$k_2$> is switched on and the interface chip IF side end of that internal signal line 101 is connected to the TSV test circuit 230, which is the same as a case that an output signal TSV_SEL_IF<D-$k_3$-$k_4$> is activated. As described above, the parasitic resistance value of the to-be-tested internal signal line 101 is successively reflected to the internal signal line voltage $V_B$ and the internal signal line 101 can be tested.

As described above, according to the semiconductor device 10 of the ninth embodiment, the internal signal line 101 belonging to the internal signal line group DG as well as the internal signal line group SG can be tested. A to-be-tested internal signal line group can be designated externally using the TSV group selection signals Gr_SEL2_CORE and Gr_SEL2_IF.

In the ninth embodiment, the semiconductor device 10 according to the first embodiment shown in FIG. 5 has been exemplified; however, the invention of the ninth embodiment can be also applicable to the semiconductor device 10 according to the second to eighth embodiments.

For example, applying the ninth embodiment to the semiconductor device 10 according to the second embodiment (FIG. 8) is briefly described. In FIG. 21, the transistor 121 is replaced with the transistor 121 (third switch element) and the transistor 160 (fourth switch element) and the transfer gate 102a is replaced with the transfer gate 102a (fifth switch element) and the transistor 161 (sixth switch element), and thus the invention of the ninth embodiment can be applied.

While each internal signal line group is further grouped in the ninth embodiment, it is also possible that this grouping is not performed and all internal signal lines 101 within the internal signal line group are tested at a time. In this case, the to-be-tested group selection signal Gr_SEL_CORE does not need to be used.

Figure 25:
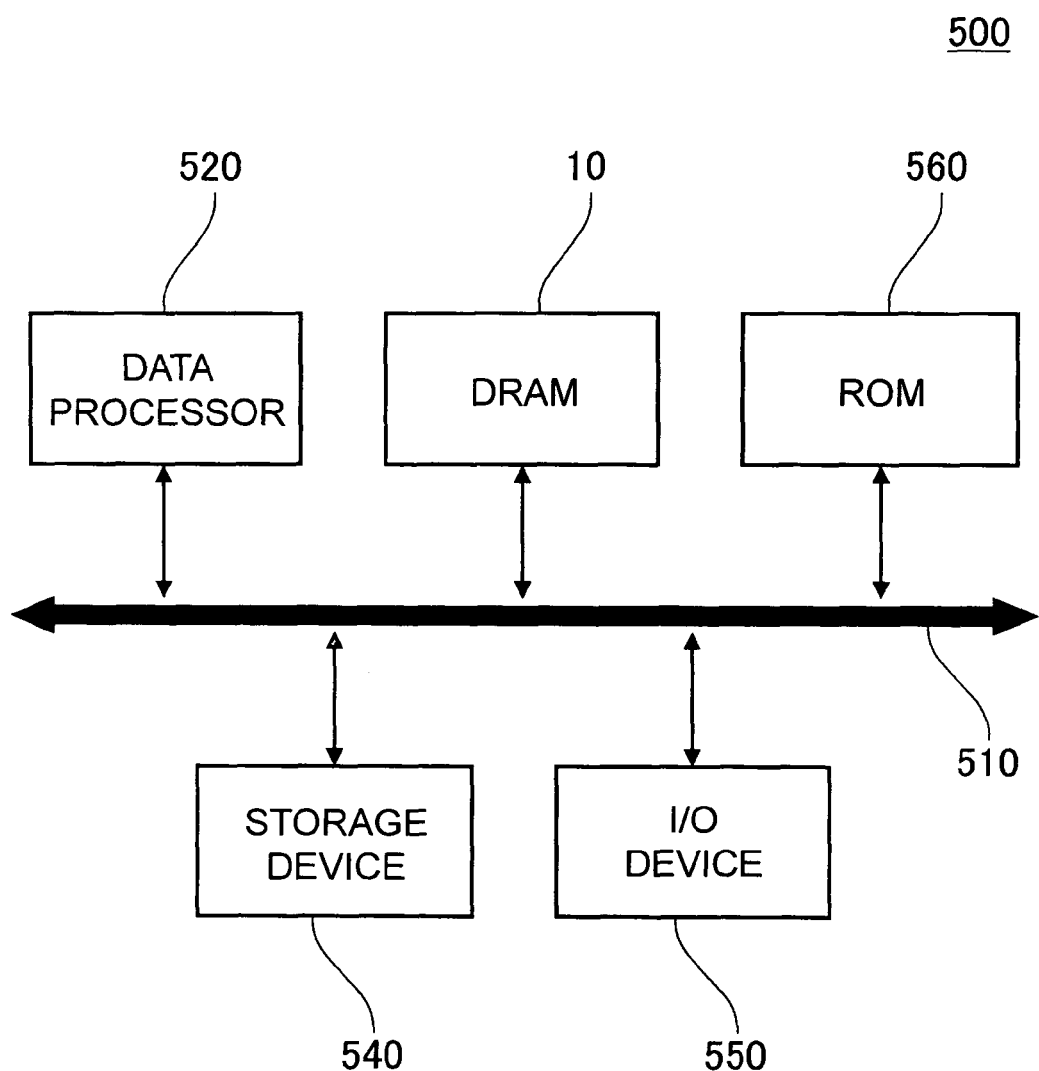
FIG. 25 is a block diagram showing the configuration of a data processing system using the semiconductor memory device according to the embodiments of the present invention.

FIG. 25 is a block diagram showing the configuration of a data processing system 500 using the semiconductor memory device 10 according to the first to ninth embodiment.

The data processing system 500 shown in FIG. 25 has a configuration in which a data processor 520 and the semiconductor device (DRAM) 10 according to this embodiment is mutually connected via a system bus 510. The data processor 520, for example, includes micro-processor (MPU) or digital signal processor (DSP). But it is not limited to them. In FIG. 25, for the sake of shorthand, the data processor 520 and the DRAM 10 are connected via the system bus 510. But they may be connected using a local bus not via the system bus 510.

In FIG. 25, for the sake of shorthand, only one set of the system bus 510 is drawn. But a plurality of system buses 510 may be provided in serial or parallel manner via some connectors etc., if needed. In the data processing system 500 shown in FIG. 25, a storage device 540, I/O device 550, and ROM 560 are also connected to the system bus 510. But these components are not in dispensable.

The storage device 540 may be a hard disk drive, an optical disk drive, or a flash memory. The I/O device 550 may be one or more display devices such as a liquid display, but not limited to, or one or more input devices such as a keyboard, a mouse, but not limited to.

I/O device 550 can be only one of the input device and the output device.

Though only one component is drawn for each of the components shown in FIG. 25, the number of each of the components is not limited to one. The data processing system 500 can include a plurality of each of the components.

In the above embodiments of the present invention, a controller issues a command relating to a read command to an interface chip. The interface chip having received the command from the controller issues the read command to a plurality of core chips. Any of the core chips receives the read command to output read data that is information of a memory cell array for the read command to the interface chip. The interface chip having received the read data from any of the core chips outputs that read data to the controller. The command issued by the controller is a so-called command prescribed by a well-known industrial organization controlling semiconductor devices (a read command as a system). The read command issued by the interface chip to the core chip is a control signal within a semiconductor chip. This also applies to the read data. Further, the controller can include a test command (a test signal) for testing the semiconductor device 10. When the test command is issued by the memory controller, the interface chip generates the test signal TEST_IF described above and each core chip generates the test signal TEST_CORE based on the test signal TEST_IF. The test result is then outputted from the semiconductor device 10 to the controller.

It is apparent that the present invention is not limited to the above embodiments, but may be modified and changed without departing from the scope and spirit of the invention.

For example, in the embodiment, the DDR3-type SDRAMs are used as the plural core chips having the same function. However, the present invention is not limited thereto. Accordingly, the core chip may be a DRAM other than the DDR3-type or a semiconductor memory (SRAM (Static Random Access Memory), PRAM (Phase-change Random Access Memory), MRAM (Magnetic Random Access Memory) or a flash memory, for example) other than the DRAM. The core chips may be plural semiconductor chips that have functions other than the functions of the semiconductor memory, which are equal to or different from each other. All of the core chips do not need to be laminated and all or part of the core chips may be two-dimensionally disposed. The number of core chips is not restricted to 8.

The fundamental technical concept of the present invention is not limited to that. For example, the core chips have been described as chips of semiconductor memories having the same function. However, the fundamental technical concept of the present invention is not limited to that, and the core chips may have the same function as one another or different functions from one another. Specifically, the interface chip and the core chips may be silicon chips each having a unique function. For example, the core chips may be DSP chips having the same function, and may have an interface chip (ASIC) shared among the core chips. Preferably, the core chips have the same function as one another, and are manufactured with the use of the same mask. However, the characteristics after the manufacture might vary due to the in-plane distribution in the same wafer, differences among wafers, differences among lots, and the likes. Further, the core chips each have a memory function, but may also have different functions from one another (a first core chip is a DRAM, a second chip is a SRAM, a third chip is a nonvolatile memory, and a fourth chip is a DSP). The core chips may be manufactured with the use of different manufacturing masks from one another, and may have an interface chip (ASIC) shared among the core chips.

The present invention may also be applied to all semiconductor products such as CPUs (Central Processing Units), MCUs (Micro Control Units), DSPs (Digital Signal Processors), ASICs (Application Specific Integrated Circuits), and ASSPs (Application Specific Standard Products), as long as they are COCs (Chip-on-Chips) that use TSVs. The devices to which the present invention is applied may also be used as the semiconductor devices in SOCs (System-on-Chips), MCPs (Multi Chip Packages), POPs (Package-On-Packages), and the likes. The transistors may be field effect transistors (FETs) or bipolar transistors. The present invention may be applied to various kinds of FETs such as MISs (Metal-Insulator Semiconductors) and TFTs (Thin Film Transistors), other than MOSs (Metal Oxide Semiconductors). The present invention may be applied to various kinds of FETs such as transistors. The transistors may be other transistors than FETs. The transistors may partially include bipolar transistors. Also, p-channel transistors or PMOS transistors are typical examples of the transistors of the first conductivity type, and n-channel transistors or NMOS transistors are typical examples of the transistors of the second conductivity type. Further, the substrate may not necessarily be a p-type semiconductor substrate, and may be an n-type semiconductor substrate, or a semiconductor substrate of a SOI (Silicon on Insulator) structure, or a semiconductor substrate of some other type.

Further, the circuit forms of various test circuits (such as current sources, current mirrors, sense amplifiers, compare amplifiers, selectors) are not limited to the circuit forms disclosed in the embodiments.

Further, the structures of TSVs are not particularly limited.

Various combinations and selections of the components disclosed herein may be made within the scope of the invention. In other words, the present invention of course includes various changes and modifications that are obvious to those skilled in the art according to all the disclosure including the claims and the technical concept.

What is claimed is:
1. A semiconductor device comprising:
an interface chip;
a core chip; and
a first internal signal line that includes a through silicon via penetrating the core chip, the first internal signal line having one end provided on the core chip and the other end provided on the interface chip, wherein the interface chip includes a first circuit that outputs a first current to an internal wiring to produce a first voltage, wherein the core chip includes a second circuit that outputs a second current to the one end of the first internal signal line, the first internal signal line thereby producing at the other end a second voltage that is related to a voltage drop across the through silicon via, wherein the interface chip further includes a determination circuit that has a first input terminal connected to receive the first voltage and a second input terminal connected to receive the second voltage, and wherein the determination circuit outputs a determination voltage according to a potential difference between the first and second input terminals.

2. The semiconductor device as claimed in claim 1, wherein the interface chip further includes a processing circuit that processes a signal passing through the first internal signal line, and the processing circuit includes an output terminal connected to an external terminal of the semiconductor device.

3. The semiconductor device as claimed in claim 1, wherein a plurality of the core chips are provided, each of the core chips includes a chip-selection receiving unit that receives a selection signal to select one of the core chips, and the second circuit of each of the core chips outputs the second current to the first internal signal line when the chip-selection receiving unit is selected by the selection signal, and does not output the second current to the first internal signal line when the chip-selection receiving unit is not selected by the selection signal.

4. The semiconductor device as claimed in claim 1, wherein the interface chip includes a reference resistor included in the internal wiring, the reference resistor having a resistance value according to a target value of a parasitic resistance value of the first internal signal line, the first circuit includes a first transistor that has a first controlled terminal connected to a first power supply potential and a second controlled terminal connected to one end of the reference resistance, and outputs the first current flowing between the first controlled terminal and the second controlled terminal, the second circuit includes a second transistor that has a third controlled terminal connected to the first power supply potential and a fourth controlled terminal connected to the first internal signal line, and outputs the second current flowing between the third controlled terminal and the fourth controlled terminal, other end of the reference resistance and the other end of the first internal signal line in the interface chip are respectively connected via first elements to a second power supply potential that is different from the first power supply potential, the first input terminal is connected to the other end of the reference resistance, and the first transistor and the second transistor have a substantially same size.

5. The semiconductor device as claimed in claim 1, further comprising a second internal signal line and a third internal signal line each of which includes a through silicon via that penetrates the core chip and electrically connects the interface chip to the core chip, wherein the second internal signal line connects the first circuit to the second circuit, the second internal signal line being included in the internal wiring, the second circuit receives the first current outputted from the first circuit and outputs the second current to the first internal signal line, and the third internal signal line connects the one end of the first internal signal line in the core chip to the first input terminal.

6. The semiconductor device as claimed in claim 5, wherein the first circuit includes a first transistor that has a first controlled terminal connected to a first power supply potential and a second controlled terminal connected via the second internal signal line to the second circuit, and outputs the first current flowing between the first controlled terminal and the second controlled terminal, and the other end of the first internal signal line in the interface chip is connected via a first element to a second power supply potential that is different from the first power supply potential.

7. The semiconductor device as claimed in claim 5, wherein the interface chip further includes a comparison circuit that compares the determination voltage of the determination circuit to a predetermined threshold voltage.

8. The semiconductor device as claimed in claim 1, wherein the determination circuit comprises a comparator including an inverted input terminal comprising the first input terminal, and a non-inverting input terminal comprising the second input terminal.

9. A semiconductor device comprising:

an interface chip;

a core chip; and a first internal signal line that includes a through silicon via penetrating the core chip and electrically connects the interface chip to the core chip, wherein the interface chip includes:

a reference resistor having a resistance value according to a target value of a parasitic resistance value of the first internal signal line; and a first circuit that supplies a first current to one end of the reference resistance, the reference resistor thereby producing at the other end thereof a first voltage that is related to a first voltage drop across the reference resistor, wherein the core chip includes a second circuit that supplies a second current to one end of the first internal signal line the first internal signal line thereby producing at the other end thereof a second voltage that is related to a second voltage drop across the through silicon via, and wherein the interface chip further includes a determination circuit that has a first input terminal connected to the other end of the reference resistor and a second input terminal connected to the other end of the first internal signal line and outputs a determination voltage according to a potential difference between the first input terminal and the second input terminal.

10. The semiconductor device as claimed in claim 9, wherein the interface chip further includes a processing circuit that processes a signal passing through the first internal signal line, and the processing circuit includes an output terminal connected to an external terminal of the semiconductor device.

11. The semiconductor device as claimed in claim 9, wherein
   the first circuit includes a first transistor having a first controlled terminal connected to a first power supply potential and a second controlled terminal connected to the one end of the reference resistor,
   the first current is a current flowing between the first controlled terminal and the second controlled terminal,
   the second circuit includes a second transistor having a third controlled terminal connected to the first power supply potential and a fourth controlled terminal connected to the first internal signal line,
   the second current is a current flowing between the third controlled terminal and the fourth controlled terminal,
   the other end of the reference resistor and the end of the first internal signal line in the interface chip are respectively connected via first elements to a second power supply potential that is different from the first power supply potential, and
   the first transistor and the second transistor have a substantially same size.

12. The semiconductor device as claimed in claim 9, wherein,
   a plurality of the first internal signal lines are provided,
   the second circuit is provided for each of the first internal signal lines and outputs the second current to an associated one of the first internal signal lines,
   the interface chip further including:
   an internal-signal-line selection receiving unit that receives a selection signal to select one of the first internal signal lines; and
   a plurality of switch circuits each of which is provided between the end of an associated one of the first internal signal lines in the interface chip and the second input terminal, and
   each of the switch circuits electrically connects the first internal signal line to the second input terminal when the associated one of the first internal signal lines is selected by the internal-signal-line selection receiving unit, and electrically disconnects the first internal signal line from the second input terminal when the associated one of the first internal signal lines is not selected by the internal-signal-line selection receiving unit.

13. The semiconductor device as claimed in claim 12, wherein
   the switch circuits include a plurality of first switch elements each of which is provided between the end of the associated one of first internal signal lines in the interface chip and the second input terminal,
   the interface chip further includes a replica element that has substantially same electrical characteristics as those of the first switch elements, and
   the replica element is arranged between the other end of the reference resistance and the first input terminal.

14. The semiconductor device as claimed in claim 9, wherein,
   a plurality of the core chips are provided,
   each of the core chips includes a chip-selection receiving unit that receives a selection signal to select one of the core chips,
   each of the core chips includes the second circuit,
   the second circuit of each of the core chips outputs the second current to the first internal signal line when the chip-selection receiving unit is selected by the selection signal, and does not output the second current to the first internal signal line when the chip-selection receiving unit is not selected by the selection signal.

15. The semiconductor device as claimed in claim 14, wherein
   each of the core chips further comprising:
   an internal circuit;
   an internal wiring that connects the internal circuit and a portion provided between the first internal signal line and the second circuit; and
   a second switch element provided between the internal wiring and the internal circuit, wherein
   the second switch element of each of the core chips electrically disconnects the first internal signal line from the internal circuit when the first internal signal line is tested, and electrically connects the first internal signal line to the internal circuit when the first internal signal line is not tested.

16. The semiconductor device as claimed in claim 9, further comprising:
   a fourth internal signal line that includes a through silicon via penetrating the core chip and electrically connects the interface chip to the core chip, wherein
   a plurality of the first internal signal lines are provided,
   the first internal signal lines are connected in parallel to each other between a first wiring in the core chip and a second wiring in the interface chip,
   one end of the fourth internal signal line is connected to a first power supply potential in the interface chip,
   other end of the fourth internal signal line is connected to one end of the first wiring in the core chip, and
   the second input terminal is connected to an end of the second wiring.

17. The semiconductor device as claimed in claim 16, wherein
   a plurality of the second circuits are provided,
   each of the second circuits is provided between the first wiring and each of the first internal signal lines.

18. The semiconductor device as claimed in claim 16, further comprising a correction resistance element serially connected to the reference resistance.

19. The semiconductor device as claimed in claim 9, wherein
   a plurality of the first internal signal lines arranged in a line are provided,
   the interface chip further including:
   a clock generation circuit that generates a first clock signal and a second clock signal having substantially a same clock cycle;
   a first selection-signal generation circuit that generates a first selection signal that designates one of the first internal signal lines connected to the second input terminal in synchronization with the first clock signal; and
   a second selection-signal generation circuit that generates a second selection signal that designates at least one of the first internal signal lines through which the second current flows in synchronization with the second clock signal, wherein
   the clock generation circuit generates the first clock signal and the second clock signal with a shift of at least one clock signal so that the first internal signal line selected by the first selection signal is different from the first internal signal line selected by the second selection signal.

20. The semiconductor device as claimed in claim 9, wherein
   a plurality of the first internal signal lines are provided,
   the interface chip further including:

a first selection-signal generation circuit that generates a first selection signal that connects one of the first internal signal lines to the second input terminal; and a second selection-signal generation circuit that generates a second selection signal that flows the second current in at least one of the first internal signal lines, wherein the second selection-signal generation circuit generates the second selection signal that designates one or a plurality of the first internal signal lines other than the first internal signal line designated by the first selection signal.

21. The semiconductor device as claimed in claim 20, wherein the interface chip further includes a clock generation circuit that generates a clock signal having a predetermined cycle, the first selection-signal generation circuit generates the first selection signal in synchronization with the clock signal, and the second selection-signal generation circuit generates the second selection signal in synchronization with the clock signal.

22. The semiconductor device as claimed in claim 19, wherein the first internal signal lines are divided into a plurality of groups, the second selection-signal generation circuit associates one or a plurality of other groups adjacent to each of the groups with the corresponding group, and the second selection-signal generation circuit generates the first selection signal that designates another first internal signal line in a group including the first internal signal line designated by the second selection signal and one or a plurality of the first internal signal lines included in another group adjacent to the corresponding group.

23. The semiconductor device as claimed in claim 9, further comprising:

a first internal signal line group that is constituted by one or a plurality of the first internal signal lines each of which includes a plurality of through silicon vias; and a second internal signal line group that is constituted by one or a plurality of the first internal signal lines each of which includes a single through silicon via, wherein the interface chip further including:

an internal-signal-line selection receiving unit that receives a first selection signal to select one of the first and second internal signal line groups and a second selection signal to select one of the first internal signal line in each of the internal signal line groups; and a plurality of switch circuits each of which is provided between the end of an associated one of the first internal signal lines in the interface chip and the second input terminal, the switch circuits electrically connect the first internal signal line selected by the internal-signal-line selection receiving unit among the first internal signal lines belonging to the first internal signal line group to the second input terminal when the first internal signal line group is selected by the internal-signal-line selection receiving unit, and the first internal signal line selected by the internal-signal-line selection receiving unit among the first internal signal lines belonging to the second internal signal line group is electrically connected to the second input terminal when the second internal signal line group is selected by the internal-signal-line selection receiving unit.

24. The semiconductor device as claimed in claim 23, further comprising a plurality of the core chips, wherein each of the core chips further includes a chip-selection receiving unit that receives the first selection signal, the second selection signal, and a third selection signal to select one of the core chips, each of the second circuits in the core chips outputs a current to the first internal signal line selected by the chip-selection receiving unit among the first internal signal lines belonging to the first internal signal line group when the corresponding core chip is selected by the chip-selection receiving unit and the first internal signal line group is selected by the chip-selection receiving unit, outputs a current to the first internal signal line selected by the chip-selection receiving unit among the first internal signal lines belonging to the second internal signal line group when the corresponding core chip is selected by the chip-selection receiving unit and the second internal signal line group is selected by the chip-selection receiving unit, and does not output a current to the first internal signal line when the corresponding core chip is not selected by the chip-selection receiving unit.

25. A semiconductor device comprising:

an interface chip;

a core chip;

a first internal signal line that includes a through silicon via penetrating the core chip and electrically connects the interface chip to the core chip;

a current generation circuit that supplies a current to one end of the first internal signal line, the first internal signal line thereby producing at the other end thereof a voltage drop across the through silicon via; and a determination circuit that has a first input terminal connected to the one end of the first internal signal line and a second input terminal connected to the other end of the first internal signal line and outputs a determination voltage according to a potential difference between the first input terminal and the second input terminal.

26. The semiconductor device as claimed in claim 25, wherein the interface chip further includes a processing circuit that processes a signal passing through the first internal signal line, and the processing circuit includes an output terminal connected to an external terminal of the semiconductor device.

27. The semiconductor device as claimed in claim 25, further comprising a second internal signal line that includes a through silicon via penetrating the core chip and electrically connects the interface chip to the core chip, wherein the current generation circuit is provided in the interface chip, and a terminal through which a current generated by the current generation circuit flows is connected via the second internal wiring to the end of the first internal signal line in the core chip.

28. The semiconductor device as claimed in claim 27, further comprising a third internal signal line that includes a through silicon via penetrating the core chip and electrically connects the interface chip to the core chip, wherein the determination circuit is provided in the interface chip, and a first input terminal of the determination circuit is connected via the third internal signal line to the end of the first internal signal line in the core chip.

29. The semiconductor device as claimed in claim 25, wherein
the current generation circuit including:
a transistor that has a first controlled terminal connected to a first power supply potential, a second controlled terminal connected to the end of the first internal signal line in the core chip, and a control terminal; and
an operational amplifier that has an output terminal connected to the control terminal of the transistor, a positive input terminal connected to the end of the first internal signal line in the interface chip, and a negative input terminal to which a voltage with a predetermined value is inputted, wherein
the end of the first internal signal line in the interface chip is connected to a second power supply potential that is different from the first power supply potential.

30. The semiconductor device as claimed in claim 25, wherein,
a plurality of the first internal signal lines are provided,
the current generation circuit outputs the current to each of the first internal signal lines,
the interface chip further including:
an internal-signal-line selection receiving unit that receives a selection signal to select one of the first internal signal lines; and
a plurality of sixth switch elements each of which is provided between the end of the corresponding first internal signal line in the interface chip and the second input terminal, wherein
each of the sixth switch elements electrically connects the first internal signal line to the second input terminal when the internal-signal-line selection receiving unit is selected by the selection signal, and electrically disconnects the first internal signal line from the second input terminal when the internal-signal-line selection receiving unit is not selected by the selection signal.

31. The semiconductor device as claimed in claim 25, wherein,
a plurality of the core chips are provided,
each of the core chips further includes a chip-selection receiving unit that receives a selection signal to select one of the core chips,
each of the core chips further includes a third switch element provided between the end of the first internal signal line in the core chip and the current generation circuit,
each of the third switch elements electrically connects the end of the first internal signal line in the core chip to the current generation circuit when the chip-selection receiving unit is selected by the selection signal, and electrically disconnects the end of the first internal signal line in the core chip from the current generation circuit when the chip-selection receiving unit is not selected by the selection signal.

32. The semiconductor device as claimed in claim 31, wherein
each of the core chips further including:
an internal circuit;
an internal wiring that connects the internal circuit and a portion provided between the first internal signal line and the current generation circuit; and
a second switch element provided between the internal wiring and the internal circuit, wherein
the second switch elements of the core chips electrically disconnect the first internal signal line from the internal circuit when the first internal signal line is tested and electrically connect the first internal signal line to the internal circuit when the first internal signal line is not tested.

33. The semiconductor device as claimed in claim 25, further comprising:
a plurality of the core chips; and
a plurality of the first internal signal lines, wherein
each of the core chips further including:
a chip-selection receiving unit that receives a first selection signal to select one of the core chips;
a third switch element inserted between the end of the first internal signal line in the core chip and the current generation circuit; and
a fourth switch element whose one end is connected between the end of the first internal signal line in the core chip and the third switch element and whose other end is connected to the first input terminal,
the first input terminal is connected via the fourth switch element to the end of the first internal signal line in the core chip,
the interface chip further including:
an internal-signal-line selection receiving unit that receives a second selection signal to select one of the first internal signal lines,
a plurality of fifth switch elements each of which is connected to the end of the corresponding first internal signal line in the interface chip; and
a plurality of sixth switch elements each of whose one end is connected between the end of the corresponding first internal signal line in the interface chip and the corresponding fifth switch element and whose other end is connected to the second input terminal,
the second input terminal is connected via each of the sixth switch elements to the end of each of the first internal signal lines in the interface chip,
the third and fourth switch elements are electrically connected to each other when the chip-selection receiving unit is selected by the first selection signal, and electrically disconnected from each other when the chip-selection receiving unit is not selected by the first selection signal, and
the fifth and sixth switch elements are electrically connected to each other when the internal-signal-line selection receiving unit is selected by the second selection signal, and electrically disconnected from each other when the internal-signal-line selection receiving unit is not selected by the second selection signal.

34. The semiconductor device as claimed in claim 25, wherein
an amplification factor of the determination circuit is variable,
the semiconductor device further comprising:
a voltage applying unit that applies a first predetermined voltage between the first input terminal and the second input terminal;
a comparing unit that compares an output voltage of the determination circuit when the first predetermined voltage is applied by the voltage applying unit to a second predetermined voltage; and
an amplification-factor adjusting unit that adjusts an amplification factor of the determination circuit based on a comparison result of the comparing unit in a direction that the second predetermined voltage becomes equal to the output voltage.

35. The semiconductor device as claimed in claim 34, wherein the voltage applying unit amplifies the second predetermined voltage with a predetermined amplification factor to generate the first predetermined voltage.

36. The semiconductor device as claimed in claim 25, further comprising:
a first internal signal line group constituted by one or a plurality of the first internal signal lines each of which includes a plurality of through silicon vias; and
a second internal signal line group constituted by one or a plurality of the first internal signal lines each of which includes a single through silicon via, wherein
the interface chip further including:
an internal-signal-line selection receiving unit that receives a first selection signal to select one of the first and second internal signal line groups and a second selection signal to select one of the first internal signal line in each internal signal line group; and
a plurality of sixth switch elements each of which is provided between the end of the corresponding first internal signal line in the interface chip and the second input terminal,
the sixth switch elements electrically connect the first internal signal line selected by the internal-signal-line selection receiving unit among the first internal signal lines belonging to the first internal signal line group to the second input terminal when the first internal signal line group is selected by the internal-signal-line selection receiving unit, and
the first internal signal line selected by the internal-signal-line selection receiving unit among the first internal signal lines belonging to the second internal signal line group is electrically connected to the second input terminal when the second internal signal line group is selected by the internal-signal-line selection receiving unit.

37. The semiconductor device as claimed in claim 36, further comprising a plurality of the core chips, wherein
each of the core chips further includes a chip-selection receiving unit that receives the first selection signal, the second selection signal, and a third selection signal to select one of the core chips,
each of the core chips includes a third switch element provided between the end of the first internal signal line in the core chip and the current generation circuit,
the third switch elements
connect the end of the first internal signal line in the core chip selected by the chip-selection receiving unit among the first internal signal lines belonging to the first internal signal line group to the current generation circuit when the corresponding core chip is selected by the chip-selection receiving unit and the first internal signal line group is selected by the chip-selection receiving unit,
connect the end of the first internal signal line in the core chip selected by the chip-selection receiving unit among the first internal signal lines belonging to the second internal signal line group to the current generation circuit when the corresponding core chip is selected by the chip-selection receiving unit and the second internal signal line group is selected by the chip-selection receiving unit, and
electrically disconnect the end of the first internal signal line in the core chip from the current generation circuit when the corresponding core chip is not selected by the chip-selection receiving unit.

38. A method of testing a semiconductor device, comprising:
providing the semiconductor device that includes:
an interface chip;
a plurality of core chips;
a plurality of internal signal lines each of which includes a plurality of through silicon vias each penetrating an associated one of the core chips and electrically connects the interface chip to the core chips;
a first circuit that outputs, when activated, a current to an internal wiring, the internal wiring thereby producing a first voltage;
a second circuit that outputs, when activated a current to the internal signal lines, the internal signal line thereby producing a second voltage that is related to voltage drops across the through silicon vias; and
a determination circuit that has a first input terminal connected to receive the first voltage and a second input terminal connected to receive the second voltage, and determines a potential difference between the first and second input terminals;
activating each of the first and second circuits;
selecting a core chip among the core chips by a core chip selection signal;
selecting an internal signal line among the internal signal lines by an internal signal-line selection signal; and
causing the determination circuit to output a voltage according to a potential difference between the first input terminal and the second input terminal.

39. The method of testing a semiconductor device as claimed in claim 38, wherein the internal signal lines in one group among an I/O group, an address group, and a control signal group are selected based on the internal signal-line selection signal.

40. The method of testing a semiconductor device as claimed in claim 39, wherein an internal signal line is selected among the internal signal lines in the one group based on the internal signal-line selection signal.

41. The method of testing a semiconductor device as claimed in claim 38, wherein the voltage outputted from the determination circuit is supplied to an external terminal of the semiconductor device.

42. The method of testing a semiconductor device as claimed in claim 38, wherein the voltage outputted from the determination circuit is supplied to a redundant circuit that replaces the internal signal line in the semiconductor device with another internal signal line.

43. A data processing system comprising:
a semiconductor device; and
a controller connected to the semiconductor device,
wherein the semiconductor device comprises:
an interface chip;
a core chip; and
a first internal signal line that includes a through silicon via penetrating the core chip and electrically connects the interface chip to the core chip,
wherein the interface chip includes a first circuit that outputs a first current to an internal wiring to produce a first voltage,
wherein the core chip includes a second circuit that outputs a second current to the first internal signal line to produce a second voltage that is related to a voltage drop across the through silicon via,
wherein the interface chip further includes a determination circuit that has a first input terminal connected to receive the first voltage and a second input terminal connected to receive the second voltage, and outputs a determination voltage according to a potential difference between the first input terminal and the second input terminal, wherein the controller issues a command relating to a read command to the interface chip, wherein the interface chip receives the command from the controller and issues the read command to the core chips, wherein the core chip receives the read command and outputs read data corresponding to the read command to the interface chip, and wherein the interface chip receives the read data from the core chip and outputs the read data to the controller.

44. The semiconductor device as claimed in claim 8, wherein the interface chip further comprises a replica element connected to the internal wiring between the first circuit and a ground potential, and a first transistor connected to the internal wiring between the replica element and the ground potential, the inverted input terminal being connected to the internal wiring between the replica element and the first transistor.

45. The semiconductor device as claimed in claim 44, wherein the interface chip further comprises a switch circuit in series with the internal signal line, and a second transistor connected to the internal signal line between the switch element and the ground potential, the non-inverting input terminal being connected to the internal signal line between the switch element and the second transistor.

* * * * *